(12) United States Patent
Yamamoto

(10) Patent No.: US 8,497,980 B2
(45) Date of Patent: Jul. 30, 2013

(54) HOLDING APPARATUS, EXPOSURE APPARATUS, EXPOSURE METHOD, AND DEVICE MANUFACTURING METHOD

(75) Inventor: Hajime Yamamoto, Kumagaya (JP)

(73) Assignee: Nikon Corporation, Tokyo (JP)

( * ) Notice: Subject to any disclaimer, the term of this patent is extended or adjusted under 35 U.S.C. 154(b) by 793 days.

(21) Appl. No.: 12/049,973

(22) Filed: Mar. 17, 2008

(65) Prior Publication Data

US 2008/0309909 A1    Dec. 18, 2008

Related U.S. Application Data

(60) Provisional application No. 60/907,051, filed on Mar. 19, 2007.

(51) Int. Cl.
*G03B 27/58* (2006.01)
*G03B 27/42* (2006.01)
*H01L 21/683* (2006.01)

(52) U.S. Cl.
USPC ............................. 355/72; 355/53; 361/234

(58) Field of Classification Search
USPC ................... 355/53, 72, 75; 361/234
See application file for complete search history.

(56) References Cited

U.S. PATENT DOCUMENTS

| | | | |
|---|---|---|---|
| 4,692,836 A * | 9/1987 | Suzuki | 361/234 |
| 5,708,856 A | 1/1998 | Cloutier | |
| 5,880,923 A * | 3/1999 | Hausmann | 361/234 |
| 6,055,150 A * | 4/2000 | Clinton et al. | 361/234 |
| 6,208,407 B1 | 3/2001 | Loopstra | |
| 6,262,796 B1 | 7/2001 | Loopstra | |
| 6,341,007 B1 | 1/2002 | Nishi et al. | |
| 6,362,946 B1 * | 3/2002 | Larsen | 361/234 |
| 6,400,441 B1 | 6/2002 | Nishi et al. | |
| 6,549,269 B1 | 4/2003 | Nishi et al. | |
| 6,590,634 B1 | 7/2003 | Nishi et al. | |
| 6,611,316 B2 | 8/2003 | Sewell | |
| 6,734,117 B2 * | 5/2004 | Sogard | 438/795 |
| 6,897,963 B1 | 5/2005 | Taniguchi et al. | |
| 7,199,994 B1 * | 4/2007 | Levinson et al. | 361/234 |
| 7,292,426 B2 * | 11/2007 | Ito et al. | 361/234 |
| 7,408,760 B2 * | 8/2008 | Tanimoto et al. | 361/234 |

(Continued)

FOREIGN PATENT DOCUMENTS

| | | |
|---|---|---|
| EP | 1385056 A2 | 1/2004 |
| EP | 1521120 A2 | 4/2005 |

(Continued)

OTHER PUBLICATIONS

International Search Report mailed Jul. 4, 2008 for international application No. PCT/JP2008/055810.

(Continued)

*Primary Examiner* — Steven H Whitesell Gordon
(74) *Attorney, Agent, or Firm* — Finnegan, Henderson, Farabow, Garrett & Dunner, LLP

(57) ABSTRACT

A holding apparatus is provided with a holding member that has a holding surface that holds a substrate on which a pattern is to be formed, a plurality of first electrode members that are provided on the holding member and that generate electrostatic force in accordance with supplied voltage in order to attract the substrate to the holding surface, and a power supply device that is able to supply voltage to the first electrode members. The first electrode members are positioned in accordance with pattern information.

38 Claims, 26 Drawing Sheets

U.S. PATENT DOCUMENTS

2003/0176079 A1    9/2003   Sogard
2005/0018168 A1    1/2005   Akutsu et al.
2010/0277850 A1*  11/2010   Chang et al. .................. 361/234

FOREIGN PATENT DOCUMENTS

| JP | 11-135400 | 5/1999 |
| JP | 2004-006706 | 1/2004 |
| TW | 228289 B | 2/2005 |
| TW | I228289 B | 2/2005 |
| WO | WO 99/23692 | 5/1999 |

OTHER PUBLICATIONS

International Preliminary Report on Patentability issued Sep. 22, 2009 for international application No. PCT/JP2008/055810.
Notification of Reason for Refusal, Issued Jul. 31, 2012 with English Language translation from the Japanese Patent Office in corresponding Japanese Patent Application No. 2008-071602.

* cited by examiner

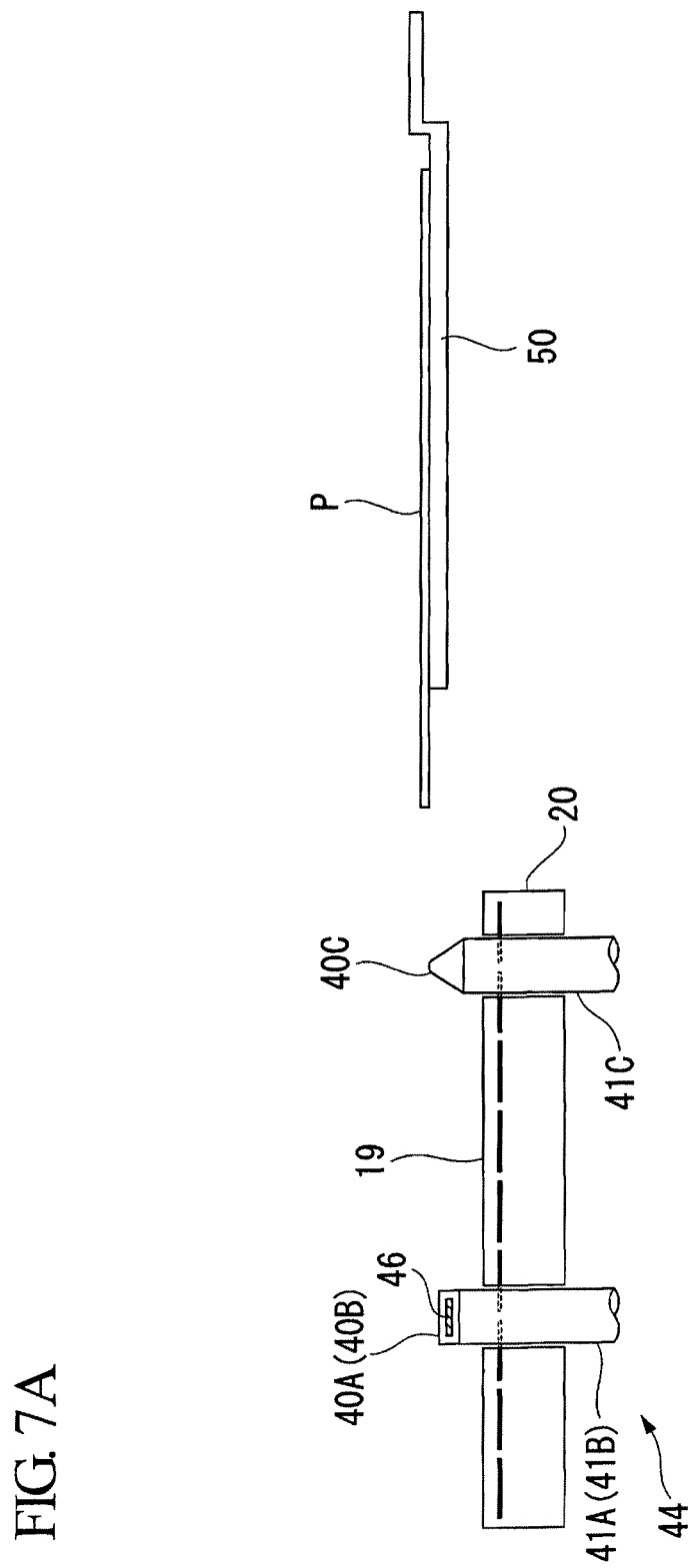

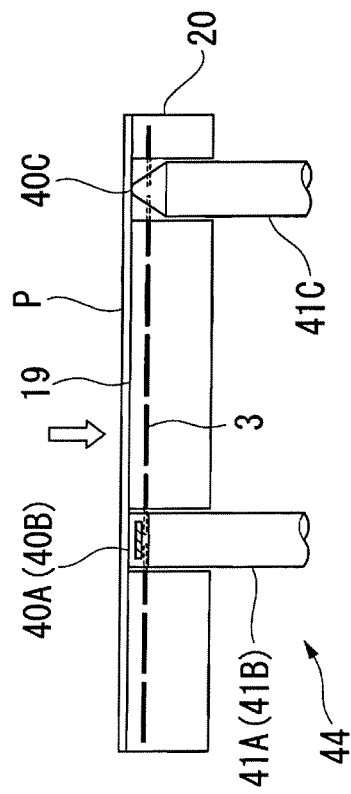

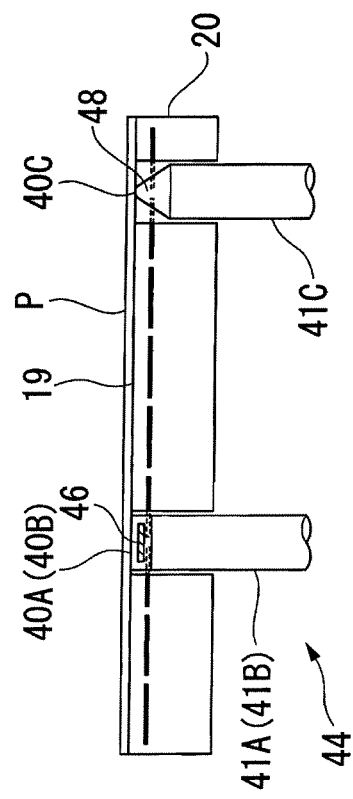

FIG. 29
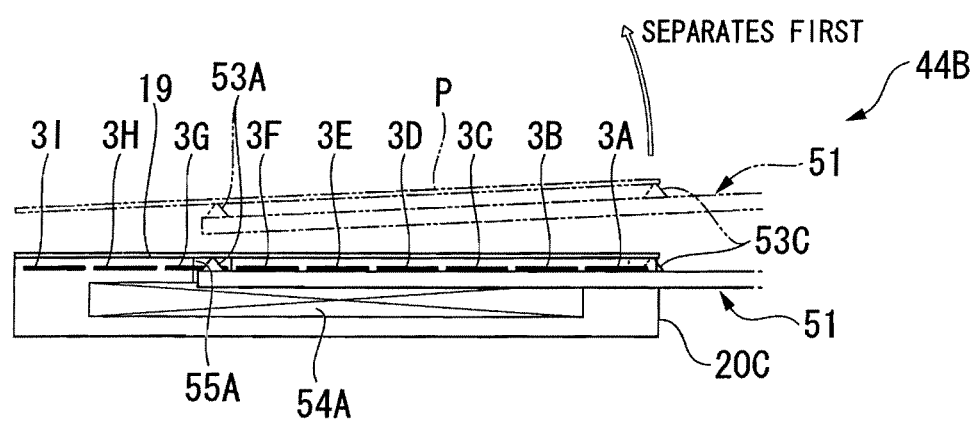
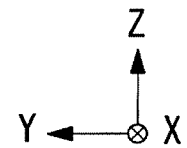

HOLDING APPARATUS, EXPOSURE APPARATUS, EXPOSURE METHOD, AND DEVICE MANUFACTURING METHOD

CROSS-REFERENCE TO RELATED APPLICATION

This application is non-provisional application claiming benefit of provisional application No. 60/907,051, filed Mar. 19, 2007, the contents of which are incorporated herein by reference.

BACKGROUND

1. Field of the Invention

The present invention relates to a holding apparatus that holds a substrate, an exposure apparatus that exposes a substrate, an exposure method, and a device manufacturing method.

2. Description of Related Art

A semiconductor device manufacturing apparatus is provided with a holding apparatus that holds a substrate on which a device is being manufactured. For example, EUV apparatuses and CVD apparatuses are provided with a holding apparatus that holds a substrate using static electricity such as that disclosed in U.S. Pat. No. 5,708,856.

In a manufacturing apparatus, an operation to transport a substrate onto a holding apparatus, an operation to hold the transported substrate on the holding apparatus, and an operation to transport the substrate away from the holding apparatus are executed. In order to manufacture a superior device with excellent productivity, it is desirable for the holding apparatus to be able to execute the above described operations rapidly and efficiently. In a holding apparatus that uses static electricity, if, for example, there are delays in an operation to transport a substrate away which are caused by static electricity, there is a possibility that there will be a deterioration in device productivity. Moreover, when a substrate is being transported onto the holding apparatus, if the substrate shifts from a desired position, or when the substrate is being transported away from the holding apparatus, if a load is applied to the substrate, there is a possibility that the performance of the device being manufactured will deteriorate.

A purpose of some aspects illustrating the present invention is to provide a holding apparatus that is capable of rapidly executing at least one of an operation to transport in a substrate, an operation to hold a substrate, and an operation to transport a substrate away, and that is capable of contributing to an improvement in device productivity. Another purpose is to provide an exposure apparatus and an exposure method that are capable of contributing to an improvement in productivity using this holding apparatus. Further another purpose is to provide a device manufacturing method that uses this exposure apparatus and exposure method.

SUMMARY

In accordance with a first aspect illustrating the present invention, there is provided a holding apparatus that includes: a holding member that has a holding surface, the holding surface holding a substrate on which a pattern is to be formed; a plurality of first electrode members that are provided on the holding member and that are arranged in accordance with pattern information relating to the pattern, and that generate electrostatic force in accordance with supply of a voltage in order to attract the substrate to the holding surface.

According to the first aspect, it is possible to contribute to an improvement in device productivity while preventing any deterioration in the device performance.

In accordance with a second aspect illustrating the present invention, there is provided a holding apparatus that includes: a holding member that has a holding surface, the holding surface holding a substrate on which a pattern is to be formed; a plurality of first electrode members that are provided on the holding member, and that generate electrostatic field in accordance with supply of a voltage in order to attract the substrate to the holding surface; and a power supply device that is capable of regulating the voltage in accordance with pattern information relating to the pattern.

According to the second aspect, it is possible to contribute to an improvement in device productivity while preventing any deterioration in the device performance.

In accordance with a third aspect illustrating the present invention, there is provided a holding apparatus that includes: a holding member that has a holding surface that holds a substrate; at least one first electrode member that is provided on the holding member, and that generates electrostatic field in accordance with supply of a voltage in order to attract the substrate to the holding surface; and a moving mechanism that has a supporting surface that supports the substrate and that comprises a moving member that moves the substrate relative to the holding member while supporting a predetermined area of the substrate such that the holding surface and the substrate are separated from each other, and a second electrode member that is provided on the moving member, and that generates electrostatic field in accordance with supply of a voltage in order to attract the substrate to the supporting surface.

According to the third aspect, it is possible to contribute to an improvement in device productivity while preventing any deterioration in the device performance.

In accordance with a fourth aspect illustrating the present invention, there is provided a holding apparatus that includes: a holding member that has a holding surface that holds a substrate; an electrode member that is provided on the holding member and generate electrostatic force in order to cause the substrate to adhere to the holding surface; a moving mechanism that moves the substrate and the holding member relatively to each other such that the holding surface and the substrate are separated from each other; and an antistatic device that removes electrostatic charge on the substrate when the holding member and the substrate are being separated from each other.

According to the fourth aspect, it is possible to contribute to an improvement in device productivity while preventing any deterioration in the device performance.

In accordance with a fifth aspect illustrating the present invention, there is provided an exposure apparatus that exposes a substrate with exposure light from a pattern, wherein, in order to hold a substrate onto which the exposure light has been irradiated, there is provided the holding apparatus according to the above described aspects.

According to the fifth aspect, it is possible to contribute to an improvement in device productivity while preventing any deterioration in the device performance.

In accordance with a sixth aspect illustrating the present invention, there is provided a device manufacturing method that includes exposing a substrate using the exposure apparatus according to the above described aspects, and developing the exposed substrate.

According to the sixth aspect, it is possible to manufacture a device using an exposure apparatus that is able to contribute to an improvement in device productivity while preventing any deterioration in the device performance.

In accordance with a seventh aspect illustrating the present invention, there is provided an exposure method for exposing a substrate with exposure light from a pattern, the method includes: mounting the substrate on a holding surface of a holding member on which a plurality of first electrode members are provided; supplying voltage to the first electrode members in order to cause the substrate to adhere to the holding surface by means of electrostatic force; and irradiating the substrate with the exposure light from the pattern, wherein the value of a first voltage that is supplied to the first electrode members, which correspond to an area on the substrate where the irradiation of the exposure light is currently underway, is higher than the value of a second voltage that is supplied to at least a part of remaining portion of the first electrode members.

According to the seventh aspect, it is possible to contribute to an improvement in device productivity while preventing any deterioration in the device performance.

In accordance with an eighth aspect illustrating the present invention, there is provided an exposure method for exposing a substrate with exposure light from a pattern, the method includes: mounting the substrate on a holding surface of a holding member on which a plurality of first electrode members are provided; supplying voltage to the first electrode members in order to cause the substrate to adhere to the holding surface by means of electrostatic force; and sequentially irradiating shot areas on the substrate with exposure light from the pattern, wherein the value of a first voltage that is supplied to the first electrode members, which correspond to shot areas where the irradiation of the exposure light has not yet been formed and where the irradiation of the exposure light is currently underway, is higher than the value of a second voltage that is supplied to the first electrode members, which are different from the first electrode members to which the first voltage is supplied.

According to the eighth aspect, it is possible to contribute to an improvement in device productivity while preventing any deterioration in the device performance.

In accordance with a ninth aspect illustrating the present invention, there is provided an exposure method for exposing a substrate with exposure light which includes: mounting the substrate on a holding surface of a holding member on which a first electrode member is provided; supplying voltage to the first electrode member in order to cause the substrate to adhere to the holding surface by means of electrostatic force; exposing the substrate by irradiating exposure light onto the substrate while it is being held on the holding surface; and separating the exposed substrate and the holding surface, wherein voltage is supplied to a second electrode member that is provided on a moving member which has a supporting surface which is able to support the substrate in order to cause the substrate to adhere to the supporting surface by means of electrostatic force, and, when the supporting surface and the substrate are adhered together by means of electrostatic force, the substrate and the holding surface are separated by moving the moving members.

According to the ninth aspect, it is possible to contribute to an improvement in device productivity while preventing any deterioration in the device performance.

In accordance with a tenth aspect illustrating the present invention, there is provided an exposure method for exposing a substrate with exposure light which includes: mounting the substrate on a holding surface of a holding member on which a first electrode member is provided; supplying voltage to the first electrode member in order to cause the substrate to adhere to the holding surface by means of electrostatic force; exposing the substrate by irradiating exposure light onto the substrate while it is being held on the holding surface; and separating the exposed substrate and the holding surface, wherein electrostatic charge on the substrate is removed when the holding member and the substrate are being separated from each other.

According to the tenth aspect, it is possible to contribute to an improvement in device productivity while preventing any deterioration in the device performance.

In accordance with an eleventh aspect illustrating the present invention, there is provided a device manufacturing method that includes exposing a substrate using the exposure method according to the above described aspects, and developing the exposed substrate.

According to the eleventh aspect, it is possible to manufacture a device using an exposure apparatus that is able to contribute to an improvement in device productivity while preventing any deterioration in the device performance.

According to some aspects illustrating the present invention, it is possible to execute at least one of an operation to transport in a substrate, an operation to hold a substrate, and an operation to transport a substrate away and the like, so that it is possible to manufacture a device with excellent productivity.

BRIEF DESCRIPTION OF THE DRAWINGS

FIG. 7A is a view in order to illustrate an example of an operation of the exposure apparatus according to the first embodiment.

FIG. 7C is a view in order to illustrate an example of an operation of the exposure apparatus according to the first embodiment.

FIG. 12A is a view in order to illustrate an example of an operation of the exposure apparatus according to the first embodiment.

FIG. 29 is a view in order to illustrate an example of an operation of the moving mechanism according to the seventh embodiment.

DESCRIPTION OF EMBODIMENTS

Embodiments of the present invention are described by providing examples with reference made to the drawings, however, the present invention is not limited to these embodiments. Note that in the description below, an XYZ rectangular coordinate system is set, and positional relationships between respective components are described with reference made to this XYZ rectangular coordinate system. A predetermined direction within a horizontal plane is taken as an X axial direction, a direction which is orthogonal to the X axial direction within the horizontal plane is taken as a Y axial direction, while a direction which is orthogonal to both the X axial direction and the Y axial direction (namely, a vertical direction) is taken as a Z axial direction. Moreover, rotation (i.e., tilt) directions around the X axis, the Y axis, and the Z axis are taken respectively as θX, θY, and θZ directions.

First Embodiment

Figure 1:
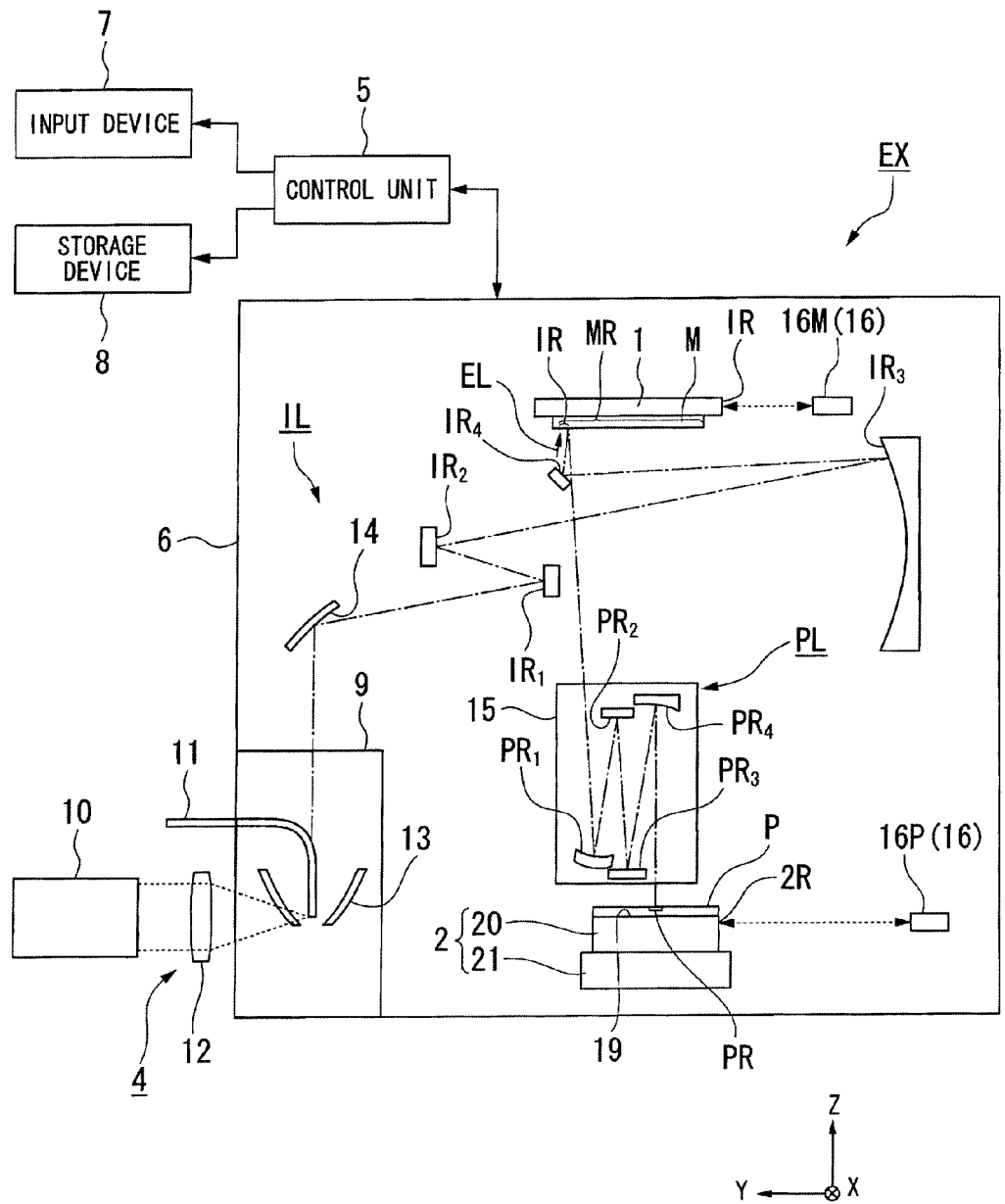
FIG. 1 is a typical view showing an example of an exposure apparatus according to a first embodiment.

A first embodiment will now be described. FIG. 1 is a schematic structural view showing an exposure apparatus EX according to the first embodiment. In FIG. 1, the exposure apparatus EX is provided with a mask stage 1 that is capable of moving while holding a mask M on which a predetermined pattern has been formed, a substrate stage 2 which is capable of moving while holding a substrate P on which a pattern has been formed, an interferometric system 16 which measures positional information of the respective stages, an illumination optical system IL which illuminates the mask M held on the mask stage 1 with exposure light EL, a projection optical system PL which projects an image of the pattern on the mask M which is being illuminated by the exposure light EL onto the substrate P, a chamber apparatus (a vacuum chamber) 6 which has a vacuum system which maintains in a vacuum state at least a predetermined space through which the exposure light EL is transmitted, and a control unit 5 which controls the overall operations of the exposure apparatus EX. The vacuum system maintains a vacuum in internal space of the chamber apparatus 6. An input device 7 which is capable of inputting various signals and information relating to exposure, and a storage device 8 which stores various information relating to exposure are connected to the control unit 5. The input device 7 may be, for example, a keyboard, a touch panel, a mouse, or the like. The substrate P may be a substrate which has a film of photosensitive material (i.e., resist) or the like formed on one surface of a base material such as a semiconductor wafer. The mask M may be a reticle on which a device pattern which is to be projected onto the substrate P is formed.

The exposure apparatus EX of the present embodiment is an EUV exposure apparatus that exposes the substrate P using extreme ultraviolet light. Extreme ultraviolet light is formed by electromagnetic waves of, for example, approximately 5 to 50 nm in the soft X-ray region. In the description below, extreme ultraviolet light is referred to as EUV light where this is appropriate.

In the present embodiment, the mask is a reflective mask having a multilayer film that is capable of reflecting EUV light. The exposure apparatus EX illuminates a surface (i.e., a reflective surface) of a mask M on which a pattern has been formed in the multilayer film using exposure light (i.e., EUV light) EL, so as to expose the photosensitive substrate P with the exposure light EL reflected by the mask M. The exposure light (i.e., EUV light) EL is irradiated in a vacuum state (for example, in a reduced pressure atmosphere of approximately $10^{-4}$ Pa) onto each optical element of the mask M, the substrate P, and the illumination optical system IL, and onto each optical element of the projection optical system PL.

The exposure apparatus EX of the present embodiment is what is known as a scanning stepper which is a scanning type of exposure apparatus that projects an image of the pattern on the mask M onto the substrate P while moving the mask M and the substrate P in synchronization in a predetermined direction. In the present embodiment, the scanning direction of the substrate P (i.e., the direction of the synchronized movement) is set to the Y axial direction, while the scanning direction of the mask M (i.e., the direction of the synchronized movement) is also set to the Y axial direction. At the same time as the exposure apparatus EX moves the substrate P in the Y axial direction relative to a projection region PR of the projection optical system PL and, in synchronization with this movement of the substrate P in the Y axial direction, moves the mask M in the Y axial direction relative to the illumination region IR of the illumination optical system IL, it also illuminates the mask M with the exposure light EL, and irradiates the exposure light EL from the mask M onto the substrate P so as to expose the substrate P.

The illumination optical system IL includes a plurality of optical elements $IR_1$ to $IR_4$, and illuminates a predetermined illumination region IR on the mask M with exposure light EL which has a uniform illuminance distribution. The optical elements $IR_1$ to $IR_4$ may be multilayer film reflecting mirrors which are provided with a multilayer film capable of reflecting EUV light. The multilayer film of the optical elements $IR_1$ to $IR_4$ may be, for example, a Mo/Si multilayer film. The respective optical elements $IR_1$ to $IR_4$ are held in a lens barrel (not shown).

The illumination optical system IL illuminates the mask M with exposure light EL from a light source 4. The light source 4 of the present embodiment is a laser excitation type of plasma light source, and includes a housing 9, a laser device 10 that irradiates laser light, and a supply component 11 that supplies a target material such as xenon gas or the like to the interior of the housing 9. Laser light that is irradiated from the laser device 10 and condensed by a condensing optical system 12 is irradiated onto the target material that is discharged from a distal end of the supply component 11. The target material onto which the laser light is irradiated changes into plasma and generates light (i.e., the exposure light EL) that includes EUV light. The light that is generated at the distal end of the supply component 11 is condensed by a condenser 13. Light that has passed through the condenser 13 enters into a collimator mirror 14 that is placed on the outer side of the housing 9. Note that the light source 4 may be an electrical discharge type of plasma light source or maybe another type of light source.

The mask stage 1 is a six degrees of freedom stage which is capable of moving in six directions, namely, in the X axial direction, the Y axial direction, the Z axial direction, the θX direction, the θY direction, and the θZ direction while holding the mask M. In the present embodiment, the mask stage 1 holds a mask M such that the reflective surface of the mask M is substantially parallel with the XY plane. Moreover, in the present embodiment, the mask stage 1 holds the mask M such that the reflective surface of the mask M faces in the −Z direction. Positional information of the mask stage 1 (i.e., the mask M) is measured by a laser interferometer 16M of the interferometric system 16. The laser interferometer 16M measures positional information for the mask stage 1 in the X axial, Y axial, and θZ directions using a measuring mirror 1R which is provided on the mask stage 1. Moreover, surface position information (i.e., position information relating to the Z axial, the θX, and the θY directions) for the reflective surface of the mask M which is held on the mask stage 1 is detected by a focusing and leveling detection system (not shown). The control unit 5 controls the position of the mask M which is held on the mask stage 1 based on measurement results from the laser interferometer 16M and on detection results from the focusing and leveling detection system.

The projection optical system PL includes a plurality of optical elements $PR_1$ to $PR_4$, and projects an image of the pattern on the mask M onto the substrate P at a predetermined projection magnification. The optical elements $PR_1$ to $PR_4$ may be multilayer film reflecting mirrors that are provided with a multilayer film capable of reflecting EUV light. The multilayer film of the optical elements $PR_1$ to $PR_4$ may be, for example, a Mo/Si multilayer film. The respective optical elements $PR_1$ to $PR_4$ are held in a lens barrel (not shown). Moreover, in the present embodiment, the respective optical elements $PR_1$ to $PR_4$ of the projection optical system PL are housed in a dedicated vacuum chamber (lens barrel) 15. Note that it is not necessary for this dedicated vacuum chamber to be provided.

The substrate stage 2 includes a holding member 20 that has a holding surface 19 that holds a substrate P on which a pattern is formed as a result of exposure light EL from the pattern on the mask M being irradiated thereon, and a stage body 21 that supports the holding member 20. The substrate stage 2 is able to move in the X axial direction, the Y axial direction, the Z axial direction, the θX direction, the θY direction, and the θZ direction while holding a substrate P by means of the holding member 20. In the present embodiment, the substrate stage 2 holds the substrate P such that a surface of the substrate (i.e., an exposure surface) is substantially parallel with the XY plane. Moreover, in the present embodiment, the substrate stage 2 holds the substrate P such that the surface of the substrate P faces in the +Z direction. Positional information of the substrate stage 2 (i.e., the substrate P) is measured by a laser interferometer 16P of the interferometric system 16. The laser interferometer 16P measures positional information for the substrate stage 2 in the X axial, Y axial, and θZ directions using a measuring mirror 21R which is provided on the substrate stage 2. Moreover, surface position information (i.e., position information relating to the Z axial, the θX, and the θY directions) for the surface of the substrate P which is held on the substrate stage 2 is detected by a focusing and leveling detection system (not shown). The control unit 5 controls the position of the substrate P which is held on the substrate stage 2 based on measurement results from the laser interferometer 16P and on detection results from the focusing and leveling detection system.

In the present embodiment, in order to expose the substrate P with exposure light EL from the pattern on the mask M, as is shown in FIG. 1, the mask M is held on the mask stage 1, and the substrate P is held on the holding member 20 of the substrate stage 2. The mask M that is held on the mask stage 1 is illuminated by exposure light (i.e., EUV light) EL that has been emitted from the light source 4 and has passed through the illumination optical system IL. The exposure light EL emitted from the illumination optical system IL is incident on the reflective surface of the mask M. Exposure light EL that is irradiated onto the reflective surface of the mask M and is then reflected by this reflective surface is incident on the projection optical system PL from the object surface side of the projection optical system PL. Exposure light EL that is incident on the projection optical system PL via the object surface side of the projection optical system PL is emitted onto the image surface side of the projection optical system PL, and is then irradiated onto the surface (i.e., the exposure surface) of the substrate P. As a result, the image of the pattern on the mask M that has been illuminated by the exposure light EL is projected via the projection optical system PL onto the photosensitive substrate P, thereby exposing the substrate P. In this manner, as a result of exposure light EL from the pattern on the mask M being irradiated onto the substrate P via the projection optical system PL, a pattern is formed on the substrate P.

Figure 2:
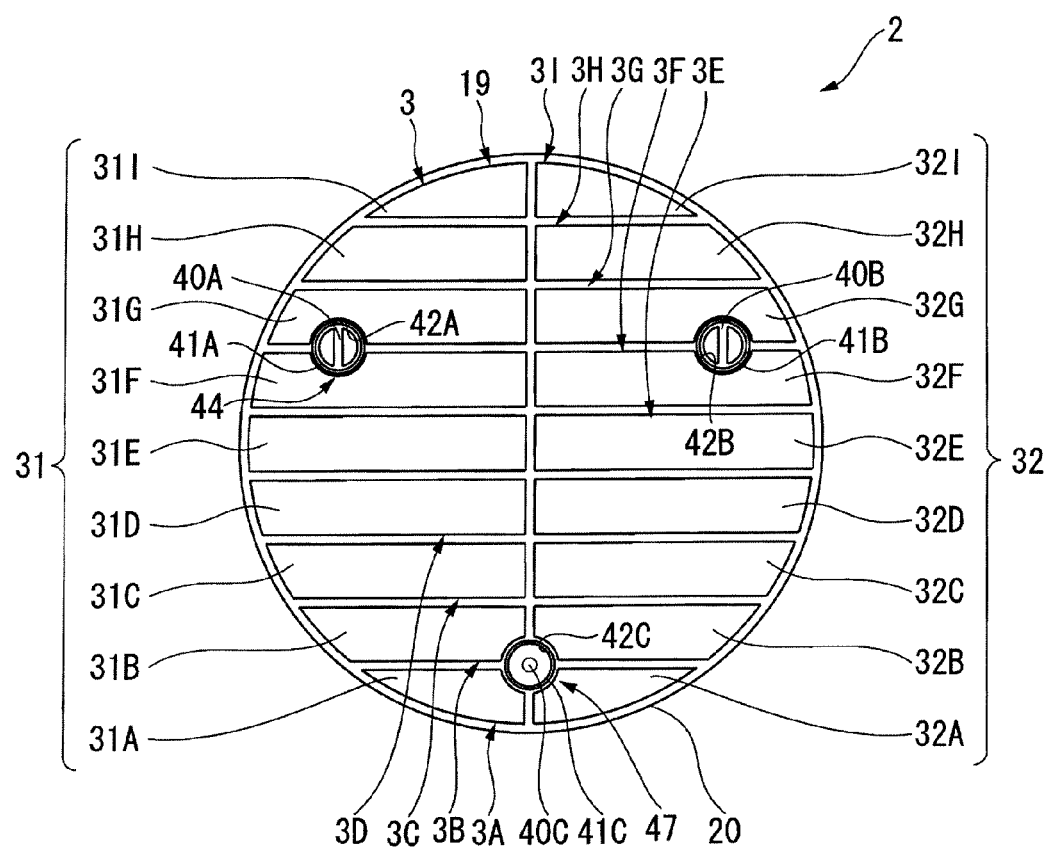
FIG. 2 is a plan view showing a portion of a substrate stage according to the first embodiment.
Figure 3:
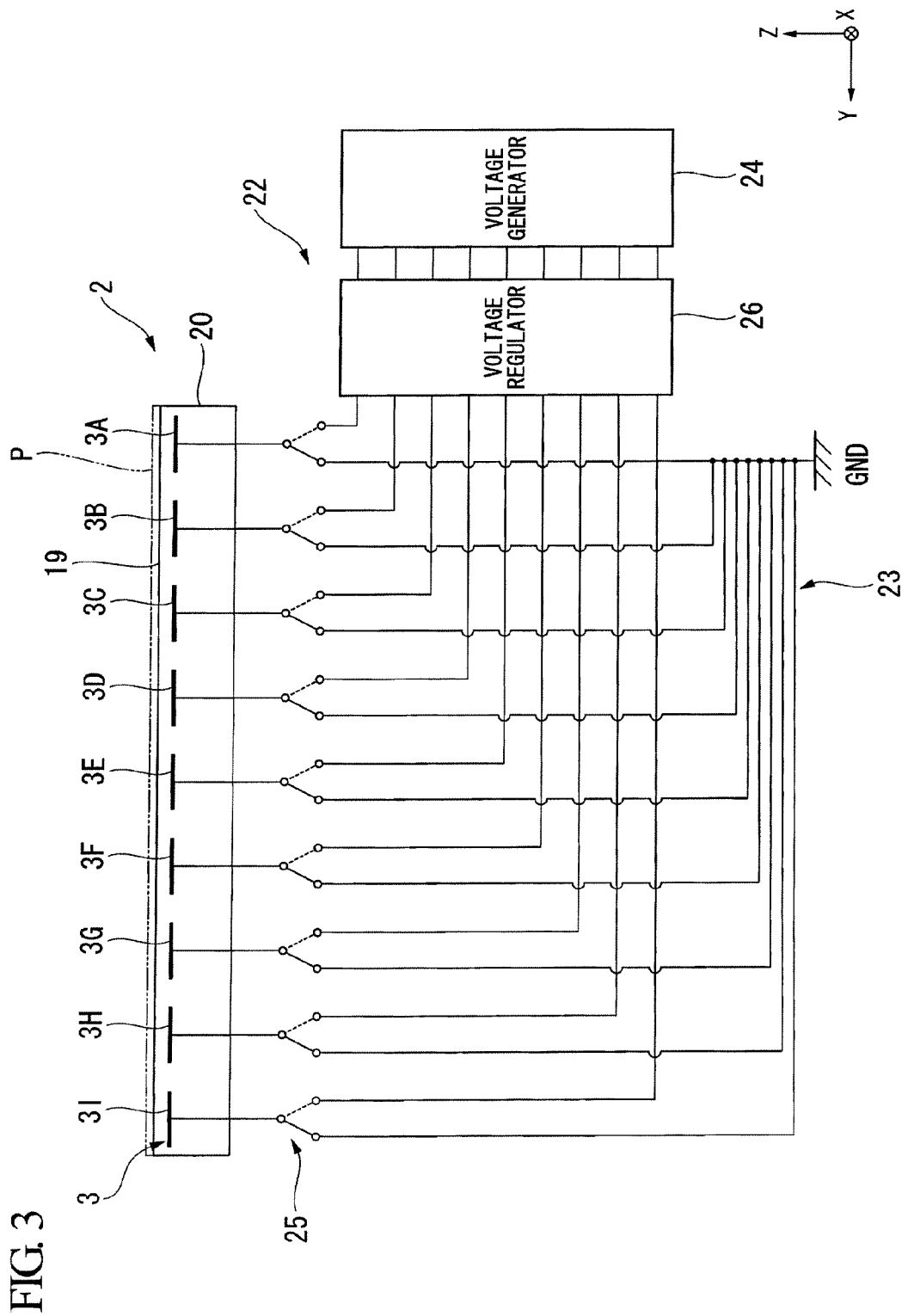
FIG. 3 is a side view showing a portion of the substrate stage according to the first embodiment.

FIG. 2 is a plan view showing a portion of the substrate stage 2, while FIG. 3 is a side view showing a portion of the substrate stage 2. In FIG. 2 and FIG. 3, the substrate stage 2 has the holding member 20 which has the holding surface 19 that holds the substrate P on which a pattern is formed. In the present embodiment, the holding surface 19 is placed so as to be substantially parallel with the XY plane. Moreover, the holding surface 19 is placed so as to face in the +Z direction.

The substrate P has a rear surface that faces the holding surface 19, and the holding surface 19 holds the rear surface of the substrate P. The rear surface of the substrate P is the surface on the opposite side from the surface where the exposure light EL is irradiated. As is described above, the substrate P may be one in which a film of a photosensitive material (i.e., resist) or the like is formed on one surface (i.e., a surface onto which the exposure light is irradiated) of a base material such as a semiconductor wafer and the like. In the present embodiment, the outer shape of the holding surface 19 is substantially the same as the outer shape of the rear surface of the substrate P.

The holding member 20 of the present embodiment includes an electrostatic chuck mechanism, and the holding surface 19 holds the rear surface of the substrate P using electrostatic force. For example, a dual stage formed by a coarse movement stage and a fine movement stage can be used for the substrate stage 2. In the present embodiment, the holding member 20 is mounted on top of the fine movement stage (not shown). A plurality of electrode members 3 are provided on the holding member 20. The electrode members 3 generate electrostatic force that is used to suction a substrate P onto the holding surface 19 in accordance with voltage which is applied thereto. That is, the voltage applied electrode members 3 generate electrostatic field under which the substrate P can be attracted to the holding surface 19. In the present embodiment, a power supply device 22 that is capable of applying a predetermined voltage to the electrode members 3 is provided on the substrate stage 2. The power supply device 22 may be placed at the outer side of the vacuum chamber 6, or a different position from the substrate stage 2 on the inner side of the vacuum chamber 6. The power supply device 22 is electrically connected by electrical wiring to the electrode members 3. Each of the plurality of electrode members 3 has a predetermined shape and is placed in a predetermined position on the holding member 20.

The holding member 20 of the present embodiment is formed from an insulating material such as low-expansion ceramics. At least a portion of the holding member 20 functions as a dielectric substance for the electrostatic chuck mechanism. The electrode members 3 are placed inside the holding member 20. The holding surface 19 is formed from an insulating material such as the aforementioned low-expansion ceramics.

Because the holding member 20 is a low-expansion material, thermal deformation of the holding member 20, and consequent deformation of the held substrate P is restricted. Moreover, when measurement marks or measurement components or the like are provided on the holding member 20, deformation all of these measurement marks and measurement components is restricted.

The electrostatic chuck mechanism of the present embodiment has what is known as a bipolar system, and includes electrode members 3 to which a positive potential is applied by the power supply device 22 and electrode members 3 to which a negative potential is applied by the power supply device 22.

In the description below, of the plurality of electrode members 3, the electrode members 3 to which a positive potential is applied are suitably referred to as positive electrodes 31, while the electrode members 3 to which a negative potential is applied are suitably referred to as negative electrodes 32.

A plurality of the positive electrodes 31 are provided, and a plurality of negative electrodes 32 are provided so as to correspond to the positive electrodes 31. As is shown in FIG. 2 and FIG. 3, in the present embodiment, nine positive electrodes 31 (31A to 31I) and nine negative electrodes 32 (32A to 32I), which correspond respectively to the nine positive electrodes 31 (31A to 31I), are provided on the holding member 20.

As is shown in FIG. 2, in the present embodiment, the plurality of positive electrodes 31 are located in an area on the −X side of the center of the holding surface 19, while the plurality of negative electrodes 32 are located in an area on the +X side thereof. In addition, the plurality of positive electrodes 31 extend in the Y axial direction in the area on the −X side of the center of the holding surface 19. The plurality of negative electrodes 32 extend in the Y axial direction in the area on the +X side of the center of the holding surface 19.

In the description given below, of the plurality of positive electrodes 31 that extend in the Y axial direction, the positive electrode 31 that is closest to the edge on the −Y side of the holding surface 19 is suitably referred to as a first positive electrode 31A, while the positive electrode 31 that is the next closest to the edge on the −Y side of the holding surface 19 after the first positive electrode 31A is referred to as a second positive electrode 31B. In addition, of the plurality of positive electrodes 31, the third, fourth, . . . , up to the eighth positive electrode in sequence in the +Y direction from the second positive electrode 31B are referred to as a third positive electrode 31C, a fourth positive electrode 31D, . . . , up to an eighth positive electrode 31H, while the positive electrode 31 that is closest to the edge on the +Y side of the holding surface 19 is suitably referred to as a ninth positive electrode 31I.

In the description given below, of the plurality of negative electrodes 32 that extend in the Y axial direction, the negative electrode 32 that is closest to the edge on the −Y side of the holding surface 19 is suitably referred to as a first negative electrode 32A, while the negative electrode 32 that is the next closest to the edge on the −Y side of the holding surface 19 after the first negative electrode 32A is referred to as a second negative electrode 32B. In addition, of the plurality of negative electrodes 32, the third, fourth, . . . , up to the eighth negative electrode in sequence in the +Y direction from the second negative electrode 32B are referred to as a third negative electrode 32C, a fourth negative electrode 32D, . . . , up to an eighth negative electrode 32H, while the negative electrode 32 that is closest to the edge on the +Y side of the holding surface 19 is suitably referred to as a ninth negative electrode 32I.

The first positive electrode 31A and the first negative electrode 32A are positioned facing each other in the X axial direction on the XY plane. Moreover, in the present embodiment, the size of the first positive electrode 31A is substantially the same as the size of the first negative electrode 32A. Furthermore, the shape of the first positive electrode 31A is substantially the same as the shape of the first negative electrode 32A. In the present embodiment, the first positive electrode 31 and the first negative electrode 32 are line symmetry with respect to the Y axis.

In the same way, each of the second, third, . . . , and ninth positive electrodes 31B, 31C, . . . , and 31I correspond respectively to each of the second, third, . . . , and ninth negative electrodes 32B, 32C, . . . , and 32I. Each of the second, third, . . . , and ninth positive electrodes 31B, 31C, . . . , and 31I and each of the second, third, . . . , and ninth negative electrodes 32B, 32C, . . . , and 32I are positioned facing each other in the X axial direction on the XY plane. Each of the second, third, . . . , and ninth positive electrodes 31B, 31C, . . . , and 31I and each of the second, third, . . . , and ninth negative electrodes 32B, 32C, . . . , and 32I are line symmetry with respect to the Y axis.

In the description given below, the first positive electrode 31A to which a positive potential is applied and the first negative electrode 32A to which a negative potential is applied are suitably referred to in combination as a first electrode pattern 3A. In the same way, the second positive electrode 31B and the second negative electrode 32B are suitably referred to in combination as a second electrode pattern 3B. The third positive electrode 31C and the third negative electrode 32C are suitably referred to in combination as a third electrode pattern 3C. The fourth positive electrode 31D and the fourth negative electrode 32D are suitably referred to in combination as a fourth electrode pattern 3D. The fifth positive electrode 31E and the fifth negative electrode 32E are suitably referred to in combination as a fifth electrode pattern 3E. The sixth positive electrode 31F and the sixth negative electrode 32F are suitably referred to in combination as a sixth electrode pattern 3F. The seventh positive electrode 31G and the seventh negative electrode 32G are suitably referred to in combination as a seventh electrode pattern 3G. The eighth positive electrode 31H and the eighth negative electrode 32H are suitably referred to in combination as an eighth electrode pattern 3H. The ninth positive electrode 31I and the ninth negative electrode 32I are suitably referred to in combination as a ninth electrode pattern 3I.

In the present embodiment, each electrode member 3 has a shape which is elongated in the X axial direction. The shape within the XY plane of the edge of each electrode member 3 that faces the edge of the holding member 20 is a curved shape that corresponds to the outer shape of the holding surface 19. Moreover, the shape within the XY plane of the edges of the respective positive electrodes 31 that face the negative electrodes 32 is a straight line which is substantially parallel with the Y axis, while the shape within the XY plane of the edges of the respective negative electrodes 32 that face the positive electrodes 31 is a straight line which is substantially parallel with the Y axis.

Moreover, the shape within the XY plane of the edges on the +Y side and of the edges on the −Y side of each positive electrode 31B to 31H (i.e., excluding the first and ninth positive electrodes 31A and 31H) are straight lines which are substantially parallel with the X axis. In addition, the size of each positive electrode 31 in the Y axial direction is substantially the same. The shape within the XY plane of the edge on the +Y side of the first positive electrode 31A is a straight line which is substantially parallel with the X axis, while the shape within the XY plane of the edge on the −Y side of the ninth positive electrode 31I is a straight line which is substantially parallel with the X axis.

Moreover, the shape within the XY plane of the edges on the +Y side and of the edges on the −Y side of each negative electrode 32B to 32H (i.e., excluding the first and ninth negative electrodes 32A and 32H) are straight lines which are substantially parallel with the X axis. In addition, the size of each negative electrode 32 in the Y axial direction is substantially the same. The shape within the XY plane of the edge on the +Y side of the first negative electrode 32A is a straight line which is substantially parallel with the X axis, while the shape within the XY plane of the edge on the −Y side of the ninth negative electrode 32I is a straight line which is substantially parallel with the X axis.

In addition, in the present embodiment, the plurality of electrode members 3 that include the respective positive electrodes 31 and negative electrodes 32 are positioned so as to match substantially the entire area of the holding surface 19.

As is shown in FIG. 3, the substrate stage 2 is provided with a power supply device 22 which is capable of supplying a predetermined voltage to the plurality of electrode members 3. The power supply device 22 is provided with wires 23 that are connected to the respective electrode members 3, a voltage generator 24 that generates voltage to be supplied to the respective electrode members 3 via the wires 23, switches 25 that are located on the wires 23 and that switch between supplying voltage and stopping the supply of voltage to the electrode members 3, and a voltage regulator 26 that is capable of regulating the value of the voltage supplied to the respective electrode members 3. A plurality of the switches 25 are provided so as to correspond to the plurality of electrode members 3 (i.e., the electrode patterns 3A to 3I). The voltage regulator 26 is able to individually regulate the value of each voltage that is supplied to each one of the plurality of electrode members 3. The power supply device 22 is controlled by the control unit 5. Note that if the voltage values are not regulated, then it is not necessary to supply the voltage regulator 26.

The control unit 5 generates Coulomb force and/or Johnsen-Rahbek force between the holding surface 19 of the holding member 20 and a rear surface of the substrate P by supplying a predetermined voltage to the positive electrode 31 and negative electrode 32 of the electrostatic chuck mechanism. As a result, the substrate P attracts to the holding surface 19 of the holding member 20 by electrostatic force and is held thereon.

Figure 4:
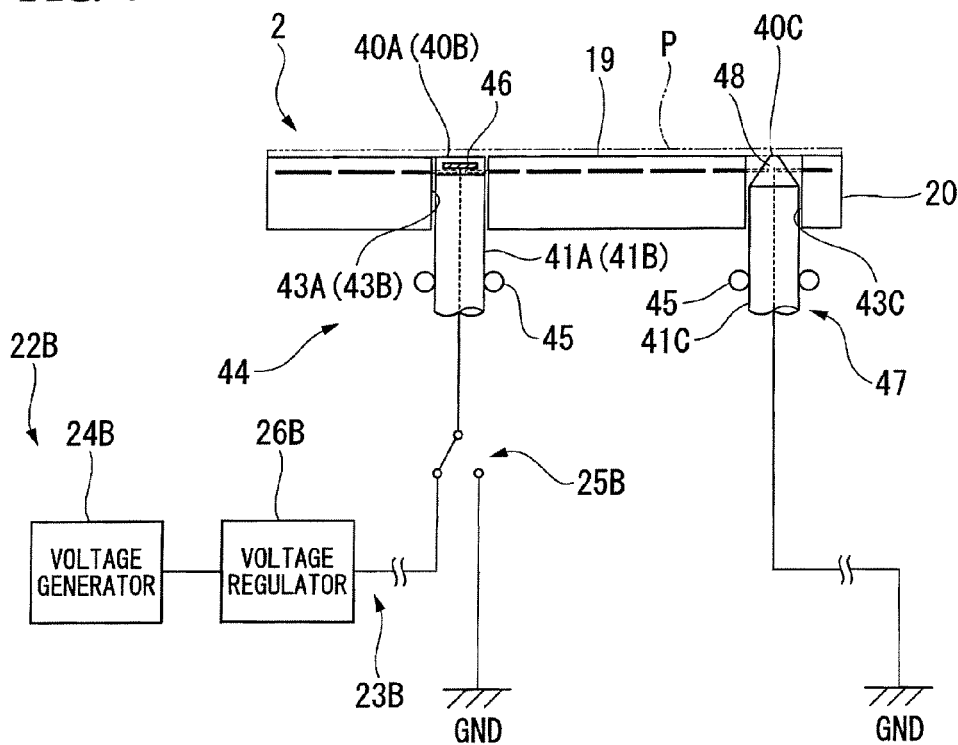
FIG. 4 is a side cross-sectional view showing a portion of the substrate stage according to the first embodiment.

FIG. 4 is a side cross-sectional view of the holding member 20. In FIG. 2 and FIG. 4, the substrate stage 2 is provided with a moving mechanism 44 that moves the substrate P relative to the holding member 20. The moving mechanism 44 moves the substrate P relative to the holding surface 19 of the holding member 20 mainly in the Z axial direction. If the moving mechanism 44 is provided, for example, on a coarse movement stage (not shown), then it is possible to lighten the weight of the fine movement stage (not shown) and the holding member 20. As a result, it is possible to improve the accuracy which with the substrate P is positioned. In the present embodiment, the movement mechanism 44 is placed on the coarse movement stage, however, it can also be provided in another location such as on the fine movement stage or the holding member 20.

The moving mechanism 44 is provided with a plurality of supporting members 41A, 41B, and 41C that respectively have supporting surfaces 40A, 40B, and 40C that are capable of supporting the rear surface of the substrate P, and with drive apparatuses 45 that are capable of moving the respective supporting members 41A, 41B, and 41C in a direction which is perpendicular to the holding surface 19 (i.e., the Z axial direction). Each supporting member 41A, 41B, and 41C is a rod shaped component. In the present embodiment, the first supporting member 41A and the second supporting member 41B have substantially the same structure, while the third supporting member 41C has a different structure from that of the first and second supporting members 41A and 41B.

The holding member 20 has a plurality of holes 43A, 43B, and 43C that are formed such that they extend the interior of the holding member 20 in the Z axial direction correspondingly to the supporting members 41A, 41B, and 41C. In the present embodiment, at least a portion of each supporting member 41A, 41B, and 41C is placed in the respective holes 43A, 43B, and 43C, however, normally, it is not necessary for the respective supporting members 41A, 41B, and 41C to be placed inside the holes 43A, 43B, and 43C. For example, it is also possible to employ a structure in which the respective supporting members 41A, 41B, and 41C pass through the holes 43A, 43B, and 43C and thereby push up the substrate P only when the substrate P needs to be pushed up in the Z axial direction. In the present embodiment, top ends of the holes 43A, 43B, and 43C are placed at substantially equal intervals so as to encircle the center of the holding surface 19.

The supporting members 41A, 41B, and 41C are capable of moving in the Z axial direction through the holes 43A, 43B, and 43C. The drive apparatuses 45 are able to move each supporting member 41A, 41B, and 41C independently. The moving mechanism 44 is able to move the supporting members 41A, 41B, and 41C using the drive apparatuses 45 such that the supporting surfaces 40A, 40B, and 40C of the supporting members 41A, 41B, and 41C are located on the +Z side of the holding surface 19. In addition, the moving mechanism 44 is able to move the supporting members 41A, 41B, and 41C using the drive apparatuses 45 such that the supporting surfaces 40A, 40B, and 40C of the supporting members 41A, 41B, and 41C are located on the −Z side of the holding surface 19. Various types of actuator such as electromagnetic actuators and actuators that use piezoelectric elements can be used for the drive apparatuses 45.

The supporting members 41A, 41B, and 41C are capable of moving relative to the holding surface 19 of the holding member 20 by means of the drive apparatuses 45 while supporting predetermined areas of the rear surface of the substrate P which is facing the holding surface 19. Namely, when the substrate P is supported on the supporting surfaces 40A, 40B, and 40C of the supporting members 41A, 41B, and 41C, the moving mechanism 44 is able to move the substrate P in a direction in which the holding surface 19 of the holding member 20 and the rear surface of the substrate P move towards each other or move away from each other by moving the supporting members 41A, 41B, and 41C by means of the drive apparatuses 45.

In the present embodiment, the first and second supporting members 41A and 41B include an electrostatic chuck mechanism, and the supporting surfaces 40A and 40B are able to hold the rear surface of the substrate P by means of electrostatic force. As is shown in FIG. 4, the substrate stage 2 is provided with a plurality of electrode members 46 that are provided on the first and second supporting members 41A and 41B, and that generate electrostatic force that attracts the substrate P to the supporting surfaces 40A and 40B, and with a power supply device 22B that is capable of supplying voltage to the plurality of electrode members 46. Note that it is also possible to not provide the power supply device 22B on the substrate stage, and to instead place it in another position inside the vacuum chamber 6 or in another position outside the vacuum chamber 6.

Figure 5:
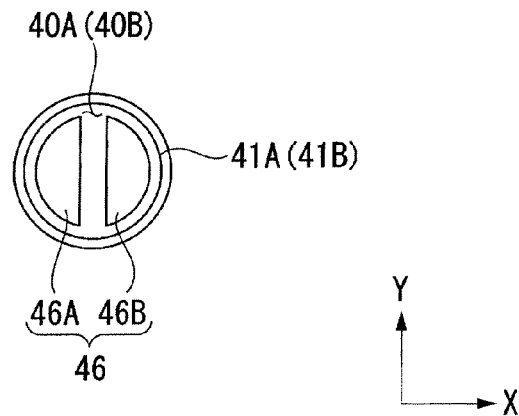
FIG. 5 is a plan view in order to illustrate a first and second supporting member according to the first embodiment.

FIG. 5 is a plan view showing an electrode member 46 provided in the first supporting member 41A. The electrode member 56 is placed inside the first supporting member 41A. The electrostatic chuck mechanism of the present embodiment is what is known as a bipolar system, and includes electrode members 46A to which a positive potential is applied by the power supply device 22B and electrode members 46B to which a negative potential is applied by the power supply device 22B. In the description below, the electrode members 46 to which a positive potential is applied are suitably referred to as positive electrodes 46A, while the electrode members 46 to which a negative potential is applied are suitably referred to as negative electrodes 46B.

As is shown in FIG. 4, the power supply device 22B is provided with wires 23B that are connected to the respective electrode members 46, a voltage generator 24B that generates voltage to be supplied to the respective electrode members 46 via the wires 23B, switches 25B that are located on the wires 23B and that switch between supplying voltage and stopping the supply of voltage to the electrode members 46, and a voltage regulator 26B that is able to regulate the value of the voltage supplied to the respective electrode members 46. Note that for reasons of convenience in the description below, only one wire 23B and switch 25B are described, however, a wire 23B and switch 25B are provided for each one of the electrode members 46.

The control unit 5 generates Coulomb force and/or Johnsen-Rahbek force between the supporting surface 40A and a rear surface of the substrate P by supplying a predetermined voltage to the positive electrodes 46A and negative electrodes 46B of the electrostatic chuck mechanism. As a result, the substrate P becomes attracted to the supporting surface 40A of the first supporting member 41A by electrostatic force and is held thereon.

In the same way, the second supporting member 41B has an electrostatic chuck mechanism which includes positive electrodes 46A and negative electrodes 46B in the same way as the first supporting member 41A, and predetermined voltage is supplied to the positive electrodes 46A and negative electrodes 46B by the power supply device 22B. The structure of the second supporting member 41B is substantially the same as the structure of the first supporting member 41A and a description of the second supporting member 41B is therefore omitted.

Note that, in the present embodiment, both positive electrodes and negative electrodes are placed in each of the supporting members 41A and 41B, however, it is also possible for only one electrode to be placed in each of the supporting members 41A and 41B such as, for example, placing a positive electrode on the supporting member 41A side and a negative electrode on the supporting member 41B side. Moreover, the number of supporting members 41 is not limited to two, and one supporting member 41 or three or more supporting members 41 may be provided.

Moreover, in the present embodiment, the substrate stage 2 is also provided with an antistatic device 47 that removes electrostatic charge on the substrate P held on the holding member 20. In the present embodiment, the antistatic device 47 includes a third supporting member 41C of the moving mechanism 44.

The third supporting member 41C of the present embodiment includes a conductive member 48 which has conductivity. In the present embodiment, the conductive member 48 is formed at least on a supporting surface 40C of the third supporting member 41C. Moreover, as is shown in FIG. 4, the conductive member 48 of the third supporting member 41C is grounded (i.e. is earthed). As a result of the grounded conductive member 48 coming into contact with the substrate P, electricity (i.e., any electric charge) which is electrifying the substrate P is removed from that substrate P.

As is shown in FIG. 2, in the present embodiment, an aperture 42C through which the third supporting member 41C is able to move is positioned on the −Y side (i.e., on the first electrode pattern 3A side) of the center of the holding surface 19. Apertures 42A and 42B through which the first and second supporting members 41A and 41B are able to move are positioned on the +Y side (i.e., on the ninth electrode pattern 3I side) of the center of the holding surface 19.

Figure 6:
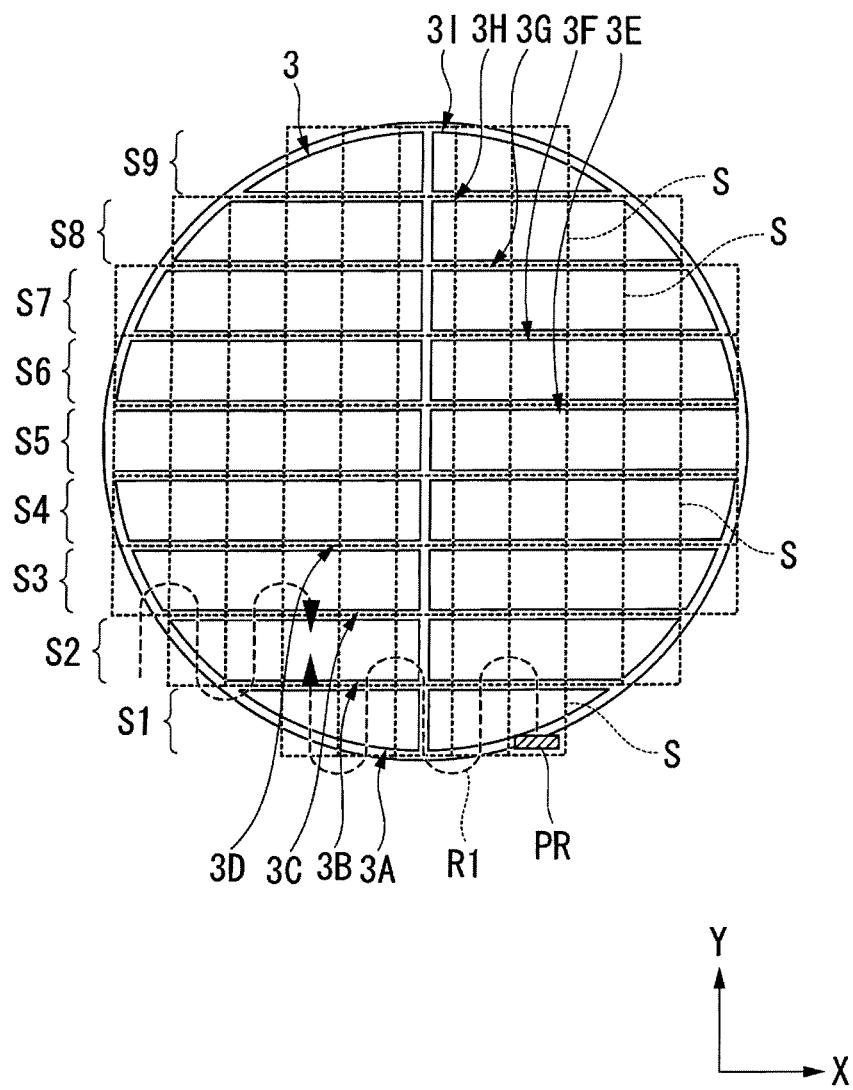
FIG. 6 is a typical view showing a relationship between a holding member and shot areas on a substrate.

FIG. 6 is a typical view showing a relationship between shot areas S on the substrate P on which a pattern has been formed by the irradiation of exposure light EL, and the holding member 20. Note that in FIG. 6 the supporting members 41A, 41B, and 41C and the like have been omitted from the drawing. As is shown in FIG. 6, shot areas S which are exposure subject areas are set on the substrate P. The mask M has a pattern formation area MR (see FIG. 1) on which a pattern that is to be projected onto the shot areas S is placed. In the present embodiment, an image of the pattern that is placed on the pattern formation area MR of the mask M is projected onto a single shot area S. Namely, a pattern is formed on a single shot area S in accordance with the pattern that is placed on the pattern formation area MR of the mask M. For example, when a pattern for one chip (i.e., a device pattern) is formed on the pattern formation area MR of the mask M, the pattern for one chip is formed on a single shot area S. When a pattern (i.e., a device pattern) for a plurality of chips (for example, for two chips) is formed on the pattern formation area MR of the mask M, a pattern for the plurality of chips is formed on the single shot area S.

Exposure light EL is irradiated from the pattern within the illumination area IR of the mask M onto the projection area PR of the projection optical system PL. As is shown in FIG. 6, in the present embodiment, the projection area PR is a rectangular shape (i.e., slit shape) which is elongated in the X axial direction. The projection optical system PL irradiates the projection area PR with the exposure light from the pattern on the mask M which corresponds to the illumination area IR, and exposes a portion of the shot areas S on the substrate P with the irradiated exposure light onto the projection area PR.

When a single shot area S is being exposed, the control unit 5 irradiates the exposure light EL onto the projection area PR while moving the shot area S on the substrate P in the Y axial direction relative to the projection area PR in synchronization with the movement in the Y axial direction of the pattern formation area MR on the mask M relative to the illumination area IR. As a result, an image of the pattern placed on the pattern formation area MR on the mask M is projected onto the shot area S.

A plurality of shot areas S are set in a matrix layout on the substrate P, and this plurality of shot areas S are exposed in sequence. Namely, the pattern that is placed on the pattern formation area MR of the mask M is formed in sequence on each of the plurality of shot areas S on the substrate P. The control unit 5 sequentially exposes the plurality of shot areas S while repeatedly performing an operation to irradiate the exposure light EL onto the substrate P while moving the mask M and the substrate P in synchronization in the Y axial direction in order to expose a predetermined shot area S, and an operation to move the substrate P in a stepping motion in the X axial direction in order to expose the next shot area S. In the present embodiment, as an example, the control unit 5 sequentially exposes the plurality of shot areas S on the substrate P while moving the substrate stage 2 such that the projection area PR of the projection optical system PL and the substrate P are moved relatively following the arrow R1 shown in FIG. 6.

As is shown in FIG. 6, in the present embodiment, nine shot area groups, which are made up of a plurality of shot areas S aligned in the X axial direction, are aligned in the Y axial direction on the substrate P.

In the description given below, of the plurality of shot area groups that are aligned in the Y axial direction, the shot area group that is closest to the edge on the −Y side of the holding surface 19 is called a first shot area group S1 when appropriate, the shot area group that is next closest to the edge on the −Y side of the holding surface 19 after the first shot area group S1 is called a second shot area group S2 when appropriate. In addition, of the plurality of shot area groups, the third, fourth, etc. up to the eighth shot area group in sequence in the +Y direction from the second shot area group S2 are referred to as a third shot area group S3, a fourth shot area group S4, . . . , up to an eighth shot area group S8, while the shot area group that is closest to the edge on the +Y side of the holding surface 19 is referred to as a ninth shot area group S9 when appropriate.

As is shown in FIG. 6, in the present embodiment, each of the electrode members 3 has a size and shape that corresponds to the pattern information, and is positioned on the holding member 20 in accordance with the pattern information. The pattern information includes at least one of information relating to the size of the pattern and pattern layout information. In the present embodiment, the pattern information includes information about the pattern formed on the substrate P.

Information relating to the size of the pattern includes information relating to the size of the pattern formed on the substrate P, and includes information relating to the size of the pattern that is formed on the substrate P as a result of an image of the pattern which is placed on the pattern formation area MR of the mask M being projected thereon. Namely, in the present embodiment, information relating to the size of the pattern includes information relating to the size of the shot areas S on the substrate P, and consequently information relating to the size of the chips that are to be formed on the substrate P.

The pattern layout information includes layout information for the pattern that is formed on the substrate P, and includes information relating to the layout of the pattern that is formed on the substrate P as a result of an image of the pattern which is placed on the pattern formation area MR of the mask M being projected thereon. Namely, in the present embodiment, information relating to the layout of the pattern includes information relating to the layout of the plurality of shot areas S on the substrate P, and consequently information relating to the layout of the chips that are formed on the substrate P.

In the present embodiment, the plurality of electrode members 3 are arranged in accordance with information relating to the pattern that is formed on the substrate P, specifically, in accordance with information relating to the shot areas S that are set on the substrate P. As is shown in FIG. 6, in the present embodiment, the size in the Y axial direction of the respective electrode members 3 is set so as to substantially match the size in the Y axial direction of the shot areas S. When a single chip is to be formed on a single shot area S, the size in the Y axial direction of each electrode member 3 is set so as to substantially match the size in the Y axial direction of a single chip. Moreover, the sizes in the X axial direction of each of the first through ninth electrode patterns 3A to 3I that are formed by the electrode members 3 are set so as to substantially match the sizes in the X axial direction of each of the first through ninth shot area groups S1 to S9 that are formed by the shot areas S.

Moreover, each electrode member 3 is arranged so as to correspond to the plurality of shot areas S. In the present embodiment, each of the first through ninth electrode patterns 3A to 3I is arranged so as to correspond respectively to each of the first through ninth shot area groups S1 to S9.

As an example, the diameters of the circular substrate P and the holding surface 19 which is substantially the same as the outer configuration of this substrate P are 300 mm, the size in the Y axial direction of each electrode member 3 (i.e., the size in the Y axial direction of a single chip) is approximately 33 mm, and the distance between adjacent electrode members 3 is approximately 5 mm.

Next, an example of a method of exposing a substrate P using the exposure apparatus EX having the above described structure will be described.

In the present embodiment, the power supply device 22 regulates the voltage that is supplied to each electrode member 3 in accordance with pattern information. As is described above, pattern information includes at least one of information relating to the size of the pattern that is formed on the substrate P, and pattern layout information, and includes information relating to the shot areas S on the substrate P, and information on the chips that are to be formed on the substrate P.

Moreover, in the present embodiment, the pattern information includes the pattern formation sequence. The sequence in which the pattern is to be formed includes the sequence in which the pattern is to be formed on the substrate P. In the present embodiment, the sequence in which the pattern is to be formed on the substrate P includes the sequence in which the operation to form patterns on each of the plurality of shot areas S that are set on the substrate P is to be executed, in other words, the sequence in which the exposure light EL is irradiated from the pattern of the mask M in order to form a pattern on each of the shot areas S.

At a predetermined timing prior to the commencement of the exposure of the substrate P, exposure conditions which include pattern information (i.e., pattern formation conditions) are input into the control unit 5 by means of the input device 7. Based on the exposure conditions including the pattern information that has been input by means of the input device 7, the control unit 5 controls at the least the operation of the power supply device 22 when the substrate P is being exposed. The control unit 5 controls the power supply device 22 in accordance with the pattern information input by means of the input device 7, and regulates the voltage supplied to each electrode member 3 by this power supply device 22. Note that the exposure conditions including the pattern information (i.e., the pattern formation conditions) may be stored in advance in the storage device 8. In this case, the control unit 5 controls the power supply device 22 in accordance with pattern information that is stored in this storage device 8, so as to enable the voltage that is supplied to each electrode member 3 to be regulated by this power supply device 22.

In the present embodiment, a description is given of when the control unit 5 firstly exposes the shot areas S of the first shot area group S1, and then sequentially exposes the shot areas S of the second, third, . . . , up to the eighth shot area groups S2, S3, . . . , up to S8, and then finally exposes the shot areas S of the ninth shot area group S9.

Figure 7B:
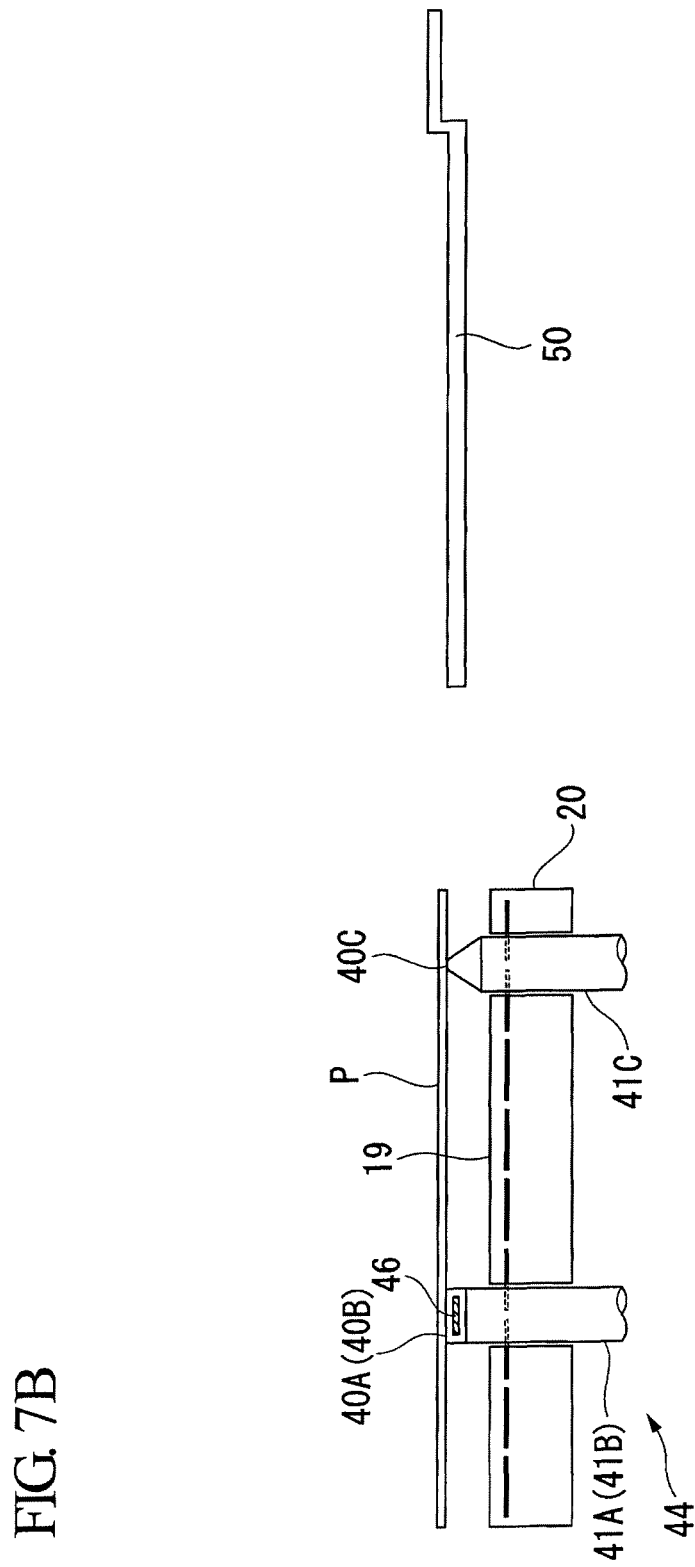
FIG. 7B is a view in order to illustrate an example of an operation of the exposure apparatus according to the first embodiment.

Firstly, as is shown in FIG. 7A, an unexposed substrate P is transported to (i.e., loaded onto) the holding member 20 of the substrate stage 2 by a predetermined transporting apparatus 50. When loading the substrate P onto the holding member 20, the control unit 5 moves the supporting members 41A to 41C using the drive apparatuses 45 of the moving mechanism 44 such that the supporting surfaces 40A to 40C of the supporting members 41A to 41C are located above (i.e., on the +Z side) of the holding surface 19 of the holding member 20. As is shown in FIG. 7B, the transporting apparatus 50 loads the substrate P onto the supporting surfaces 40A to 40C of the supporting members 41A to 41C that are positioned on the +Z side of the holding surface 19.

In the present embodiment, the first and second supporting members 41A and 41B have electrostatic chuck mechanisms that include positive electrodes 46A and negative electrodes 46B, and a substrate P that has been delivered by the transporting apparatus 50 is held thereon by electrostatic force. As a result, it is possible to limit any shifting in the position of the substrate P or the like. After the rear surface of the substrate P has been attracted to the supporting surfaces 40A and 40B of the first and second supporting members 41A and 41B by electrostatic force, the control unit 5 moves the supporting members 41A to 41B that support the rear surface of the substrate P downwards (i.e., in the −Z direction). Namely, the control unit 5 moves the supporting members 41A to 41B that support the rear surface of the substrate P such that the rear surface of the substrate P and the holding surface 19 of the holding member 20 come closer together. As a result, as is shown in FIG. 7C, the substrate P is placed on the holding surface 19 of the holding member 20. After the substrate P has been placed on the holding surface 19 of the holding member 20, the control unit 5 stops the supply of voltage by the power supply device 22B to the electrode members 46. In addition, the control unit 5 moves the supporting members 41A to 41B in the −Z direction until the rear surface of the substrate P and the supporting surfaces 40A to 40B of the supporting members 41A to 41B are separated. As a result, the holding surface 19 of the holding member 20 is placed in a state in which it is capable of holding a substrate P, and the supporting of the substrate P by the supporting members 41A to 41C is terminated.

After the substrate P has been placed on the holding surface 19 of the holding member 20 that is provided with the electrode members 3, in order to attract the substrate P to the holding surface 19 by electrostatic force, the control unit 5 supplies a predetermined voltage to the electrode members 3 using the power supply device 22. In the present embodiment, after the substrate P has been placed on the holding surface 19 but prior to the exposure of the substrate P, a predetermined voltage is applied to each one of the respective positive electrodes 31A to 31I and each one of the respective negative electrodes 32A to 32I of all of the electrode patterns 3A to 3I. As a result, the substrate P is held by attracting to the holding surface 19 of the holding member 20 by electrostatic force.

After the substrate P has been held by electrostatic force on the holding surface 19 of the holding member 20, the control unit 5 positions the substrate P using an alignment device such as an FIA or the like, and commences the exposure processing for the substrate P. A plurality of shot areas S are set on the substrate P, and an operation is executed in which this plurality of shot areas S are sequentially exposed, and the pattern that is placed on the pattern formation area MR of the mask M is formed on each one of the shot areas S on the substrate P.

Hereinafter, a description will be given while referring to the typical views in FIG. 8 through FIG. 11 of an operation to regulate the voltages supplied by the power supply device 22 to the plurality of electrode members 3 in accordance with the information relating to the pattern that is formed on the substrate P. Specifically, a description of an operation to select predetermined electrode members 3 among the plurality of electrode members 3 in accordance with the information of the pattern being to be formed on the substrate P, and to regulate the voltage applied to the predetermined electrode members 3. Note that, in FIG. 8 through FIG. 11, the supporting members 41A, 41B, and 41C and the like have been omitted from the drawings.

In the present embodiment, the power supply device 22 sets at least the absolute value of the voltage value that is supplied to the positive electrodes 31 and the negative electrodes 32 that correspond to the shot areas S on the substrate P where an operation to form a pattern is currently underway to a larger value than the absolute value of the voltage value supplied to the positive electrodes 31 and the negative electrodes 32 that correspond to the other shot areas S.

In the present embodiment, the power supply device 22 supplies voltages of a predetermined value to at least the electrode members 3 that correspond to the shot areas S on the substrate P where an operation to form a pattern is underway, and sets the absolute value of the voltage value that is supplied to the electrode members 3 that correspond to at least a portion of the shot areas S where no operation to form a pattern is currently underway to a smaller value than the absolute value of the predetermined value.

In the present embodiment, the power supply device 22 sets the absolute value of the voltage value that is supplied to the positive electrodes 31 and the negative electrodes 32 that correspond to the shot areas S on the substrate P where a pattern has not yet been formed and where an operation to form a pattern is currently underway to a larger value than the absolute value of the voltage value that is supplied to the positive electrodes 31 and the negative electrodes 32 that correspond to the shot areas S on the substrate P after a pattern has been formed. In the present embodiment, the voltage value that is supplied to the positive electrodes 31 and the negative electrodes 32 that correspond to the shot areas S on the substrate P after a pattern has been formed is set to 'OFF'. In order to set the voltage to 'OFF' in the present embodiment, the electrode members 3 are grounded by the switches 25, however, it is also possible to set the value of the voltage supplied from the power supply to 0. This also applies in the other embodiments.

In the present embodiment, the pattern formation operation includes an operation to irradiate exposure light EL onto the substrate P from the pattern on the mask M in order to form the pattern on the substrate P. Accordingly, when a pattern formation operation is referred to as being 'currently underway', this includes a state in which the substrate P is currently being irradiated with exposure light EL from the pattern on the mask M, namely, includes a state in which the substrate P is currently being exposed. Moreover, the term 'where a pattern has not yet been formed' includes a state prior to a pattern formation operation being executed, and includes a state prior to the substrate P being irradiated with exposure light EL from the pattern on the mask M, namely, a state prior to exposure of the substrate P being executed. Moreover, the term 'after a pattern has been formed' includes a state after a pattern formation operation has been executed, and includes a state after the exposure light EL has been irradiated from the pattern on the mask M, namely, a state after exposure has been executed.

In FIG. 8 through FIG. 11, of the plurality of shot areas S, the shot areas S where a pattern formation operation is currently underway and where a pattern formation operation has already been executed are shown by a solid line, while the shot areas S where a pattern has not yet been formed are shown by a broken line. Moreover, the electrode members 3 to which voltage is being supplied by the power supply device 22 are shown by oblique lines.

Figure 8:
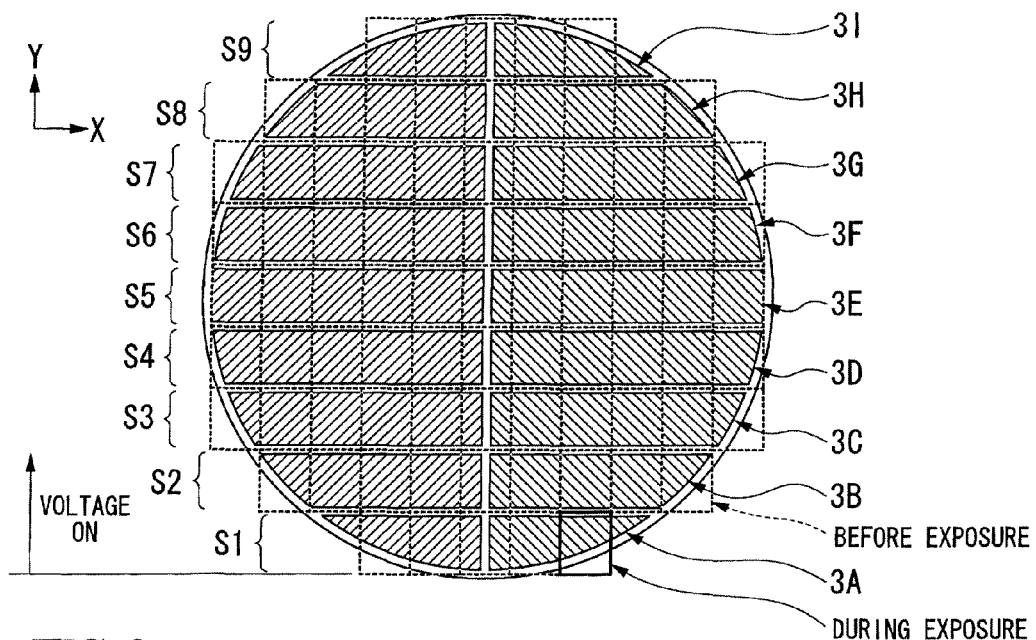
FIG. 8 is a view in order to illustrate an example of an operation of the exposure apparatus according to the first embodiment.

Firstly, as is shown in FIG. 8, of the plurality of shot areas S that are set on the substrate P, exposure of the shot areas S of the first shot area group S1 is executed. While the pattern formation operation for the shot areas S of the first shot area group S1 is currently underway, namely, while the shot areas S of the first shot area group S1 are being exposed, the power supply device 22 supplies voltage (i.e., sets the voltage to ON) of a predetermined value to all of the electrode members 3 (i.e., the positive electrodes 31 and the negative electrodes 32) of the first through ninth electrode patterns 3A to 3I. As a result, in a state in which the substrate P is being properly held by the holding member 20, exposure of the shot areas S of the first shot area group S1 is properly executed.

Figure 9:
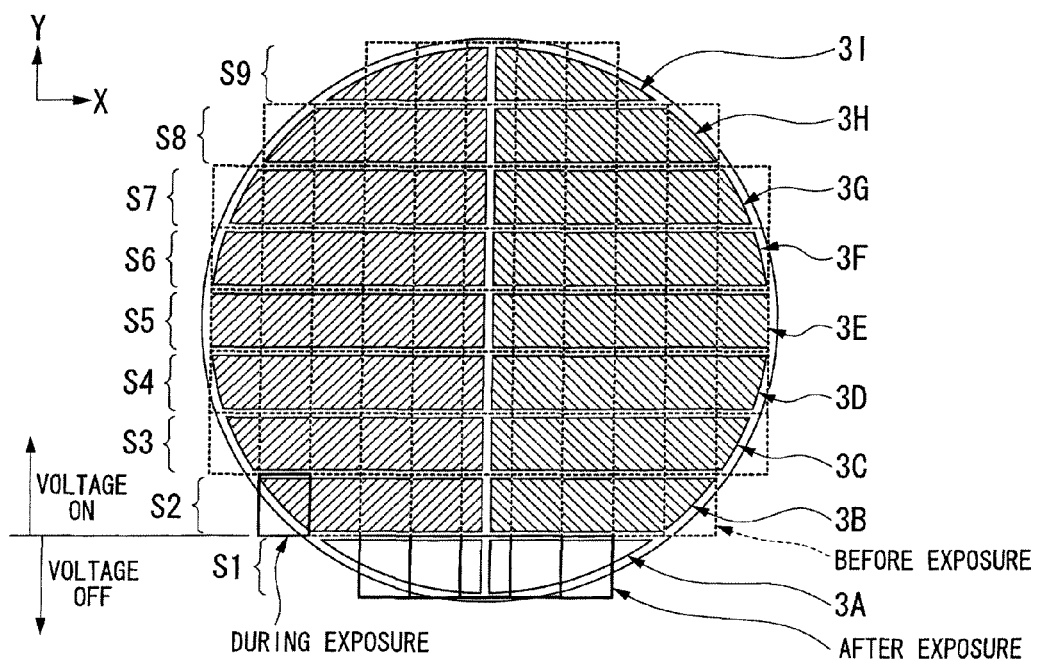
FIG. 9 is a view in order to illustrate an example of an operation of the exposure apparatus according to the first embodiment.

As is shown by the typical view in FIG. 9, when the pattern formation operation for each shot area S of the first shot area group S1 is ended, and a pattern formation operation for each shot area S of the second shot area group S2 commences, the power supply device 22 stops (i.e., sets to OFF) the supply of voltage to the electrode members 3 of the first electrode pattern 3A that corresponds to the shot areas S of the first shot area group S1 on the substrate P after the pattern has been formed. Namely, the power supply device 22 grounds the electrode members 3 of the first electrode pattern 3A that corresponds to the shot areas S of the first shot area group S1 on the substrate P after a pattern has already been formed thereon (i.e., after the exposure thereof) and where a pattern formation operation is not currently underway. The power supply device 22 electrically grounds the electrode members 3 of the first electrode pattern 3A using, for example, the switches 25. Moreover, in the present embodiment, the power supply device 22 maintains at a predetermined value the voltage value that is being supplied by the power supply device 22 to the second through ninth electrode patterns 3B through 3I that correspond to the shot areas S of the second through ninth shot area groups S2 through S9 on the substrate P where a pattern has not yet been formed, and also where a pattern formation operation is currently underway. As a result, the electrostatic force per unit area that is generated between the rear surface of the substrate P and the area of the portion of the holding surface 19 that corresponds to the first electrode pattern 3A can be made weaker than the electrostatic force per unit area that is generated between the rear surface of the substrate P and the areas of the portions of the holding surface 19 that correspond to the second through ninth electrode patterns 3B through 3I. In addition, because voltage of a predetermined value is supplied to the second through ninth electrode patterns 3B through 3I that correspond to the shot areas S on the substrate P where a pattern has not yet been formed and also where a pattern formation operation is currently underway, in a state in which the substrate P is being properly held by the holding member 20, exposure of the shot areas S of the second shot area group S2 is properly executed. Specifically, even if, for example, the temperature of the substrate P in those areas that correspond to the second through ninth electrode patterns rises because of the exposure, by securely holding the substrate P using the holding member 20, it is possible to prevent any shift in the position of the areas of the substrate that have not yet been exposed. Accordingly, because it is possible to expose all the shot areas based on alignments that were made prior to the exposure commencing, it is possible to prevent any exposure malfunctions.

In this manner, by supplying voltage of a predetermined value to the positive electrodes 31 and the negative electrodes 32 that correspond to the shot areas S on the substrate P where a pattern has not yet been formed and also where a pattern formation operation is currently underway, it is possible to generate a predetermined electrostatic force per unit area between the rear surface of the substrate P and the holding surface 19 that corresponds to these positive electrodes 31 and negative electrodes 32. Moreover, by supplying voltage of a value that is smaller (including 0) than the predetermined value to the positive electrodes 31 and the negative electrodes 32 that correspond to the shot areas S on the substrate P after a pattern has been formed thereon, it is possible to make the electrostatic force per unit area between the rear surface of the substrate P and the holding surface 19 that corresponds to these positive electrodes 31 and negative electrodes 32 weaker than the former predetermined electrostatic force per unit area.

Figure 10:
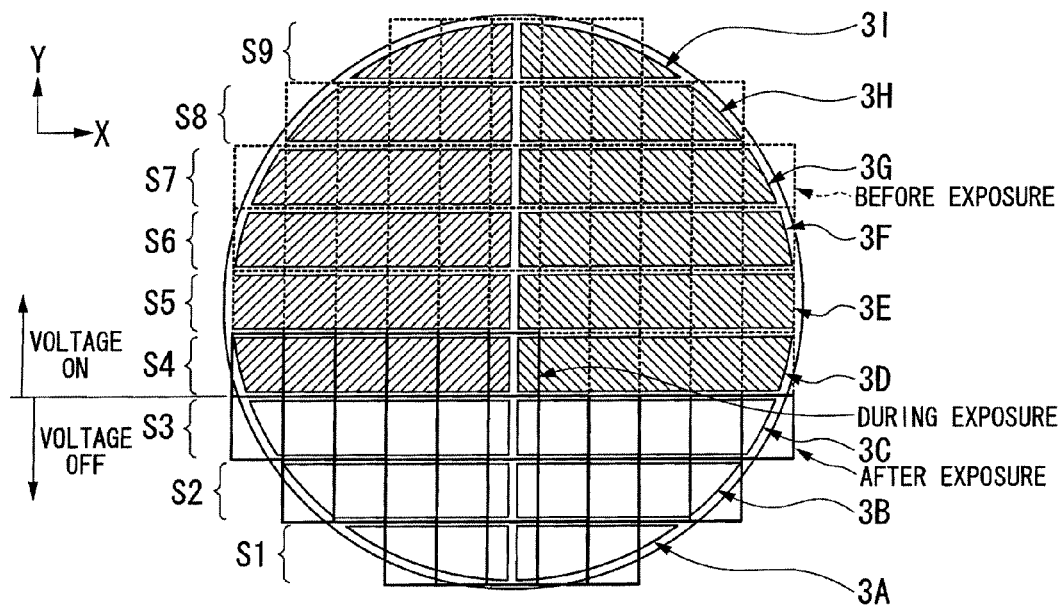
FIG. 10 is a view in order to illustrate an example of an operation of the exposure apparatus according to the first embodiment.

When the exposure of the plurality of shot areas S is underway and, as is shown in typical view in FIG. 10, the pattern formation operation for each shot area S of the first through third shot area groups S1 through S3 has ended, and the pattern formation operation for the shot areas S of the fourth shot area group S4 has commenced, the power supply device 22 stops the supply of voltage to the electrode members 3 of the first through third electrode patterns 3A through 3C that correspond to the shot areas S of the first through third shot area groups S1 through S3 on the substrate P after the pattern has been formed thereon. Namely, the power supply device 22 sets to OFF the value of the voltage that is supplied to the electrode members 3 of the first through third electrode patterns 3A through 3C that correspond to the shot areas S of the first through third shot area groups S1 through S3 on the substrate P after a pattern has already been formed thereon (i.e., after the exposure thereof) and where a pattern formation operation is not currently underway. Moreover, in the present embodiment, the power supply device 22 maintains at a predetermined value the voltage value that is being supplied by the power supply device 22 to the fourth through ninth electrode patterns 3B through 3I that correspond to the shot areas S of the fourth through ninth shot area groups S4 through S9 on the substrate P where a pattern has not yet been formed, and also where a pattern formation operation is currently underway. As a result, the electrostatic force per unit area that is generated between the rear surface of the substrate P and the areas of the portions of the holding surface 19 that correspond to the first through third electrode patterns electrode pattern 3A through 3C can be made weaker than the electrostatic force per unit area that is generated between the rear surface of the substrate P and the areas of the portions of the holding surface 19 that correspond to the fourth through ninth electrode patterns 3D through 3I. In addition, because voltage of a predetermined value is supplied to the fourth through ninth electrode patterns 3D through 3I that correspond to the shot areas S on the substrate P where a pattern has not yet been formed and also where a pattern formation operation is currently underway, in a state in which the substrate P is being properly held by the holding member 20, exposure of the shot areas S of the fourth shot area group S4 is properly executed.

Figure 11:
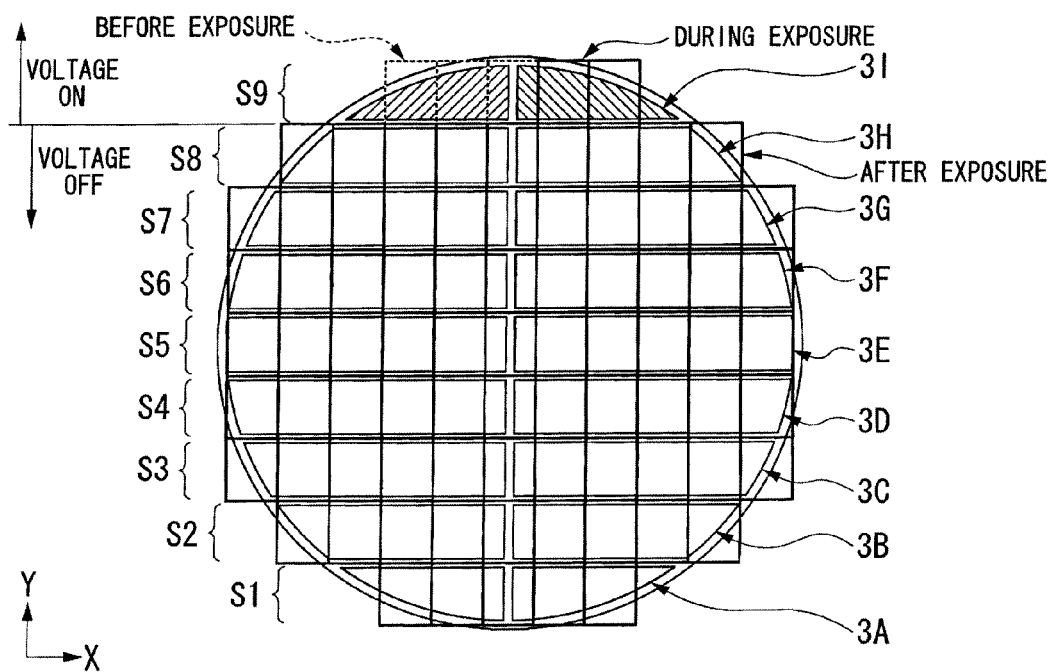
FIG. 11 is a view in order to illustrate an example of an operation of the exposure apparatus according to the first embodiment.

When the exposure of the plurality of shot areas S is underway and, as is shown in typical view in FIG. 11, the pattern formation operation for each shot area S of the first through eighth shot area groups S1 through S8 has ended, and the pattern formation operation for the shot areas S of the ninth shot area group S9 has commenced, the power supply device 22 stops the supply of voltage to the electrode members 3 of the first through eighth electrode patterns 3A through 3H that correspond to the shot areas S of the first through eighth shot area groups S1 through S8 on the substrate P after the pattern has been formed thereon. Namely, the power supply device 22 sets to OFF the value of the voltage that is supplied to the electrode members 3 of the first through eighth electrode patterns 3A through 3H that correspond to the shot areas S of the first through eighth shot area groups S1 through S8 on the substrate P after a pattern has already been formed thereon (i.e., after the exposure thereof) and where a pattern formation operation is not currently underway. Moreover, in the present embodiment, the power supply device 22 maintains at a predetermined value the voltage value that is being supplied by the power supply device 22 to the ninth electrode pattern 3I that corresponds to the shot areas S of the ninth shot area group S9 on the substrate P where a pattern has not yet been formed, and also where a pattern formation operation is currently underway. As a result, the electrostatic force per unit area that is generated between the rear surface of the substrate P and the areas of the portions of the holding surface 19 that correspond to the first through eighth electrode patterns electrode pattern 3A through 3H can be made weaker than the electrostatic force per unit area that is generated between the rear surface of the substrate P and the area of the portion of the holding surface 19 that corresponds to the ninth electrode pattern 3I. In addition, because voltage of a predetermined value is supplied to the ninth electrode pattern 3I that corresponds to the shot areas S on the substrate P where a pattern has not yet been formed and also where a pattern formation operation is currently underway, in a state in which the substrate P is being properly held by the holding member 20, exposure of the shot areas S of the ninth shot area group S9 is properly executed.

In this manner, in the present embodiment, the control unit 5 selects predetermined electrode members 3 from among the plurality of electrode members 3 in accordance with information relating to the pattern that is being formed on the substrate P, and supplies predetermined voltage to these selected electrode members 3.

After a pattern has been formed on all of the shot areas S on the substrate P, namely, after exposure of all of the shot areas S has ended, the power supply device 22 stops the supply of voltage to all of the plurality of electrode members 3. In addition, the control unit 5 starts operations to transport (i.e., unload) the exposed substrate P away from the holding member 20.

Figure 12B:
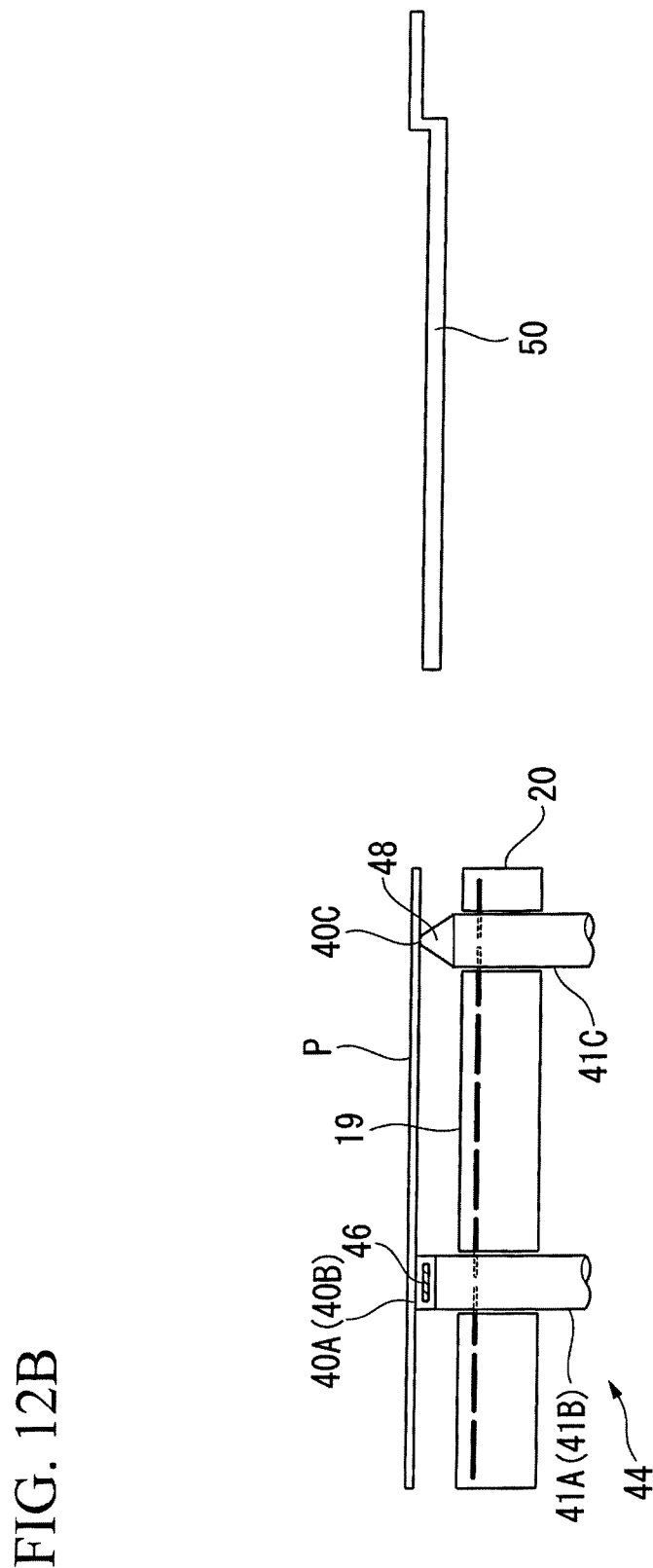
FIG. 12B is a view in order to illustrate an example of an operation of the exposure apparatus according to the first embodiment.

FIG. 12A is a view showing a state of the holding member 20 after a pattern has been formed on all of the shot areas S on the substrate P. In order to unload the substrate P from the holding member 20, the control unit 5 moves the supporting members 41A through 41C using the drive apparatuses 45 of the moving mechanism 44 such that the supporting surfaces 40A to 40C of the supporting members 41A to 41C is placed above (i.e., in the +Z direction) the holding surface 19 of the holding member 20. Namely, after a pattern has been formed on all of the shot areas S on the substrate P, the control unit 5 starts to move the substrate P relative to the holding member 20 using the moving mechanism 44 such that the rear surface of the substrate P and the holding surface 19 of the holding member 20 move away from each other. As a result, as is shown in FIG. 12B, the supporting surfaces 40A to 40C of the supporting members 41A to 41C are placed above (i.e., in the +Z direction) the holding surface 19, and the rear surface of the substrate P that is being supported by the supporting surfaces 40A to 40C of the supporting members 41A to 41C and the holding surface 19 of the holding member 20 move away from each other in the Z axial direction.

When the rear surface of the substrate P is supported by the supporting members 41A to 41C, and the rear surface of the substrate P and the holding surface 19 of the holding member 20 are to be separated from each other, the control unit 5 supplies predetermined voltages to the positive electrodes 46A and the negative electrodes 46B that are provided on the first and second supporting members 41A and 41B using the power supply device 22B in order to attract the substrate P by electrostatic force to the supporting surface 40A and 40B. Consequently, the rear surface of the substrate P is held by attracting by electrostatic force to the supporting surfaces 40A and 40B of the first and second supporting members 41A and 41B. When the supporting surfaces 40A and 40B and the substrate P are attracted together by electrostatic force, the control unit 5 moves the supporting members 41A through 41C upwards (i.e., in the +Z direction), and thereby separates the rear surface of the substrate P from the holding surface 19 of the holding member 20. As a result, it is possible to limit any shifting in the position of the substrate P or the like.

Moreover, in the present embodiment, the third supporting member 41C includes the grounded conductive member 48 and is in contact with the rear surface of the substrate P when the holding surface 19 of the holding member 20 separates from the rear surface of the substrate P. As a result of the third supporting member 41C that includes the conductive member 48 coming into contact with the substrate P, electricity (i.e., an electric charge) that is electrifying the substrate P can be removed. In this manner, when the holding member 20 is separated from the substrate P, the antistatic device 47 that includes the conductive member 48 of the third supporting member 41C is able to remove electrostatic charge on the substrate P using the third supporting member 41C (i.e., the conductive member 48).

Figure 12C:
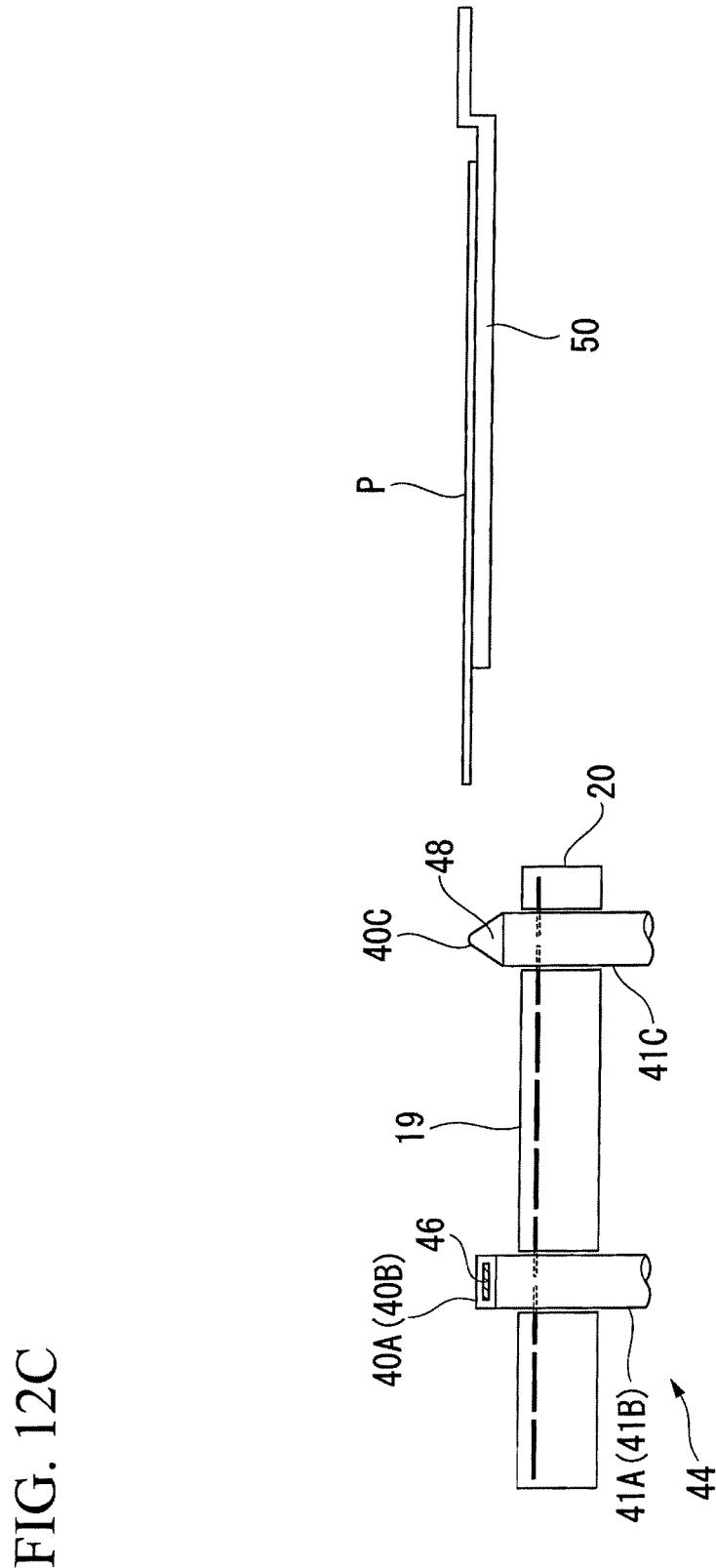
FIG. 12C is a view in order to illustrate an example of an operation of the exposure apparatus according to the first embodiment.

In addition, as is shown in FIG. 12C, the exposed substrate P is transported away (i.e., unloaded) from the holding member 20 of the substrate stage 2 by a predetermined transporting apparatus 50. When the substrate P that is being supported on the supporting members 41A to 41C is transferred to the transporting apparatus 50, the control unit 5 stops the supply of voltage to the electrode members 46 by the power supply device 22B. Consequently, the hold by the electrostatic chuck mechanisms of the first and second supporting members 41A and 41B is released, and the substrate P is smoothly transported away by the transporting apparatus 50. Moreover, when the surface areas of the supporting surfaces 40A and 40B are sufficiently small, and the supply of voltage to the electrode members 46 by the power supply device 22B has been stopped, even if residual electrostatic force (i.e., adhesive force) is generated, this residual electrostatic force is satisfactorily small. Accordingly, the rear surface of the substrate P can be smoothly separated from the supporting surfaces 40A and 40B.

In an electrostatic chuck mechanism, even when the supply of voltage to the electrode members 3 has been stopped, there is a possibility that, immediately after the supply of voltage to the electrode members 3 has been stopped, it will be difficult to smoothly separate the substrate P from the holding surface 19 due, for example, to residual electrostatic force. When the residual electrostatic force gradually reduces over time, in order to separate (i.e., in order to unload) the substrate P smoothly from the holding surface 19, within a range that still enables the hold of the substrate P to be smoothly maintained, it is desirable to stop the supply of voltage to the electrode members 3 at the earliest possible timing, and lengthen the period between the point when the supply of voltage to the electrode members 3 is stopped and the point when the operation to separate the holding surface 19 and the substrate P (i.e., the unloading operation) is executed.

In the present embodiment, because a plurality of electrode members 3 are provided in accordance with information relating to the pattern being formed on the substrate P, and the stopping of the voltage to the plurality of electrode members 3 is executed in a predetermined sequence in accordance with this pattern information, it is possible, for example, to sufficiently reduce the electrostatic force that is residual based on the electrode members 3 of the first electrode pattern 3A to which the supply of voltage is first stopped by the time the operation to separate the substrate P from the holding surface 19 is executed (i.e., until the substrate P is unloaded). In the same way, it is also possible to sufficiently reduce the electrostatic force that is residual based on the electrode members 3 of the second, third, . . . , and up to the eighth electrode patterns 3B, 3C, . . . , and 3H by the time the substrate P is unloaded from the holding surface 19. Moreover, if the electrostatic force that is residual based on the electrode members 3 of the ninth electrode pattern 3I is sufficiently reduced by the time the operation to unload the substrate P from the holding surface 19 is executed, then the unloading of the substrate P from the holding member 20 can be smoothly executed. Furthermore, even if the electrostatic force that is residual based on the electrode members 3 of the ninth electrode pattern 3I is not sufficiently reduced by the time the substrate P is unloaded from the holding surface 19, the area of the holding surface 19 that corresponds to the ninth electrode pattern 3I is small so that the size of the electrostatic force is sufficiently small within a range that allows the hold of the substrate P to be properly executed. Consequently, the unloading of the substrate P from the holding member 20 can be smoothly executed.

In the present embodiment, the values of the voltages that are supplied to each electrode member 3 are optimized in advance such that the hold of the substrate P can be properly executed in accordance with the weight of the substrate P, the coefficient of friction between the holding surface 19 of the holding member 20 and the rear surface of the substrate P, and the rate of acceleration when the substrate stage 2 is being moved, and the like. Because of this, when the shot areas S of the ninth shot area group S9 are being exposed, by supplying a predetermined voltage only to the positive electrodes 31I and the negative electrodes 32I of the ninth electrode pattern 3I, the hold of the substrate P can be suitably maintained by means of the electrostatic force that is generated based on this ninth electrode pattern 3I. Moreover, the unloading of the substrate P from the holding member 20 can be smoothly executed.

Figure 13:
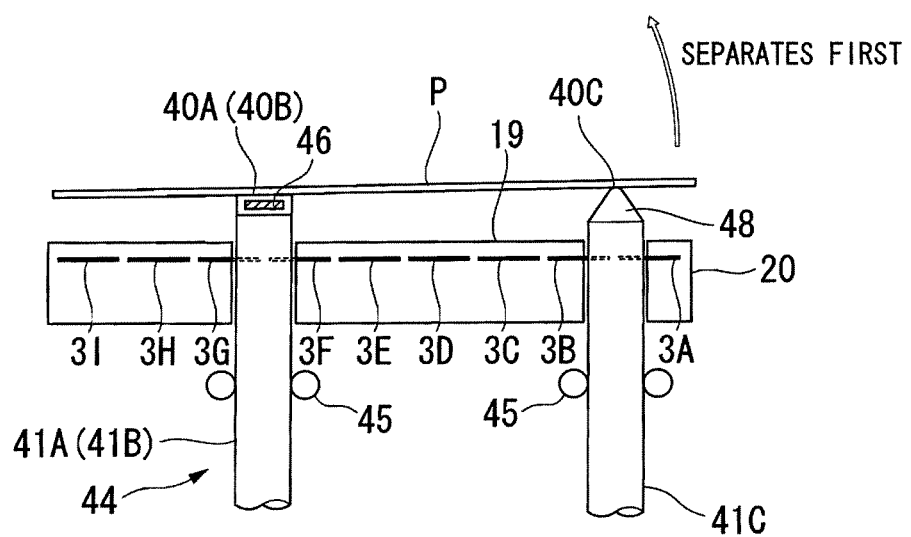
FIG. 13 is a view in order to illustrate an example of an operation of the exposure apparatus according to the first embodiment.

FIG. 13 is a typical view showing an example of an operation when the holding member 20 and the substrate P are separated by the moving mechanism 44 that includes the supporting members 41A to 41C. As is shown in FIG. 13, the moving mechanism 44 starts to move the substrate P relative to the holding member 20 such that a portion of the rear surface of the substrate P moves away from the holding surface 19 before other portions thereof. In the present embodiment, the third supporting member 41C which includes the conductive member 48 supports the portion of the rear surface of the substrate P that moves away first from the holding surface 19. In other words, the drive apparatuses 45 of the moving mechanism 44 are controlled such that, of the three supporting members 41A to 41C, the supporting surface 40C of the third supporting member 41C starts to move in the +Z direction from the holding surface 19 earlier than the supporting surfaces 40A and 40B of the other supporting members 41A and 41B.

As is described above, in the present embodiment, after voltages has been supplied to each of the electrode members 3 of the plurality of electrode patterns 3A to 3I so as to cause the substrate P to be attracted to the holding surface 19, the stopping of the supplying of the voltages to the plurality of electrode members 3 is executed in a predetermined sequence in accordance with the sequence in which the patterns are formed (i.e., the sequence in which the shot areas S are exposed). Namely, as was described with reference to FIG. 9 and the like, firstly, the supplying of voltage to the electrode members 3 of the first electrode pattern 3A is stopped, and thereafter the supplying of voltages to the electrode members 3 is stopped in the sequence of the second, the third, . . . , and up to the ninth electrode patterns 3B, 3C, . . . , 3I. The moving mechanism 44 starts the movement of the substrate P relative to the holding member 20 such that the portion of the rear surface of the substrate P that corresponds to the electrode members 3 of the first electrode pattern 3A to which the supplying of voltage was stopped first, namely, the portion adjacent to the edge of the substrate P on the −Y side moves away first from the holding surface 19 of the holding member 20.

In the present embodiment, of the plurality of supporting members 41A to 41C, the third supporting member 41C which includes the conductive member 48 is placed adjacent to the edge of the substrate P on the −Y side. The control unit 5 controls the drive apparatuses 45 of the moving mechanism 44 such that the supporting surface 40C of the third supporting member 41C starts to move in the +Z direction from the holding surface 19 earlier than the supporting surfaces 40A and 40B of the other supporting members 41A and 41B. As a result, the substrate P can be moved such that the portion in the vicinity of the edge on the −Y side of the substrate P that is supported by the supporting surface 40C of the third supporting member 41C moves away first from the holding surface 19 of the holding member 20.

By executing the operation to move the holding surface 19 and the rear surface of the substrate P away from each other such that the portion of the substrate P that corresponds to the first electrode pattern 3A to which the supply of voltage was stopped first moves away from the holding surface 19 before the other portions of the substrate P, the operation to move the holding surface 19 and the rear surface of the substrate P away from each other can be smoothly executed. After the supply of voltage to the electrode members 3 has been stopped, even if residual electrostatic force is still present, there is a strong possibility that the electrostatic force that is residual based on the electrode members 3 of the first electrode pattern 3A to which the supply of voltage was stopped first will be sufficiently reduced by the time the substrate P is unloaded from the holding surface 19. Because of this, by moving the substrate P such that the portion of the rear surface of the substrate P where there is a strong possibility that the residual electrostatic force will be sufficiently reduced moves away from the holding surface 19 before the other portions of the substrate P, it is possibly to smoothly separate the substrate P and the holding surface 19.

As has been described above, according to the present embodiment, because the electrode members 3 are arranged in accordance with information relating to the pattern that is to be formed on the substrate P, and because the power supply device 22 regulates the voltage that is supplied to the respective electrode members 3 in accordance with this information relating to the pattern that is to be formed on the substrate P, an operation to transport (i.e., unload) the substrate P away can be executed rapidly at the same time as the operation to hold the substrate P is being properly executed. Accordingly, in a state in which the substrate P is being properly held, the operation to form a pattern on the substrate P can be properly executed, and it is possible to manufacture a device which has a desired performance. Moreover, throughput can be improved and this can contribute to an improvement in device productivity.

Moreover, according to the present embodiment, because an electrostatic chuck mechanism which includes the electrode members 46 is provided in the supporting members 41A and 41B, the substrate P can be properly supported using these supporting members 41A and 41B. Accordingly, using these supporting members 41A and 41B, it is possible to prevent any shift in the position of the substrate P, and the operation to transport the substrate P onto the holding member 20 and the operation to transport the substrate P away from the holding member 20 can be properly executed. Accordingly, it is possible to prevent any deterioration in the device performance and contribute to an improvement in device productivity.

Moreover, according to the present embodiment, when the holding member and the substrate P are separated from each other, because electrostatic charge on the substrate P is removed by the third supporting member 41C of the antistatic device 47 (i.e., the conductive member 48), it is possible to prevent the occurrence of a phenomenon in which it becomes difficult to separate the holding member 20 and the substrate P because of residual electrostatic force. It is thus possible to prevent any large load from acting on the substrate P, and the holding member 20 and the substrate P can be smoothly separated from each other.

Note that, in the present embodiment, when, for example, voltage of a predetermined value is supplied to the electrode members 3 that correspond to the shot areas S of the first shot area group S1 where a pattern formation operation is currently underway, and when, once the pattern formation operation for the shot areas S of this first shot area group S1 has been completed, a pattern formation operation for the shot areas S for the subsequent second shot area group S2 is starting, the value of the voltage that is supplied to the electrode members 3 that correspond to the first shot area group S1 is set to OFF, however, the timing at which the value of the voltage that is supplied to the electrode members 3 that correspond to the first shot area group S1 is set to OFF can be set to any desired timing provided that it is after the operation to form a pattern on the shot areas S of the first shot area group S1 has been executed. For example, the value of the voltage that is supplied to the electrode members 3 that correspond to the first shot area group S1 can also be set to OFF after the operation to form a pattern on the shot areas S of the first shot area group S1 has been executed, and after an operation to form a pattern on the shot areas S of the subsequent second shot area group S2 has also been executed.

Note also that, in the present embodiment, voltage of a predetermined polarity is supplied to the electrode members 3 that correspond to the shot areas S where a pattern formation operation is currently underway, and, once the operation to form a pattern on these shot areas S has been executed, the value of the voltage that is supplied to the electrode members 3 that correspond to these shot areas S after this pattern formation operation has been executed is set to OFF, however, for example, it is also possible to apply a voltage of the reverse polarity for a predetermined time prior to setting this voltage value to OFF. For example, in FIG. 9, when the pattern formation operation for each shot area S of the first shot area group S1 has ended, and the pattern formation operation for the shot areas S of the second shot area group S2 is starting, the value of the voltage that is supplied, for example, to those electrode members 3 to which a positive potential had been supplied until that point (i.e., the positive electrodes 31A) can be changed to a negative potential for a predetermined time. By employing this method, it is possible to prevent the occurrence of residual electrostatic force (i.e., adhesive force). In the same way, the value of the voltage that is supplied to those electrode members 3 to which a negative potential had been supplied until that point (i.e., the negative electrodes 32A) can be changed to a positive potential for a predetermined time. After this, the voltage for the electrode members 3 can be set to OFF.

Moreover, in the present embodiment, all the voltage is set to OFF for electrodes that correspond to areas where exposure has finished, however, it is also possible to not set the voltage to OFF until all the exposure has ended for the electrodes that correspond to a portion of the shot areas, for example, the shot areas S7, S8, and S9, and set the voltage to OFF at the point when exposure of only the electrodes that correspond to the shot areas S1 to S6 has ended.

Second Embodiment

Next, a description will be given of a second embodiment. In the description given below, component elements that are identical or equivalent to those in the above described embodiment are given the same symbols and any description thereof is simplified or omitted.

In the above described first embodiment, the value of the voltage that is supplied to the electrode members 3 that correspond to the shot areas S after a pattern formation operation has been executed is set to OFF, however, the characteristic portion of the second embodiment lies in the fact that the voltage value is not set to OFF, but instead the absolute value of the supplied voltage value is minimized.

Figure 14:
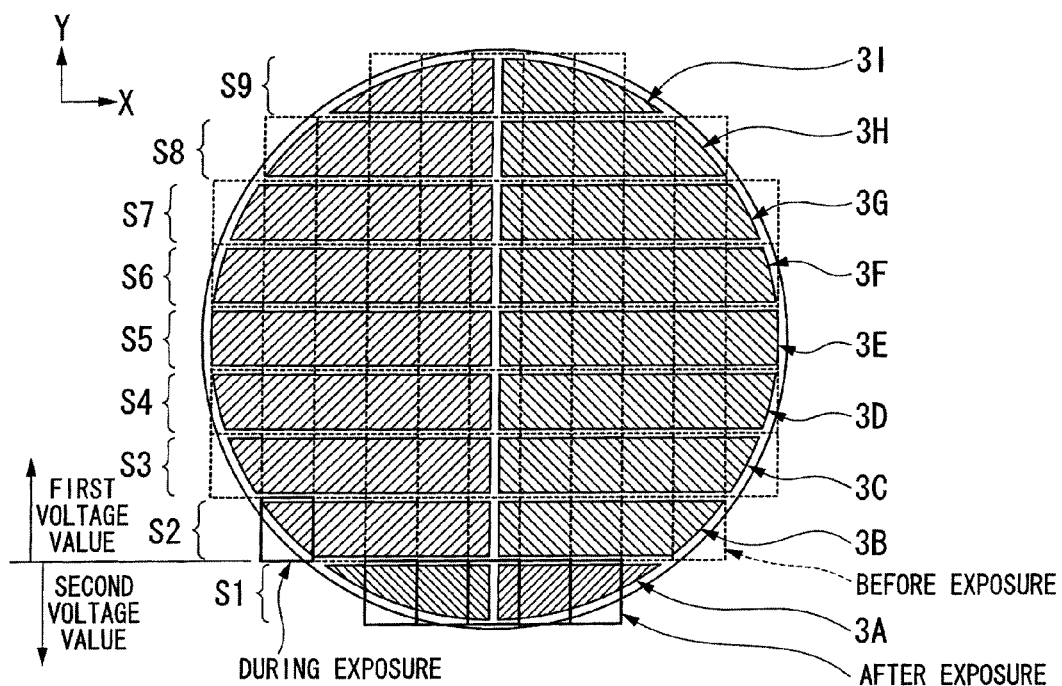
FIG. 14 is a view in order to illustrate an example of an operation of an exposure apparatus according to a second embodiment.
Figure 15:
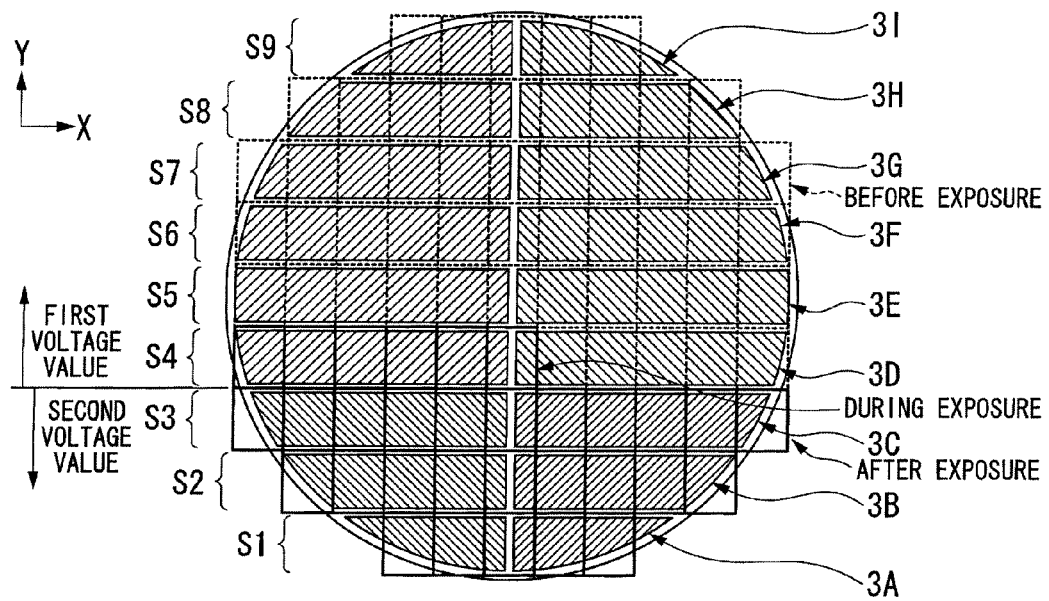
FIG. 15 is a view in order to illustrate an example of an operation of the exposure apparatus according to the second embodiment.
Figure 16:
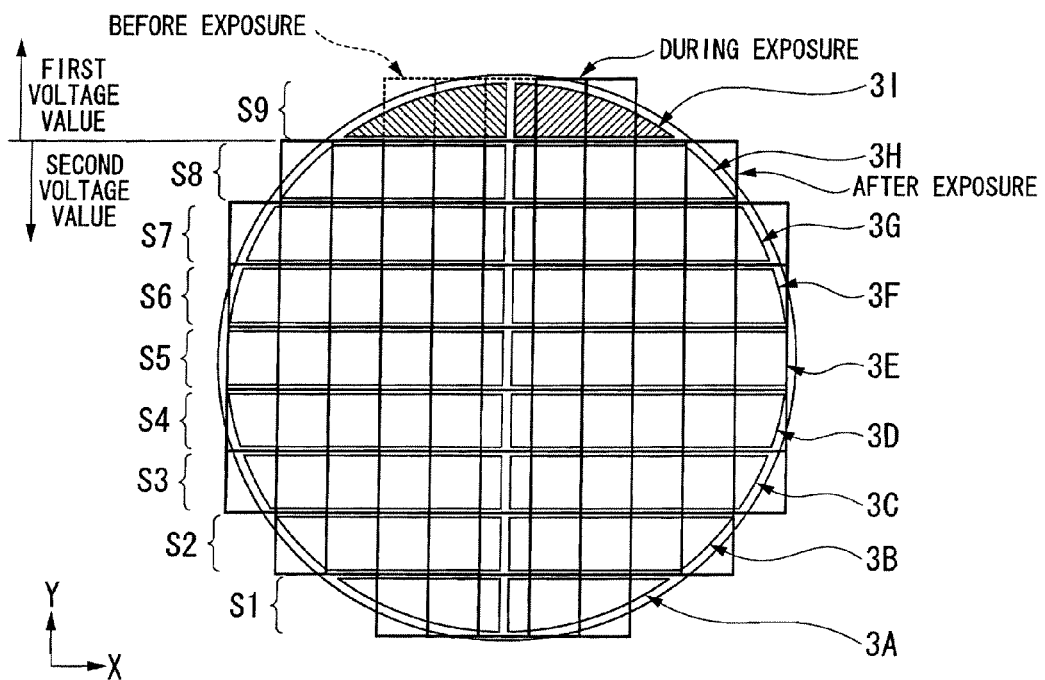
FIG. 16 is a view in order to illustrate an example of an operation of the exposure apparatus according to the second embodiment.

FIG. 14, FIG. 15, and FIG. 16 are typical views used to illustrate an example of an operation of the power supply device 22 according to the second embodiment. In the same way as in the above described first embodiment, in the second embodiment as well, patterns are formed sequentially on a plurality of shot areas S on a substrate P. In the present embodiment, the power supply device 22 sets the value of the voltage that is supplied to the electrode members 3 that correspond to the shot areas S on a substrate P where a pattern has not yet been formed or where a pattern formation operation is currently under way to a first voltage value, and sets the value of the voltage that is supplied to the electrode members 3 that correspond to the shot areas S where a pattern formation operation has already been executed and where no pattern formation operation is currently being performed to a second voltage value that is smaller than the first voltage value. Note that the first voltage value and second voltage value are absolute values.

For example, when a pattern formation operation is currently being performed on the shot areas S of the first shot area group S1, namely, when exposure of the shot areas S of the first shot area group S1 is being performed, the power supply device 22 supplies voltage of the first predetermined value to all of the electrode members 3 (i.e., the positive electrodes 31 and the negative electrodes 32) of the first through ninth electrode patterns 3A through 3I. As a result, the substrate P is attracted to the holding surface 19 by electrostatic force and is held thereon.

In addition, as is shown, for example, in typical view in FIG. 14, when the pattern formation operation for each shot area S of the first shot area group S1 has ended, and a pattern formation operation for the shot areas S of the second shot area group S2 is starting, the power supply device 22 sets the value of the voltage that is supplied to the electrode members 3 of the first electrode pattern 3A, which corresponds to the shot areas S of the first shot area group S1 on the substrate P where a pattern has already been formed, to the second voltage value which is smaller than the first voltage value. The power supply device 22 sets the value of the voltage that is supplied to the electrode members 3 of the first electrode pattern 3A to the second voltage value using, for example, the voltage regulator 26. Moreover, in the present embodiment, the power supply device 22 maintains the value of the voltage that is being supplied via the power supply device 22 to the second through ninth electrode patterns 3B through 3I, which correspond to the shot areas S of the second through ninth shot area groups S2 through S9 on the substrate P where a pattern has not yet been formed or where a pattern formation operation is currently underway, at the first voltage value.

When the exposure of the plurality of shot areas S is underway and, as is shown in typical view in FIG. 15, the pattern formation operation for each shot area S of the first through third shot area groups S1 through S3 has ended, and a pattern formation operation for the shot areas S of the fourth shot area group S4 is starting, the power supply device 22 sets the value of the voltage that is supplied to the electrode members 3 of the first through third electrode patterns 3A through 3C, which correspond to the shot areas S of the first through third shot area groups S1 through S3 on the substrate P where a pattern has already been formed, to the second voltage value which is smaller than the first voltage value. Moreover, in the present embodiment, the power supply device 22 maintains the value of the voltage that is being supplied via the power supply device 22 to the fourth through ninth electrode patterns 3B through 3I, which correspond to the shot areas S of the fourth through ninth shot area groups S4 through S9 on the substrate P where a pattern has not yet been formed or where a pattern formation operation is currently underway, at the first voltage value.

When the exposure of the plurality of shot areas S is underway and, as is shown in the typical view in FIG. 16, the pattern formation operation for each shot area S of the first through eighth shot area groups S1 through S8 has ended, and a pattern formation operation for the shot areas S of the ninth shot area group S9 is starting, the power supply device 22 sets the value of the voltage that is supplied to the electrode members 3 of the first through eighth electrode patterns 3A through 3H, which correspond to the shot areas S of the first through eighth shot area groups S1 through S8 on the substrate P where a pattern has already been formed, to the second voltage value which is smaller than the first voltage value. Moreover, in the present embodiment, the power supply device 22 maintains the value of the voltage that is being supplied via the power supply device 22 to the ninth electrode pattern 3I, which corresponds to the shot areas S of the ninth shot area group S9 on the substrate P where a pattern has not yet been formed or where a pattern formation operation is currently underway, at the first voltage value.

After a pattern has been formed on all of the shot areas S on the substrate P, namely, when exposure of all of the shot areas S has ended, the power supply device 22 stops the supply of voltage to all of the plurality of electrode members 3. The control unit 5 then begins an operation to transport (i.e., unload) the exposed substrate P away from the holding member 20.

In this manner, in the present embodiment, after voltage has been supplied to the plurality of electrode members 3 and the substrate P has been made to attract to the holding surface 19, the value of the voltage that is supplied to each of the plurality of electrodes 3 is gradually reduced in the sequence of the first, second, . . . , and up to the ninth electrode patterns 3A, 3B, . . . , 3I. When the holding surface 19 and the substrate P are to be separated using the moving mechanism 44 after a pattern has been formed on all of the shot areas S on the substrate P, the moving mechanism 44 starts moving the substrate P relative to the holding surface 19 such that the portion of the substrate P that corresponds to the electrode members 3 of the first electrode pattern 3A where the voltage value was reduced first moves away first from the holding surface 19.

As has been described above, in the present embodiment as well, because the power supply device 22 regulates the voltage that is supplied to the respective electrode members 3 in accordance with the information relating to the pattern that is to be formed on the substrate P, an operation to transport (i.e., unload) the substrate P away can be executed rapidly at the same time as the operation to hold the substrate P is being properly executed. Accordingly, in a state in which the substrate P is being properly held, the operation to form a pattern on the substrate P can be properly executed, and it is possible to manufacture a device which has a desired performance. Moreover, throughput can be improved and this can contribute to an improvement in device productivity.

Third Embodiment

Next, a description will be given of a third embodiment. In the description given below, component elements that are identical or equivalent to those in the above described embodiments are given the same symbols and any description thereof is simplified or omitted.

In the present embodiment, voltage of a predetermined value (i.e., the first voltage value) is supplied to the electrode members 3 that correspond to the shot area groups on a substrate P where a pattern has not yet been formed or where a pattern formation operation is currently under way, and the value of the voltage that is supplied to the electrode members 3 that correspond to the shot area groups on the substrate P where a pattern has already been formed is set to a value that is smaller (i.e., 0 or the second voltage value) than the predetermined value (i.e., the first voltage value). The characteristic portion of the third embodiment lies in the fact that voltage of a predetermined value is supplied to the electrode members 3 that correspond to the shot area groups on a substrate P where a pattern formation operation is currently underway, while the value of the voltage that is supplied to the other shot area groups, namely, those shot area groups where a pattern has not yet been formed or where a pattern has already been formed is set to a value that is smaller than the predetermined value.

Figure 17:
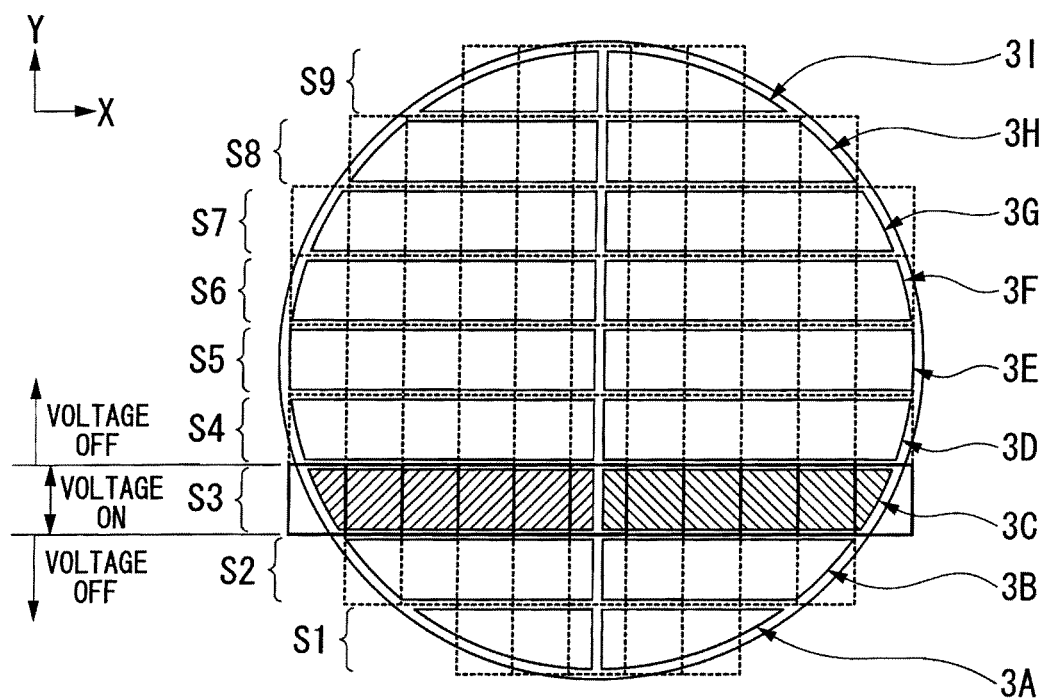
FIG. 17 is a view in order to illustrate an example of an operation of an exposure apparatus according to a third embodiment.
Figure 18:
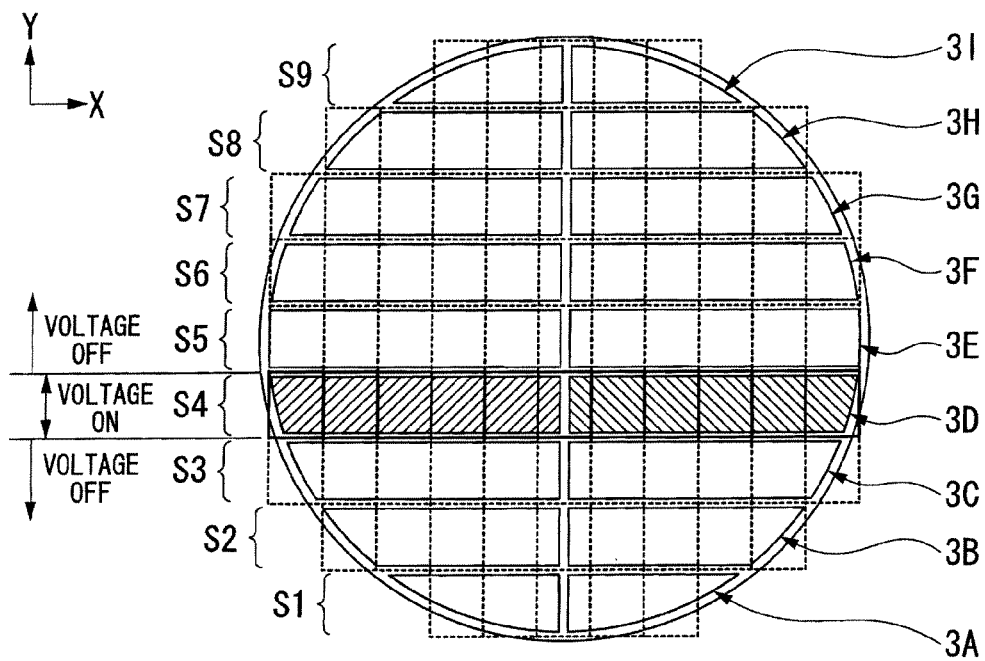
FIG. 18 is a view in order to illustrate an example of an operation of the exposure apparatus according to the third embodiment.
Figure 19:
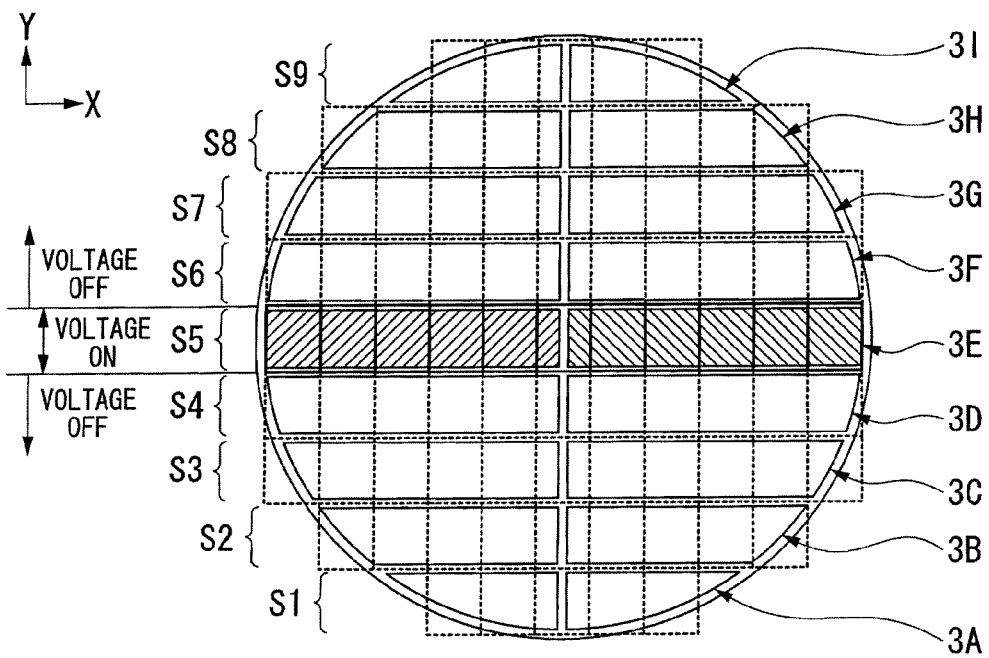
FIG. 19 is a view in order to illustrate an example of an operation of the exposure apparatus according to the third embodiment.

FIG. 17, FIG. 18, and FIG. 19 are typical views used to illustrate an example of an operation of the power supply device 22 according to the third embodiment. In the same way as in the above described embodiments, in the third embodiment as well, patterns are formed sequentially on a plurality of shot areas S on a substrate P.

As is shown, for example, in typical view in FIG. 17, when a pattern formation operation for the shot areas S of the third shot area group S3 is started, the power supply device 22 supplies voltage of a predetermined value to (i.e., sets to ON) the electrode members 3 of the third electrode pattern 3C which corresponds to the shot areas S of the third shot area group S3 on the substrate P where a pattern formation operation is currently under way, and sets to OFF the value of the voltage that is supplied to the electrode members 3 of the first and second electrode patterns 3A and 3B which correspond to the shot areas S of the first and second shot area groups S1 and S2 on the substrate P where a pattern has already been formed, and also sets to OFF the value of the voltage that is supplied to the electrode members 3 of the fourth through ninth electrode patterns 3D through 3I which correspond to the shot areas S of the fourth through ninth shot area groups S4 through S9 on the substrate P where a pattern has not yet been formed.

As is shown in typical view in FIG. 18, when the pattern formation operation for each shot area S of the first through third shot area groups S1 through S3 has ended, and a pattern formation operation for the shot areas S of the fourth shot area group S4 is starting, the power supply device 22 supplies voltage of a predetermined value to (i.e., sets to ON) the electrode members 3 of the fourth electrode pattern 3D which corresponds to the shot areas S of the fourth shot area group S4 on the substrate P where a pattern formation operation is currently under way, and sets to OFF the value of the voltage that is supplied to the electrode members 3 of the first through third electrode patterns 3A through 3C which correspond to the shot areas S of the first through third shot area groups S1 through S3 on the substrate P where a pattern has already been formed, and also sets to OFF the value of the voltage that is supplied to the electrode members 3 of the fifth through ninth electrode patterns 3E through 3I which correspond to the shot areas S of the fifth through ninth shot area groups S5 through S9 on the substrate P where a pattern has not yet been formed.

As is shown in typical view in FIG. 19, when the pattern formation operation for each shot area S of the first through fourth shot area groups S1 through S4 has ended, and a pattern formation operation for the shot areas S of the fifth shot area group S5 is starting, the power supply device 22 supplies voltage of a predetermined value to (i.e., sets to ON) the electrode members 3 of the fifth electrode pattern 3E which corresponds to the shot areas S of the fifth shot area group S5 on the substrate P where a pattern formation operation is currently underway, and sets to OFF the value of the voltage that is supplied to the electrode members 3 of the first through fourth electrode patterns 3A through 3D which correspond to the shot areas S of the first through fourth shot area groups S1 through S43 on the substrate P where a pattern has already been formed, and also sets to OFF the value of the voltage that is supplied to the electrode members 3 of the sixth through ninth electrode patterns 3F through 3I which correspond to the shot areas S of the sixth through ninth shot area groups S6 through S9 on the substrate P where a pattern has not yet been formed.

Thereafter, in the same manner, pattern formation operations are executed for each shot area S with voltage of a predetermined value being supplied only to the electrode members of the electrode patterns which correspond to the shot area groups where a pattern formation operation is currently underway, and with the value of the voltage that is supplied to the electrode members 3 of electrode patterns which correspond to the other shot area groups being set to OFF.

After a pattern has been formed on all of the shot areas S of the substrate P, namely, when exposure of all of the shot areas S has ended, the power supply device 22 stops the supply of voltage to all of the plurality of electrode members 3. The control unit 5 then begins an operation to transport (i.e., unload) the exposed substrate P away from the holding member 20.

In the present embodiment as well, because the power supply device 22 regulates the voltage that is supplied to the respective electrode members 3 in accordance with the information relating to the pattern that is to be formed on the substrate P, an operation to transport (i.e., unload) the substrate P away can be executed rapidly at the same time as the operation to hold the substrate P is being properly executed. Accordingly, in a state in which the substrate P is being properly held, the operation to form a pattern on the substrate P can be properly executed, and it is possible to manufacture a device which has a desired performance. Moreover, throughput can be improved and this can contribute to an improvement in device productivity.

Fourth Embodiment

Next, a description will be given of a fourth embodiment. In the description given below, component elements that are identical or equivalent to those in the above described embodiments are given the same symbols and any description thereof is simplified or omitted.

Figure 20:
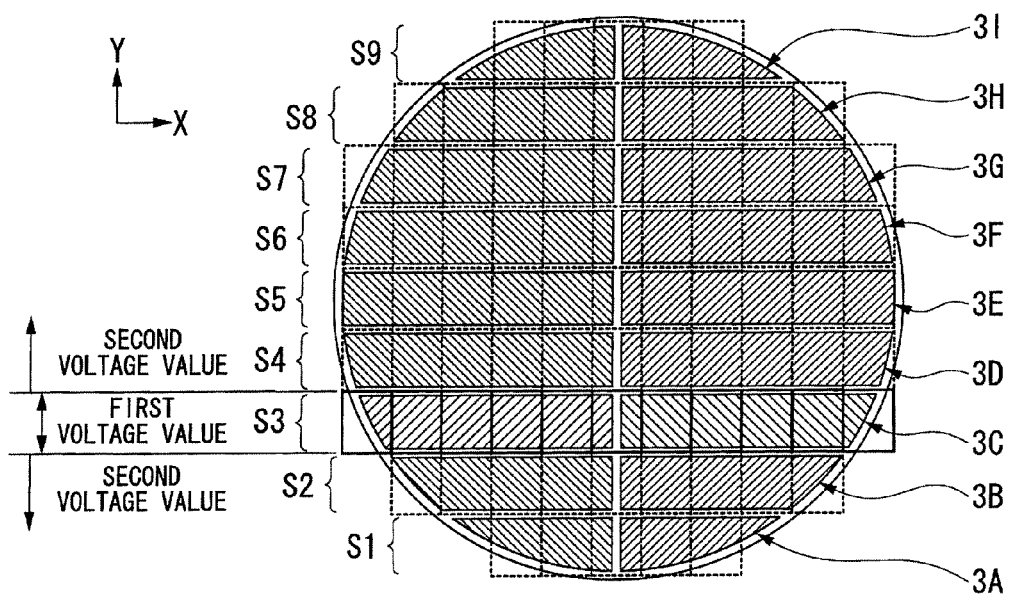
FIG. 20 is a view in order to illustrate an example of an operation of an exposure apparatus according to a fourth embodiment.
Figure 21:
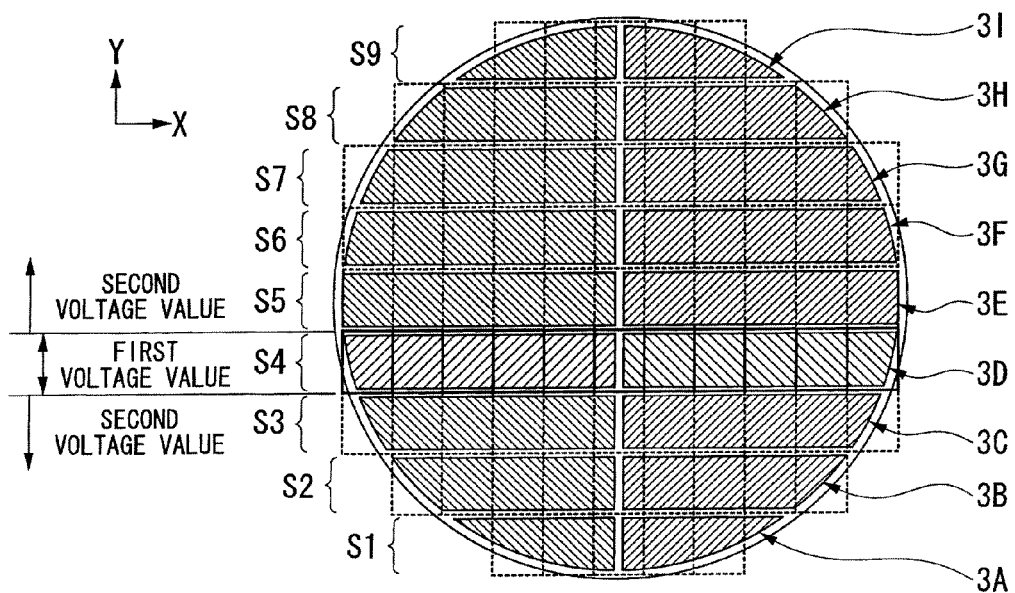
FIG. 21 is a view in order to illustrate an example of an operation of the exposure apparatus according to the fourth embodiment.
Figure 22:
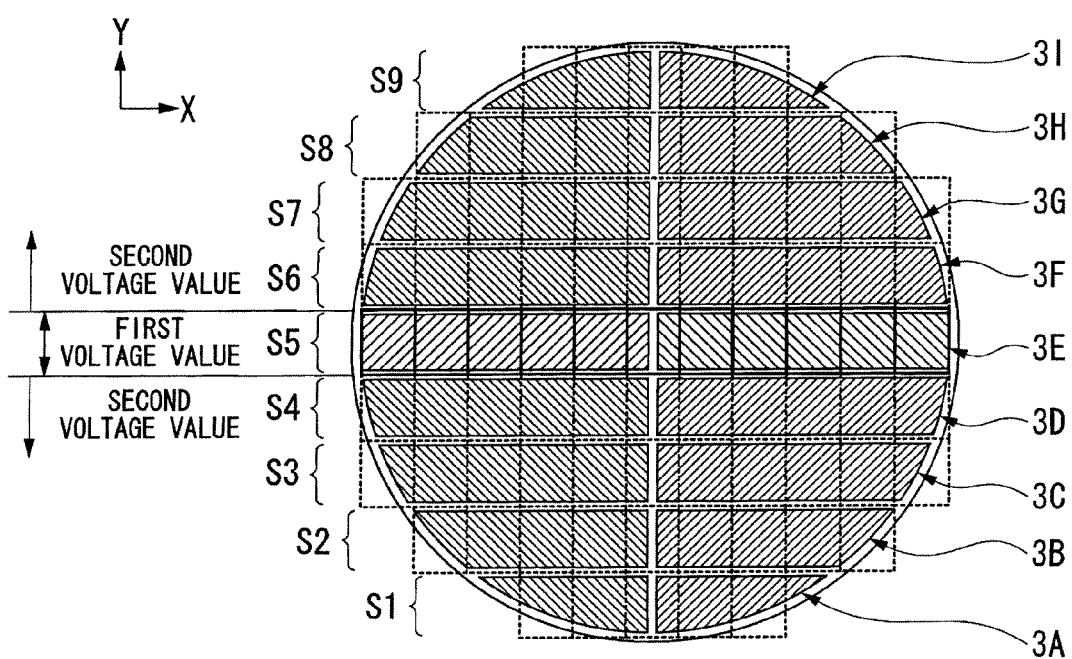
FIG. 22 is a view in order to illustrate an example of an operation of the exposure apparatus according to the fourth embodiment.

FIG. 20, FIG. 21, and FIG. 22 are typical views used to illustrate an example of an operation of the power supply device 22 according to the fourth embodiment. In the same way as in the above described embodiments, in the fourth embodiment as well, patterns are formed sequentially on a plurality of shot areas S on a substrate P.

For example, when a pattern formation operation has begun for the shot areas S of the third shot area group S3, the power supply device 22 sets the value of the voltage that is supplied to the electrode members 3 of the third electrode pattern 3C, which corresponds to the shot areas S of the third shot area group S3 on the substrate P where a pattern formation operation is currently underway, to a first voltage value, and sets both the value of the voltage that is supplied to the electrode members 3 of the first and second electrode patterns 3A and 3B, which correspond to the shot areas S of the first and second shot area groups S1 and S2 on the substrate P where a pattern has already been formed, and the value of the voltage that is supplied to the electrode members 3 of the fourth through ninth electrode patterns 3D through 3I, which correspond to the shot areas S of the fourth through ninth shot area groups S4 through S9 on the substrate P where a pattern has not yet been formed, to a second voltage value that is smaller than the first voltage value.

As is shown in typical view in FIG. 21, when the pattern formation operation for each shot area S of the first through third shot area groups S1 through S3 has ended, and a pattern formation operation for the shot areas S of the fourth shot area group S4 is starting, the power supply device 22 sets the value of the voltage that is supplied to the electrode members 3 of the fourth electrode pattern 3D, which correspond to the shot areas S of the fourth shot area group S4 on the substrate P where a pattern formation operation is currently underway, to the first voltage value, and sets both the value of the voltage that is supplied to the electrode members 3 of the first through third electrode patterns 3A through 3C, which correspond to the shot areas S of the first through third shot area groups S1 through S3 on the substrate P where a pattern has already been formed, and the value of the voltage that is supplied to the electrode members 3 of the fifth through ninth electrode patterns 3E through 3I, which correspond to the shot areas S of the fifth through ninth shot area groups S5 through S9 on the substrate P where a pattern has not yet been formed to the second voltage value which is smaller than the first voltage value.

As is shown in typical view in FIG. 22, when the pattern formation operation for each shot area S of the first through fourth shot area groups S1 through S4 has ended, and a pattern formation operation for the shot areas S of the fifth shot area group S5 is starting, the power supply device 22 sets the value of the voltage that is supplied to the electrode members 3 of the fifth electrode pattern 3E, which correspond to the shot areas S of the fifth shot area group S5 on the substrate P where a pattern formation operation is currently underway, to the first voltage value, and sets both the value of the voltage that is supplied to the electrode members 3 of the first through fourth electrode patterns 3A through 3D, which correspond to the shot areas S of the first through fourth shot area groups S1 through S4 on the substrate P where a pattern has already been formed, and the value of the voltage that is supplied to the electrode members 3 of the sixth through ninth electrode patterns 3F through 3I, which correspond to the shot areas S of the sixth through ninth shot area groups S6 through S9 on the substrate P where a pattern has not yet been formed to the second voltage value which is smaller than the first voltage value.

Thereafter, in the same manner, pattern formation operations are executed for each shot area S with the value of the voltage that is supplied to the electrode members of the electrode patterns which correspond to the shot area groups where a pattern formation operation is currently underway set to the first voltage value, and with the value of the voltage that is supplied to the electrode members 3 of electrode patterns which correspond to the other shot area groups being set to the second voltage value.

After a pattern has been formed on all of the shot areas S of the substrate P, namely, when exposure of all of the shot areas S has ended, the power supply device 22 stops the supply of voltage to all of the plurality of electrode members 3. The control unit 5 then begins an operation to transport (i.e., unload) the exposed substrate P away from the holding member 20.

In the present embodiment as well, because the power supply device 22 regulates the voltage that is supplied to the respective electrode members 3 in accordance with the information relating to the pattern that is to be formed on the substrate P, an operation to transport (i.e., unload) the substrate P away can be executed rapidly at the same time as the operation to hold the substrate P is being properly executed. Accordingly, in a state in which the substrate P is being properly held, the operation to form a pattern on the substrate P can be properly executed, and it is possible to manufacture a device which has a desired performance. Moreover, throughput can be improved and this can contribute to an improvement in device productivity.

Fifth Embodiment

Next, a description will be given of a fifth embodiment. In the description given below, component elements that are identical or equivalent to those in the above described embodiments are given the same symbols and any description thereof is simplified or omitted.

Figure 23:
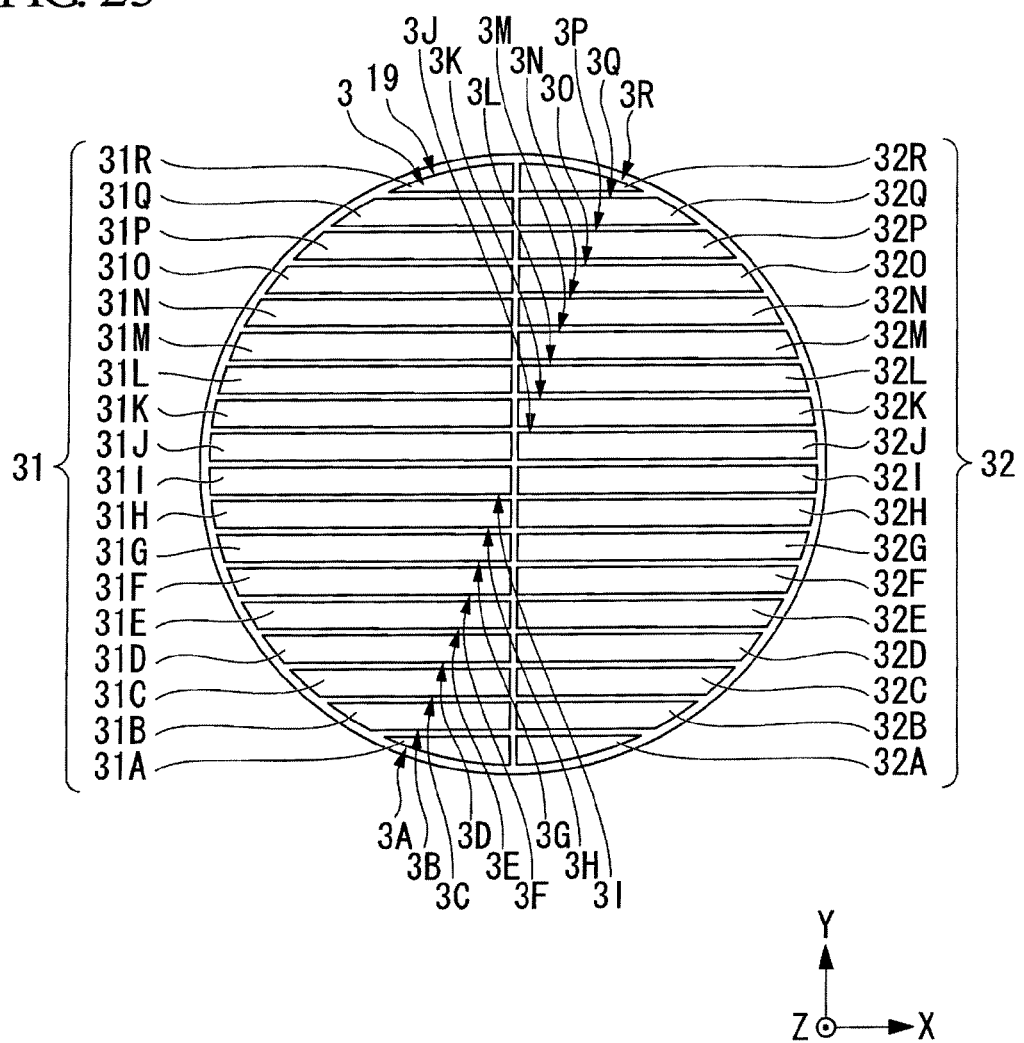
FIG. 23 is a plan view showing a portion of a substrate stage according to a fifth embodiment 1.

FIG. 23 is a view showing a holding member 20B according to the fifth embodiment. In the present embodiment, 18 positive electrodes 31 (31A to 31R) and 18 negative electrodes 32 (32A to 32R), which correspond respectively to the 18 positive electrodes 31 (31A to 31R), are provided on a holding member 20B. The first, second, . . . , up to the eighteenth positive electrodes 31A, 31B, . . . , 31R correspond respectively to the first, second, . . . , up to the eighteenth negative electrodes 32A, 32B, . . . , 32R. Note that, in FIG. 23, the supporting members 41A, 41B, and 41C are omitted from the drawings.

A first, second, . . . , up to an eighteenth electrode pattern 3A, 3B, . . . , 3R are formed by each of the first, second, . . . , up to the eighteenth positive electrodes 31A, 31B, . . . , 31R and the first, second, . . . , up to the eighteenth negative electrodes 32A, 32B, . . . , 32R.

Figure 24:
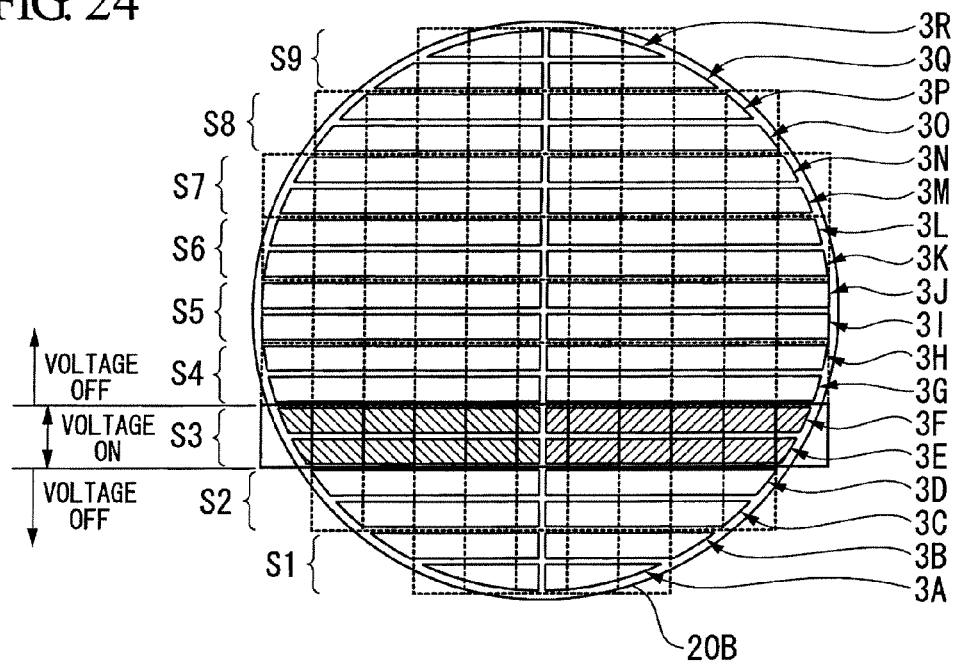
FIG. 24 is a view in order to illustrate an example of an operation of the exposure apparatus according to the fifth embodiment.

FIG. 24 is a view showing a relationship between the electrode members 3 according to the present embodiment and the shot areas S that are set on the substrate P. In the same way as in the above described embodiments, a first, second, . . . , up to a ninth shot area group S1, S2, . . . , S9 are set on the substrate P.

As is shown in FIG. 24, each of the plurality of electrode members 3 has a size and shape that corresponds to the pattern information, and is positioned on the holding member 20 in accordance with the pattern information. As is described above, the pattern information includes at least one of information relating to the shot areas S on the substrate P and, consequently, information relating to the chips that are to be formed on the substrate P.

As is shown in FIG. 24, the plurality of electrode members 3 are arranged in accordance with information relating to the shot areas S that are set on the substrate P. In the present embodiment, the size in the Y axial direction of the respective electrode members 3 is set so as to substantially match half the size in the Y axial direction of the shot areas S. Namely, the size in the Y axial direction of one shot area S is set so as to substantially match the size in the Y axial direction of two electrode members 3. Moreover, the size in the X axial direction of each of the first through eighteenth electrode patterns 3A through 3R that are formed by the electrode members 3 is set so as to correspond to the size in the X axial direction of each of the first through ninth shot area groups S1 through S9 that are formed by the shot areas S.

Namely, the respective electrode members 3 are arranged so as to correspond to the plurality of shot areas S. In the present embodiment, the first and second electrode patterns 3A and 3B are arranged so as to correspond to the first shot area group S1, and the third and fourth electrode patterns 3C and 3D are arranged so as to correspond to the second shot area group S2. In the same way, the fifth and sixth electrode patterns 3E and 3F are arranged so as to correspond to the third shot area group S3, the seventh and eighth electrode patterns 3G and 3H are arranged so as to correspond to the fourth shot area group S4, the ninth and tenth electrode patterns 3I and 3J are arranged so as to correspond to the fifth shot area group S5, the eleventh and twelfth electrode patterns 3K and 3L are arranged so as to correspond to the sixth shot area group S6, the thirteenth and fourteenth electrode patterns 3M and 3N are arranged so as to correspond to the seventh shot area group S7, the fifteenth and sixteenth electrode patterns 3O and 3P are arranged so as to correspond to the eighth shot area group S8, and the seventeenth and eighteenth electrode patterns 3Q and 3R are arranged so as to correspond to the ninth shot area group S9.

Next, an example of an operation of the holding member 20B according to the present embodiment will be described. At a predetermined timing prior to the commencement of the exposure of the substrate P, exposure conditions which include pattern information (i.e., pattern formation conditions) are input by means of the input device 7. The voltage that is supplied to each electrode member 3 is regulated by the power supply device 22 in accordance with the pattern information that has been input by means of the input device 7. Note that the exposure conditions including the pattern information (i.e., the pattern formation conditions) may be stored in advance in the storage device 8, and the voltage that is supplied to each electrode member 3 may be regulated by the power supply device 22 in accordance with pattern information that is stored in this storage device 8.

In the present embodiment, a description is given of an example in which the control unit 5 firstly exposes the shot areas S of the first shot area group S1, and then sequentially exposes the shot areas S of the second, third, . . . , up to the eighth shot area groups S2, S3, . . . , S8, and then finally exposes the shot areas S of the ninth shot area group S9.

After a substrate P has been placed on the holding surface 19 of the holding member 20 that is provided with the electrode members 3, in order to attract the substrate P to the holding surface 19 by electrostatic force, the control unit 5 supplies a predetermined voltage to the electrode members 3 using the power supply device 22. In the present embodiment, the power supply device 22 supplies voltage of a predetermined value to the electrode members 3 that correspond to shot area groups on the substrate P where a pattern formation operation is currently underway, and sets the value of the voltage that is supplied to electrode members that correspond to the other shot area groups to OFF.

For example, as is shown in typical view in FIG. 24, when a pattern formation operation is started for the shot areas S of the third shot area group S3, the power supply device 22 supplies voltage of a predetermined value to (i.e., sets to ON) the electrode members 3 of the fifth and sixth electrode patterns 3E and 3F which correspond to the shot areas S of the third shot area group S3 on the substrate P where a pattern formation operation is currently underway, and sets to OFF both the value of the voltage that is supplied to the electrode members 3 of the first through fourth electrode patterns 3A through 3D which correspond to the shot areas S of the first and second shot area groups S1 and S2 on the substrate P where a pattern has already been formed, and the value of the voltage that is supplied to the electrode members 3 of the seventh through 18th electrode patterns 3G through 3R which correspond to the shot areas S of the fourth through ninth shot area groups S4 through S9 on the substrate P where a pattern has not yet been formed.

Figure 25:
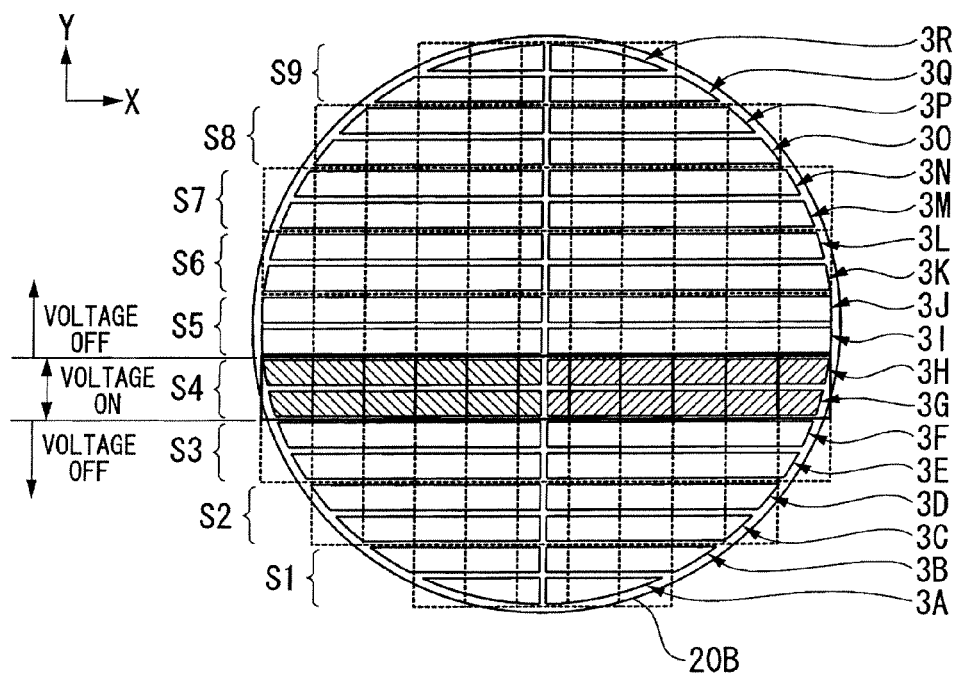
FIG. 25 is a view in order to illustrate an example of an operation of an exposure apparatus according to the fifth embodiment.

As is shown in typical view in FIG. 25, when the pattern formation operation for each shot area S of the first through third shot area groups S1 through S3 has ended, and a pattern formation operation for the shot areas S of the fourth shot area group S4 is starting, the power supply device 22 supplies voltage of a predetermined value to (i.e., sets to ON) the electrode members 3 of the seventh and eighth electrode patterns 3G and 3H which correspond to the shot areas S of the fourth shot area group S4 on the substrate P where a pattern formation operation is currently underway, and sets to OFF both the value of the voltage that is supplied to the electrode members 3 of the first through sixth electrode patterns 3A through 3F which correspond to the shot areas S of the first through third shot area groups S1 through S3 on the substrate P where a pattern has already been formed, and the value of the voltage that is supplied to the electrode members 3 of the ninth through eighteenth electrode patterns 3I through 3R which correspond to the shot areas S of the fifth through ninth shot area groups S5 through S9 on the substrate P where a pattern has not yet been formed.

Thereafter, in the same manner, pattern formation operations are executed for each shot area S with voltage of a predetermined value being supplied only to the electrode members of the electrode patterns which correspond to the shot area groups where a pattern formation operation is currently underway, and with the value of the voltage that is supplied to the electrode members 3 of electrode patterns which correspond to the other shot area groups being set to OFF.

After a pattern has been formed on all of the shot areas S of the substrate P, namely, when exposure of all of the shot areas S has ended, the power supply device 22 stops the supply of voltage to all of the plurality of electrode members 3. The control unit 5 then begins an operation to transport (i.e., unload) the exposed substrate P away from the holding member 20.

In the present embodiment as well, because the power supply device 22 regulates the voltage that is supplied to the respective electrode members 3 in accordance with the information relating to the pattern that is to be formed on the substrate P, an operation to transport away (i.e., unload) the substrate P can be executed rapidly at the same time as the operation to hold the substrate P is being properly executed. Accordingly, in a state in which the substrate P is being properly held, the operation to form a pattern on the substrate P can be properly executed, and it is possible to manufacture a device which has a desired performance. Moreover, throughput can be improved and this can contribute to an improvement in device productivity.

Sixth Embodiment

Next, a description will be given of a sixth embodiment. In the description given below, component elements that are identical or equivalent to those in the above described embodiments are given the same symbols and any description thereof is simplified or omitted.

Figure 26:
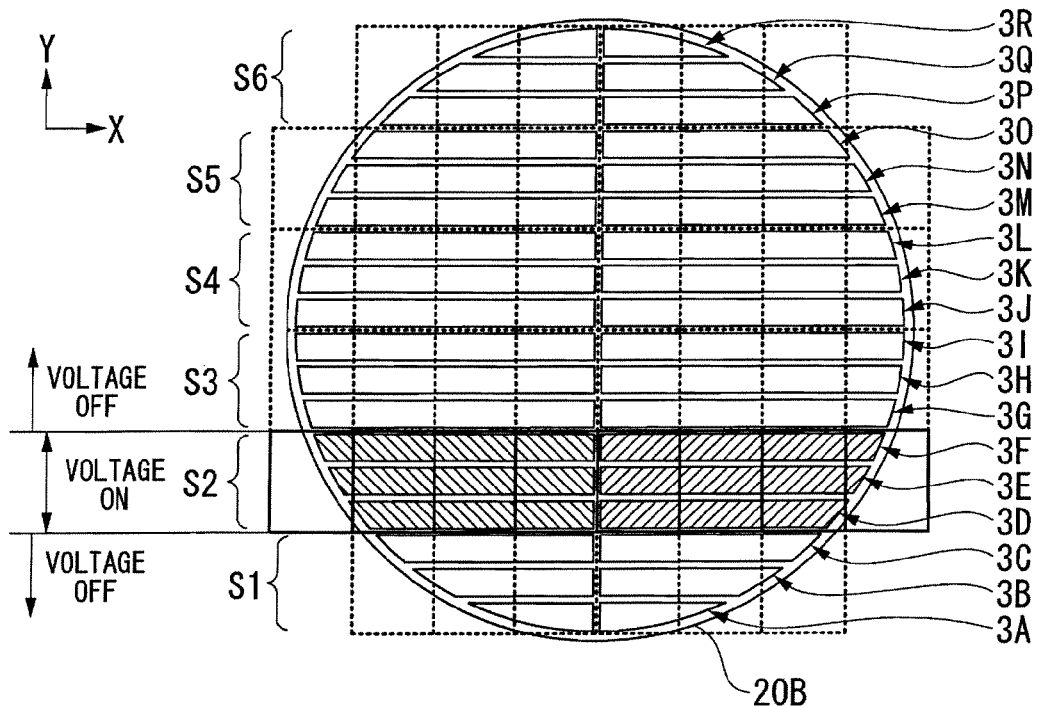
FIG. 26 is a view in order to illustrate an example of an operation of an exposure apparatus according to a sixth embodiment.

FIG. 26 is a view showing a relationship between the electrode members 3 according to the present embodiment and the shot areas S that are set on the substrate P. In the same way as in the above described fifth embodiment, the holding member 20B is provided with 18 positive electrodes 31 (31A to 31R) and 18 negative electrodes 32 (32A to 32R) which correspond respectively to the 18 positive electrodes 31 (31A to 31R). A first, second, . . . , up to an eighteenth electrode pattern 3A, 3B, . . . , 3R are formed by each of the first, second, . . . , up to the eighteenth positive electrodes 31A, 31B, . . . , 31R and the first, second, . . . , up to the eighteenth negative electrodes 32A, 32B, . . . , 32R.

In the present embodiment, a first, second, . . . , up to a sixth shot area group S1, S2, . . . , S6 are formed on the substrate P. As is shown in FIG. 26, the plurality of electrode members 3 are arranged in accordance with information relating to the shot areas S that are set on the substrate P. In the present embodiment, the size in the Y axial direction of the respective electrode members 3 is set so as to be substantially one third the size of the shot areas S in the Y axial direction. Namely, the size in the Y axial direction of one shot area S is set so as to substantially match the size in the Y axial direction of three electrode members 3. Moreover, the size in the X axial direction of each of the first through eighteenth electrode patterns 3A through 3R that are formed by the electrode members 3 is set so as to correspond to the size in the X axial direction of each of the first through sixth shot area groups S1 through S9 that are formed by the shot areas S.

Namely, in the present embodiment as well, the respective electrode members 3 are arranged so as to correspond to the plurality of shot areas S. In the present embodiment, the first through third electrode patterns 3A through 3C are arranged so as to correspond to the first shot area group S1, and the fourth through sixth electrode patterns 3D through 3F are arranged so as to correspond to the second shot area group S2. In the same way, the seventh through ninth electrode patterns 3G through 3I are arranged so as to correspond to the third shot area group S3, the tenth through eleventh electrode patterns 3J through 3L are arranged so as to correspond to the fourth shot area group S4, the thirteenth through fifteenth electrode patterns 3M through 3O are arranged so as to correspond to the fifth shot area group S5, and the sixteenth through eighteenth electrode patterns 3P through 3R are arranged so as to correspond to the sixth shot area group S6.

Next, an example of an operation of the holding member 20B according to the present embodiment will be described. At a predetermined timing prior to the commencement of the exposure of the substrate P, exposure conditions which include pattern information (i.e., pattern formation conditions) are input by means of the input device 7. The voltage that is supplied to each electrode member 3 is regulated by the power supply device 22 in accordance with the pattern information that has been input by means of the input device 7. Note that the exposure conditions including the pattern information (i.e., the pattern formation conditions) may be stored in advance in the storage device 8, and the voltage that is supplied to each electrode member 3 may be regulated by the power supply device 22 in accordance with pattern information that is stored in this storage device 8.

In the present embodiment, a description is given of an example in which the control unit 5 firstly exposes the shot areas S of the first shot area group S1, and then sequentially exposes the shot areas S of the second, third, . . . , up to the fifth shot area groups S2, S3, . . . , S5, and then finally exposes the shot area groups S of the sixth shot area group S6.

After a substrate P has been placed on the holding surface 19 of the holding member 20 that is provided with the electrode members 3, in order to attract the substrate P to the holding surface 19 by electrostatic force, the control unit 5 supplies a predetermined voltage to the electrode members 3 using the power supply device 22. In the present embodiment, the power supply device 22 supplies voltage of a predetermined value to the electrode members 3 that correspond to shot area groups on the substrate P where a pattern formation operation is currently underway, and sets the value of the voltage that is supplied to electrode members that correspond to the other shot area groups to OFF.

For example, as is shown in typical view in FIG. 26, when a pattern formation operation is started for the shot areas S of the second shot area group S2, the power supply device 22 supplies voltage of a predetermined value to (i.e., sets to ON) the electrode members 3 of the fourth through sixth electrode patterns 3D through 3F which correspond to the shot areas S of the second shot area group S2 on the substrate P where a pattern formation operation is currently underway, and sets to OFF both the value of the voltage that is supplied to the electrode members 3 of the first through third electrode patterns 3A through 3C which correspond to the shot areas S of the first shot area group S1 on the substrate P where a pattern has already been formed, and the value of the voltage that is supplied to the electrode members 3 of the seventh through 18th electrode patterns 3G through 3R which correspond to the shot areas S of the third through sixth shot area groups S3 through S6 on the substrate P where a pattern has not yet been formed.

Figure 27:
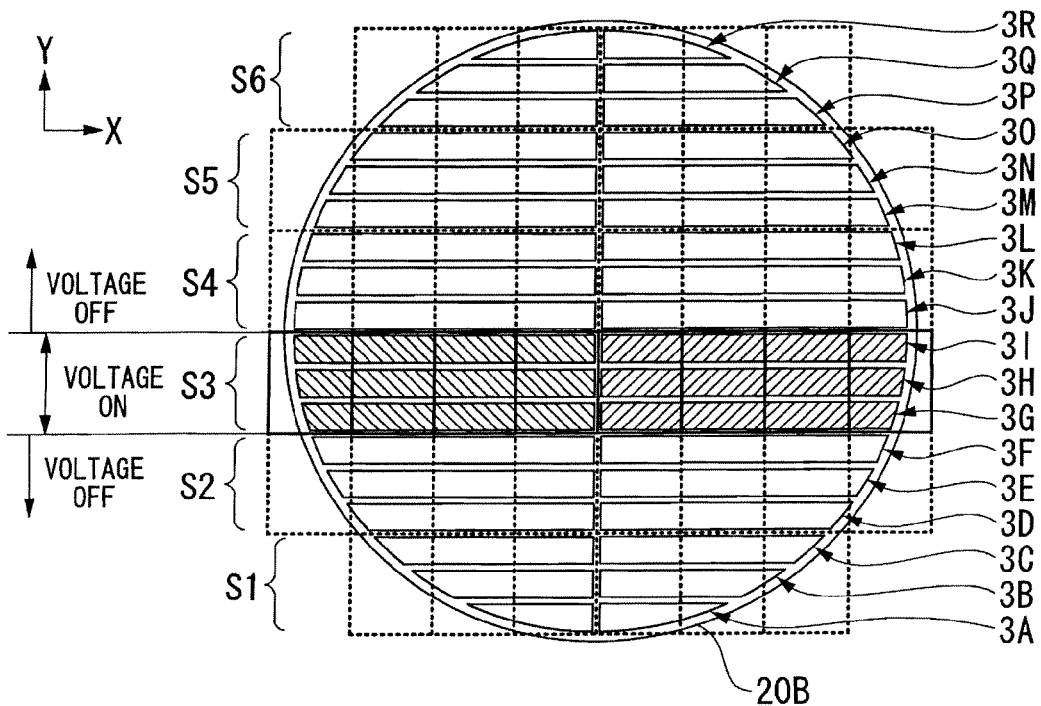
FIG. 27 is a view in order to illustrate an example of an operation of an exposure apparatus according to the sixth embodiment.

As is shown in typical view in FIG. 27, when the pattern formation operation for each shot area S of the first and second shot area groups S1 and S2 has ended, and a pattern formation operation for the shot areas S of the third shot area group S43 is starting, the power supply device 22 supplies voltage of a predetermined value to (i.e., sets to ON) the electrode members 3 of the seventh through ninth electrode patterns 3G through 3I which correspond to the shot areas S of the third shot area group S3 on the substrate P where a pattern formation operation is currently underway, and sets to OFF both the value of the voltage that is supplied to the electrode members 3 of the first through sixth electrode patterns 3A through 3F which correspond to the shot areas S of the first and second shot area groups S1 and S2 on the substrate P where a pattern has already been formed, and the value of the voltage that is supplied to the electrode members 3 of the tenth through eighteenth electrode patterns 3J through 3R which correspond to the shot areas S of the fourth through sixth shot area groups S4 through S6 on the substrate P where a pattern has not yet been formed.

Thereafter, in the same manner, pattern formation operations are executed for each shot area S with voltage of a predetermined value being supplied only to the electrode members of the electrode patterns which correspond to the shot area groups where a pattern formation operation is currently underway, and with the value of the voltage that is supplied to the electrode members 3 of electrode patterns which correspond to the other shot area groups being set to OFF.

After a pattern has been formed on all of the shot areas S of the substrate P, namely, when exposure of all of the shot areas S has ended, the power supply device 22 stops the supply of voltage to all of the plurality of electrode members 3. The control unit 5 then begins an operation to transport (i.e., unload) the exposed substrate P away from the holding member 20.

In the present embodiment as well, because the power supply device 22 regulates the voltage that is supplied to the respective electrode members 3 in accordance with the information relating to the pattern that is to be formed on the substrate P, an operation to transport away (i.e., unload) the substrate P can be executed rapidly at the same time as the operation to hold the substrate P is being properly executed. Accordingly, in a state in which the substrate P is being properly held, the operation to form a pattern on the substrate P can be properly executed, and it is possible to manufacture a device which has a desired performance. Moreover, throughput can be improved and this can contribute to an improvement in device productivity.

Note that in the above described fifth and sixth embodiments, examples are given of cases in which the value of the voltage that is supplied to the electrode members 3 which correspond to shot area groups other than the shot area groups where a pattern formation operation is currently underway is set to OFF, however, it is also possible for the value of the voltage that is supplied to the electrode members 3 which correspond to shot area groups where a pattern formation operation is currently underway to be set to a first voltage value, and for the value of the voltage that is supplied to the electrode members 3 which correspond to shot area groups other than the shot area groups where a pattern formation operation is currently underway to be set to a second voltage value (excluding 0) that is smaller than the first voltage value.

Moreover, in the above described fifth and sixth embodiments, examples are given of cases in which the value of the voltage that is supplied to the electrode members 3 which correspond to shot area groups where a pattern has not yet been formed is smaller than the value of the voltage that is supplied to the electrode members 3 which correspond to shot area groups where a pattern formation operation is currently underway, however, it is also possible for the value of the voltage that is supplied to the electrode members 3 which correspond to shot area groups where a pattern has not yet been formed to be the same as the value of the voltage that is supplied to the electrode members 3 which correspond to shot area groups where a pattern formation operation is currently underway.

In the above described embodiment, even when the width of the shot areas is altered it is still possible to execute voltage control for each shot area simply by altering the number of electrodes which are controlled simultaneously. Note that, in the above described embodiment, the width of the electrodes is set to half the width of the shot areas, however, it is also possible to provide an even larger number of electrodes within the width of each shot area.

Seventh Embodiment

Next, a description will be given of a seventh embodiment. In the description given below, component elements that are identical or equivalent to those in the above described embodiments are given the same symbols and any description thereof is simplified or omitted.

In the above described first through sixth embodiments, the moving mechanism 44 that moves the substrate P relative to the holding member 20 is provided with supporting members 41A through 41C that are provided on the holding member 20, however, the characteristic portion of the seventh embodiment lies in the fact that the moving mechanism is provided with a transporting member which transports a substrate P onto and away from the holding member.

Figure 28:
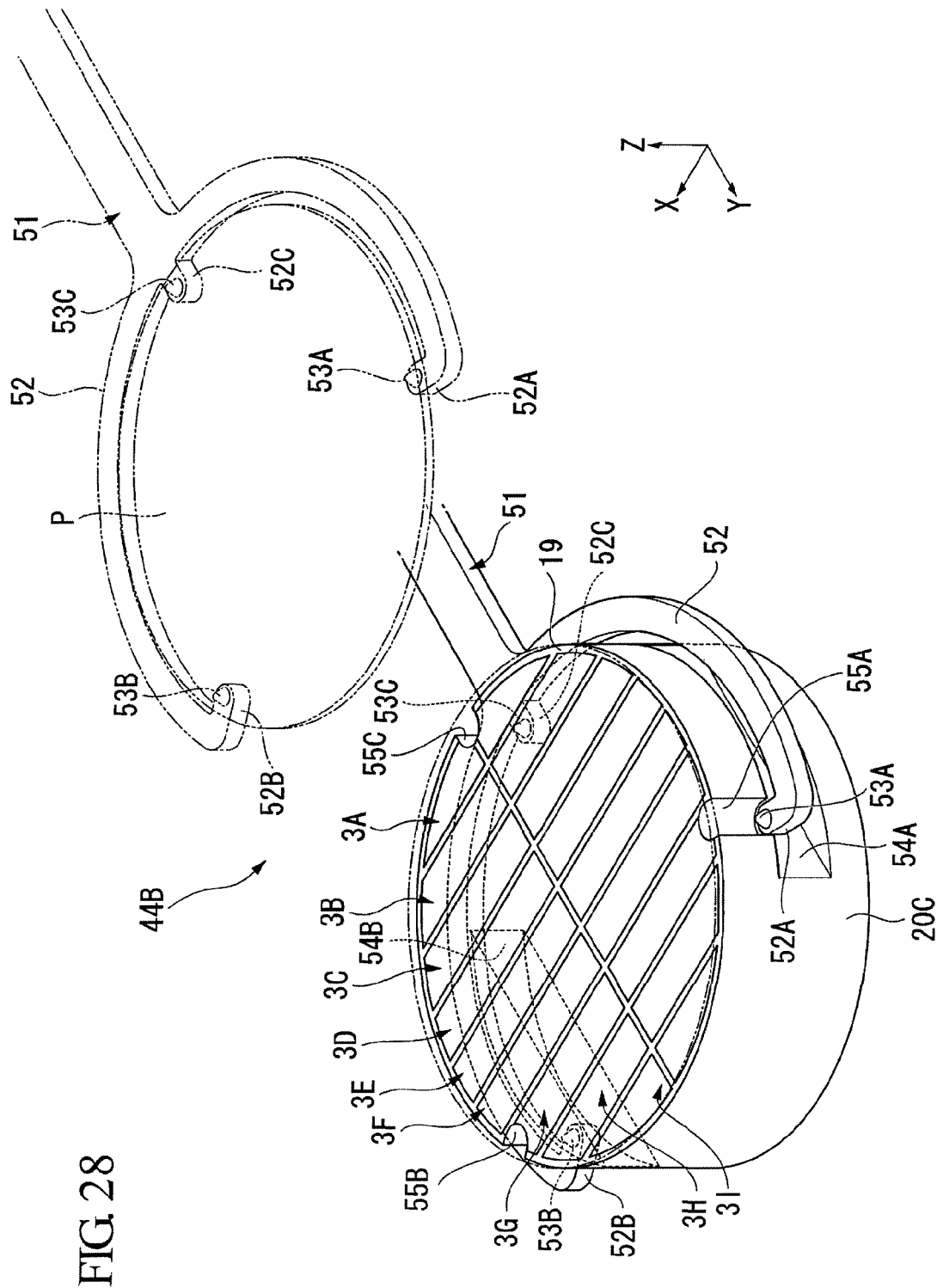
FIG. 28 is a perspective view showing an example of a moving mechanism according to a seventh embodiment.

FIG. 28 is a perspective view showing a moving mechanism 44B according to the seventh embodiment. The moving mechanism 44B of the present embodiment is provided with a transporting member 51 that transports a substrate P onto and away from a holding member 20C. The moving mechanism 44B moves the substrate P both in a direction in which it approaches and a direction in which it moves away from the holding surface 19 of the holding member 20 using the transporting member 51.

As is shown in FIG. 28, the transporting member 51 of the present embodiment is provided with an arm portion 52, and a plurality of supporting portions 53A, 53B, and 53C that are provided on the arm portion 52 and support a predetermined area of the rear surface of the substrate P (i.e., the rear surface of the peripheral portion of the substrate P, in this embodiment). In the present embodiment, the transporting member 51 is provided with the three supporting portions 53A, 53B, and 53C.

The arm portion 52 is a circular arc-shaped component whose arc lies within the XY plane, and is shaped so as to conform to a side surface of the holding member 20C. The arm portion 52 can be positioned so as to encircle the side surface of the holding member 20C. The arm portion 52 also has a first protruding portion 52A and a second protruding portion 52B that protrude inwardly (i.e., towards the center of the circular arc-shaped arm portion 52) provided respectively on its two distal ends. In addition, the arm portion 52 has a third protruding portion 52C that protrudes inwardly substantially in the center between the two distal ends. First, second, and third supporting portions 53A, 53B, and 53C are provided respectively on the first, the second, and the third protruding portions 52A, 52B, and 52C of the arm portion 52. The first, second, and third supporting portions 53A, 53B, and 53C are each shaped so as to protrude upwardly (i.e., in the +Z direction) from the arm portion 52.

The holding member 20C is provided with first through ninth electrode patterns 3A through 3I. In addition, grooves 54A and 54B that extend in the Y axial direction are formed respectively on the side surface on the −X side and the side surface on the +X side of the holding member 20C. Moreover, the holding member 20C is provided with first, second, and third recessed portions 55A, 55B, and 55C that are shaped so as to correspond respectively to the first, second, and third protruding portions 52A, 52B, and 52C. Each of the first, second, and third recessed portions 55A, 55B, and 55C is formed in the side surface of the holding member 20C, and these recessed portions are able to house respectively the first, second, and third protruding portions 52A, 52B, and 52C. In the present embodiment, the third recessed portion 55C which corresponds to the third protruding portion 52C is positioned on the −Y side (i.e., on the first electrode pattern 3A side) relative to the center of the holding surface 19. The first and second recessed portions 55A and 55B which correspond to the first and second protruding portions 52A and 52B are positioned on the +Y side (i.e., on the ninth electrode pattern 3I side) relative to the center of the holding surface 19.

Each of the first, second, and third recessed portions 55A, 55B, and 55C are formed so as to extend in the Z axial direction, and each one is formed such that a notch is cut in a portion of the holding surface 19. Moreover, the first, second, and third recessed portions 55A, 55B, and 55C are also formed so as to join together the holding surface 19 and the grooves 54. The first, second, and third protruding portions 52A, 52B, and 52C are each able to move in the Z axial direction, in the first, second, and third recessed portions 55A, 55B, and 55C, and along the first, second, and third recessed portions 55A, 55B, and 55C.

Each of the first, second, and third recessed portions 55A, 55B, and 55C is formed such that a notch is cut in a portion of the holding surface 19, and then portions of the rear surface of a substrate P that is mounted on the holding surface 19 are exposed at the first, second, and third recessed portions 55A, 55B, and 55C.

When the first, second, and third protruding portions 52A, 52B, and 52C of the transporting member 51 are placed in the first, second, and third recessed portions 55A, 55B, and 55C of the holding member 20C, the moving mechanism 44B is able to move the transporting member 51 such that top ends of the first, second, and third supporting portions 53A, 53B, and 53C are positioned on the +Z side of the holding surface 19, and is also able to move the transporting member 51 such that top ends of the first, second, and third supporting portions 53A, 53B, and 53C are positioned on the −Z side of the holding surface 19.

Because portions of the rear surface of the substrate P that has been mounted on the holding surface 19 are exposed at the first, second, and third recessed portions 55A, 55B, and 55C, the transporting member 51 is able to move the substrate P in the Z axial direction relative to the holding surface 19 of the holding member 20 at the same time as it is supporting the portions of the rear surface of the substrate P that are exposed at the first, second, and third recessed portions 55A, 55B, and 55C using the supporting portions 53. Namely, when a substrate P is being supported by the first, second, and third supporting portions 53A, 53B, and 53C of the transporting member 51, by moving this transporting member 51 in the Z axial direction, the moving mechanism 44 is able to move the substrate P in a direction in which the holding surface 19 of the holding member 20 and the rear surface of the substrate P approach each other and in a direction in which they move away from each other.

When transporting (i.e., loading) a substrate P onto the holding member 20C using the transporting member 51, the moving mechanism 44B positions the transporting member 51, which is supporting the substrate P by means of the respective supporting portions 53A, 53B, and 53C, above the holding surface 19 of the holding member 20, and, when the top ends of the respective recessed portions 55A, 55B, and 55C have been positioned together with the respective protruding portions 52A, 52B, and 52C, moves the transporting member 51 in the −Z direction. The respective protruding portions 52A, 52B, and 52C of the transporting member 51 are able to move in the −Z direction along the respective recessed portions 55A, 55B, and 55C, and, in conjunction with the movement of the transporting member 51 in the −Z direction, the rear surface of the substrate P which is supported by the supporting portions 53A, 53B, and 53C comes into contact with the holding surface 19 of the holding member 20. In addition, after the transporting member 51 has been moved further in the −Z direction, and the first and second protruding portions 52A and 52B have been placed in the grooves 54A and 54B, the moving mechanism 44B moves the transporting member 51 in the −Y direction. The first and second protruding portions 52A and 52B of the transporting member 51 are able to move in the −Y direction on the inner side of the grooves 54A and 54B. Because of this, the transporting member 51 is able to move in the −Y direction and move away from the holding member 20C while contact between the transporting member 51 and the holding member 20C is limited.

Moreover, when transporting (i.e., unloading) the substrate P away from the top of the holding member 20 using the transporting member 51, the moving mechanism 44B positions the transporting member 51 on the −Y side of the holding member 20C, and, when the positions of the first and second protruding portions 52A and 52B have been matched to those of the grooves 54A and 54B, moves the transporting member 51 in the +Y direction. The first and second protruding portions 52A and 52B of the transporting member 51 are able to move in the +Y direction in the grooves 54A and 54B along the grooves 54A and 54B, and, in conjunction with the movement of the transporting member 51 in the +Y direction, the positions of the first and second protruding portions 52A and 52B are matched to those of the first and second recessed portions 55A and 55B. In addition, the position of the third protruding portion 52C is matched to that of the third recessed portion 55C. When bottom ends of the respective recessed portions 55A, 55B, and 55C of the holding member 20C have been positioned together with the respective protruding portions 52A, 52B, and 52C of the transporting member 51, the transporting mechanism 44B moves the transporting member 51 in the +Z direction. The respective protruding portions 52A, 52B, and 52C of the transporting member 51 are able to move in the +Z direction on the inner side of the respective recessed portions 55A, 55B, and 55C, and, in conjunction with the movement of the transporting member 51 in the +Z direction, portions of the rear surface of the substrate P which is mounted on the holding surface 19 come into contact with the supporting portions 53A, 53B, and 53C. If the transporting member 51 is then moved further in the +Z direction, the substrate P becomes supported on the supporting portions 53A, 53B, and 53C, and the rear surface of the substrate P is separated from the holding surface 19. After the transporting member 51 is then moved further in the +Z direction, so that the holding member 20 is sufficiently separated from the transporting member 51 which is supporting the substrate P, the moving mechanism 44B moves the transporting member 51 in a predetermined direction. As a result, the substrate P is transported away from the holding member 20C by the transporting member 51.

FIG. 29 is a typical view showing an example of an operation when the holding member 20C is separated from the substrate P by the moving mechanism 44B according to the present embodiment. As is shown in FIG. 29, the moving mechanism 44B starts to move the substrate P relative to the holding member 20C such that one portion of the rear surface of the substrate P moves away first from the holding surface 19 before other portions thereof move away. In the present embodiment, the third supporting portion 53C supports the portion of the rear surface of the substrate P that moves away first from the holding surface 19. In other words, the driving of the moving mechanism 44B is controlled such that, of the three supporting portions 53A, 53B, and 53C, the third supporting portion 53C starts to move away first from the holding surface 19 in the +Z direction before the other supporting portions 53A and 53B.

In the same way as in the above described embodiments, after voltage has been supplied to the respective electrode members 3 of the plurality of electrode patterns 3A through 3I so as to attract the substrate P to the holding surface 19, the supply of voltage to the plurality of electrode members 3 is stopped in a predetermined sequence which corresponds to the sequence in which a pattern is to be formed (i.e., a sequence in which the shot areas S are to be exposed). Namely, firstly, the supply of voltage to the electrode members 3 of the first electrode pattern 3A is stopped, and thereafter the supply of voltages to the electrode members 3 is stopped in the sequence of the second, the third, . . . , and up to the ninth electrode patterns 3B, 3C, . . . , 3I. The moving mechanism 44B starts the movement of the substrate P relative to the holding member 20C such that the portion of the rear surface of the substrate P that corresponds to the electrode members 3 of the first electrode pattern 3A to which the supply of voltage was stopped first, namely, the portion adjacent to the edge of the substrate P on the −Y side is separated first from the holding surface 19 of the holding member 20.

In the present embodiment, of the plurality of supporting portions 53A, 53B, and 53C, the third supporting member 53C is placed adjacent to the edge of the substrate P on the −Y side. The control unit 5 controls the moving mechanism 44B such that the third supporting member 53C starts to move in the +Z direction from the holding surface 19 earlier than the other supporting members 53A and 53B. As a result, the substrate P can be moved such that the portion in the vicinity of the edge on the −Y side of the substrate P that is supported by the third supporting member 53C moves away first from the holding surface 19 of the holding member 20.

Moreover, by providing a grounded conductive member in the third supporting portion 53C, electricity (i.e., any electric charge) which is electrifying the substrate P is properly removed.

Moreover, in the present embodiment, it is possible to provide, for example, in the supporting portions 53A and 53B, an electrostatic chuck mechanism that includes electrode members that generate electrostatic force in order to attract the substrate P to the supporting portions 53A and 53B.

Note that in the above described embodiment the moving mechanism 44B moves the substrate P relatively to a substantially static holding member 20, however, it is also possible to move the holding member 20 relatively to a substantially static substrate P, or to move both the holding member 20 and the substrate P.

Note also that in each of the above described embodiments, the moving mechanisms 44, 44B are applied to the holding members 20, 20C which include a plurality of electrode members, however, the moving mechanisms 44, 44B can be applied to holding members each of which includes one or two electrode member(s).

Note also that in each of the above described embodiments, the holding members 20, 20C can alternatively support the rear surface of the substrate P with multiple pin members (convex portions or protruding portions) the distal ends of which are disposed on a plane. In the case in which the holding members 20, 20C include the multiple pin members, the plane comprising the distal ends of the multiple pin members can be applied as the holding surface.

Note also that in each of the above described embodiments, the antistatic device 47 that removes electrostatic charge on the substrate P is provided with a grounded conductive member 48 that touches the holding surface 19 of the holding member 20, however, it may also be provided with a grounded conductive member that touches a portion of the side surface or front surface of the substrate P. Moreover, provided that electrostatic charge on the substrate P can be removed, then it is not essential for the conductive member to be grounded.

In addition, in each of the above described embodiments, a description is given of an example in which the electrostatic chuck mechanism is what is known as a bipolar type of mechanism, however, it is also possible for a unipolar type of mechanism to be used.

Furthermore, in each of the above described embodiments, the electrode members are divided only in the Y axial direction, and pairs of positive electrodes and negative electrodes are only created in the X axial direction, however, it is also possible to also divide the electrode members in the X axial direction, and set the voltage supplied to those electrode members that correspond to areas where exposure in the X axial direction has ended to OFF. For example, it is also possible to position a plurality of electrode members such that positive electrodes and negative electrodes are placed at intervals relating to the chip width, or at intervals relating to the width of the slit (i.e., the projection area) where scanning exposure is performed, and to sequentially set to OFF the voltage of electrode members that correspond to the width of the slit or of chips where exposure has ended.

Furthermore, in a case in which the electrode members are divided in both the X axial direction and the Y axial direction, predetermined numbers of the electrode members can be selected from among the plurality of the electrode members, in accordance with the information of the pattern formed on the substrate P (e.g., the size of the shot area S). That is, the predetermined numbers of the electrode members are assigned to each of the shot areas S. In this case, the power supply device regulates the voltage supplied to the numbers of the electrode members, which are assigned to the every shot areas S.

Moreover, in each of the above described embodiments, the voltages of a positive electrode and negative electric pair which are positioned in the X axial direction are changed simultaneously, however, it is also possible to change the voltage of only one electrode member.

Note also that not only can a semiconductor wafer which is used to manufacture a semiconductor device be used as the substrate P of the above described embodiments, but it is also possible to use a glass substrate which is used for a display device, a ceramic wafer which is used for a thin-film magnetic head, an original plate (i.e., synthetic quartz or silicon wafer) of a mask or reticle which is used in an exposure apparatus, film member, or the like. Moreover, the substrate is not limited to round shape, but may be rectangular or other shapes.

As the exposure apparatus EX, in addition to a step-and-scan type of scanning exposure apparatus (i.e., a scanning stepper) which makes a scanning exposure of a pattern on a mask M while moving the mask M and a substrate P in synchronization, it is also possible to use a step-and-repeat type of projection scanning device (i.e., a stepper) that collectively exposes the pattern on a mask M while the mask M and substrate P are static, and moves the substrate P in sequential steps.

Furthermore, in a step-and-repeat type of exposure, it is also possible to transfer to a contracted image of a first pattern onto a substrate P using a projection optical system while the first pattern and the substrate P are substantially stationary, and to then superimpose a reduced image of a second pattern partially onto the first pattern using the projection optical system while the second pattern and the substrate P are substantially stationary, and then collectively expose it onto the substrate P (i.e., using a stitch type of collective exposure apparatus). Moreover, as a stitch type of collective exposure apparatus, it is also possible to use a step-and-stitch type of exposure apparatus that partially superimposes and then transfers at least two patterns onto a substrate P, and moves the substrate P sequentially.

Moreover, as is disclosed, for example, in U.S. Pat. No. 6,611,316, the present invention can also be applied to an exposure apparatus that synthesizes two mask patterns on a substrate via a projection optical system, and performs a double exposure substantially simultaneously of a single shot area on the substrate by means of a single scan exposure.

Moreover, the present invention can also be applied to a twin stage type of exposure apparatus that is provided with a plurality of substrate stages such as is described in U.S. Pat. Nos. 6,341,007, 6,400,441, 6,549,269, 6,590,634, 6,208,407, and 6,262,796.

Furthermore, as is described in, for example, Japanese Patent Application Publication No. H11-135400 A (corresponding to PCT International Publication No. 1999/23692) and U.S. Pat. No. 6,897,963, the present invention can also be applied to an exposure apparatus that is provided with a substrate stage that holds a substrate, and a measurement stage on which are mounted reference components on which reference marks are formed and/or various types of photoelectric sensors. The present invention can also be applied to an exposure apparatus that is provided with a plurality of substrate stages and measurement stages.

The type of exposure apparatus EX that is used is not limited to an exposure apparatus for manufacturing a semiconductor device that exposes a semiconductor device pattern onto a substrate P, and the present invention may also be broadly applied to exposure apparatuses for manufacturing liquid crystal display elements or manufacturing displays and the like, and to exposure apparatuses for manufacturing thin-film magnetic heads, image pickup elements (CCD), micro machines, MEMS, DNA chips, or reticles and masks, and the like.

As has been described above, the exposure apparatus EX according to the embodiments is manufactured by assembling various subsystems that include the respective component elements such that they have predetermined levels of mechanical accuracy, electrical accuracy, and optical accuracy. In order to secure these levels of accuracy, various adjustments are made before and after the assembly step, including adjustments to achieve optical accuracy in the various optical systems, adjustments to achieve mechanical accuracy n the various mechanical systems, and adjustments to achieve electrical accuracy in the various electrical systems. The assembly step to assemble an exposure apparatus from the various subsystems includes making mechanical connections, electrical circuit wiring connections, and air pressure circuit tube connections and the like between the various subsystems. Prior to the assembly step to assemble an exposure apparatus from the various subsystems, it is of course necessary to perform assembly steps to assemble the respective individual subsystems. Once the assembly step to assemble an exposure apparatus from the various subsystems has ended, comprehensive adjustments are made so as to secure various levels of accuracy in the exposure apparatus as a whole. Note that it is desirable for the manufacturing of the exposure apparatus to be conducted in a clean room in which temperature and cleanliness and the like are controlled.

Figure 30:
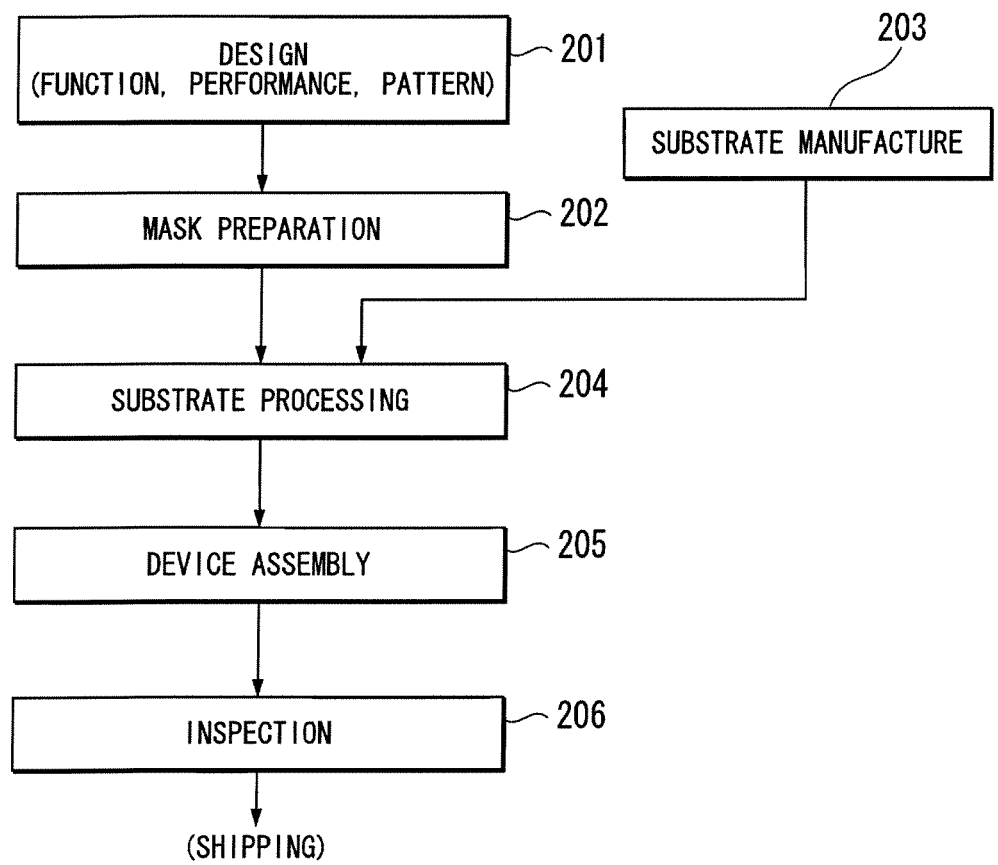
FIG. 30 is a flowchart showing an example of a micro device manufacturing processes.

As is shown in FIG. 30, a micro device such as a semiconductor device is manufactured via a step 201 in which the functions and performance of the micro device are designed, a step 202 in which a mask (i.e., a reticle) that is based on the design step is manufactured, a step 203 in which a substrate that forms the base material of the device is manufactured, a substrate processing step 204 that includes substrate processing (i.e., exposure processing) in which a substrate is exposed using an image of a pattern on a mask and the exposed substrate is then developed, a device assembly step 205 (including working processes such as a dicing step, a bonding step, a packaging step and the like), and an inspection step 206.

Note that in the above described embodiments, descriptions are given of examples in which the device that is used to form a pattern on a substrate P is an exposure apparatus that forms a pattern on a photosensitive substrate P by irradiating exposure light EL onto the substrate P, however, the holding apparatus of the present invention can also be applied to various pattern forming devices that form a pattern on a substrate P. Examples of this type of pattern forming device include inkjet devices that form a pattern on a substrate by discharging ink droplets, for example, onto the substrate, and nanoimprint devices that press together an original plate on which a concavo-convex pattern has been formed and a substrate on which an organic material has been coated while heating the two to more than the glass transition temperature of the substrate, and then separate the original plate from the substrate and cool the substrate so as to transfer the pattern on the original plate onto the substrate. When a holding apparatus that holds the substrate is provided in these apparatuses, if the substrate is held using the holding apparatus of the present invention, then the substrate can be held in a desired state. For example, if the surface of a substrate P is divided into a plurality of micro areas, and an operation to form a pattern on each of these micro areas (i.e., an operation to discharge droplets of ink) is executed by an inkjet device, then the electrode members of the holding member are positioned in accordance with the micro areas, and the power supply device of the holding apparatus regulates the voltage that is supplied to each of the plurality of the electrode members that are provided in the holding apparatus in accordance with the sequence in which the pattern is to be formed.

The holding apparatus according to the present invention is not limited to the pattern forming apparatus, and can alternatively be applied to, for example, a holding apparatus provided in a substrate processing apparatus such as an apparatus for coating a resist onto the substrate P, an apparatus for developing the pattern formed on the substrate P, or the like. In a case in which an aspect of the present invention is applied to this holding apparatus, the power supply device 22 can regulate the voltage supplied to the electrode members with disregard to the pattern information.

As far as is permitted, the disclosures in all of the Japanese Patent Publications and U.S. patents related to exposure apparatuses and the like cited in the above respective embodiments and modified examples are incorporated herein by reference.

Note that embodiments of the present invention have been described above, however, the present invention can be used by appropriately combining all of the above described component elements, or, in some cases, a portion of the component elements may not be used.

What is claimed is:

1. A holding apparatus comprising:
   a holding member that has a holding surface, the holding surface holding a substrate on which a pattern is to be formed;
   a plurality of first electrode members that are provided on the holding member and that are arranged in accordance with pattern information relating to the pattern, and that generate electrostatic force in accordance with supply of a voltage in order to attract the substrate to the holding surface,
   wherein a portion of the first electrode members corresponding to shot areas on the substrate where the pattern has already been formed is supplied a voltage value set to OFF and remains set to OFF while the pattern is formed on the rest of the substrate.

2. The holding apparatus according to claim 1, wherein the pattern information comprises sizes of chips, which are to be formed on the substrate, and layout information for the chips.

3. The holding apparatus according to claim 1, wherein the pattern information comprises information relating to a width of light, which is projected on the substrate.

4. The holding apparatus according to claim 1, wherein the pattern information comprises information relating to shot areas on the substrate on which the pattern is formed.

5. The holding apparatus according to claim 1, wherein
   a plurality of patterns are to be sequentially formed on the substrate,
   the pattern information comprises a sequence of forming the patterns.

6. The holding apparatus according to claim 1, wherein the voltage is regulated in accordance with the pattern information.

7. An exposure apparatus that exposes a substrate with exposure light from a pattern, comprising:
the holding apparatus according to claim 1, in order to hold a substrate onto which the exposure light has been irradiated.

8. The exposure apparatus according to claim 7, further comprising a vacuum system that holds a vacuum in a space through which the exposure light is transmitted.

9. A device manufacturing method comprising:
exposing a substrate using the exposure apparatus according to claim 7; and
developing the exposed substrate.

10. A holding apparatus comprising:
a holding member that has a holding surface, the holding surface holding a substrate on which a pattern is to be formed;
a plurality of first electrode members that are provided on the holding member, and that generate electrostatic field in accordance with supply of a voltage in order to attract the substrate to the holding surface; and
a power supply device that is capable of regulating the voltage in accordance with pattern information relating to the pattern, wherein the power supply device supplies non-zero voltages to a portion of the plurality of the first electrode members and another portion of the plurality of the first electrode members different from the portion of the first electrode members, the power supply device supplies a predetermined voltage to at least one first electrode member selected from the plurality of the first electrode members, and the power supply device supplies a first voltage to the first electrode members which correspond to an area on the substrate where an operation to form the pattern is currently underway, and supplies a second voltage, which is lower than the first voltage, to at least a portion of the first electrode members, which are different from the first electrode members to which the first voltage is supplied.

11. The holding apparatus according to claim 10, wherein the pattern information comprises a formation sequence of the pattern onto the substrate.

12. The holding apparatus according to claim 10, wherein the pattern information comprises sizes of chips, which are to be formed on the substrate, and layout information for the chips.

13. The holding apparatus according to claim 10, wherein the pattern information comprises information relating to a width of light, which is projected on the substrate.

14. The holding apparatus according to claim 10, wherein the pattern information comprises information relating to shot areas on the substrate on which the pattern is formed.

15. The holding apparatus according to claim 10, wherein the power supply device comprises a switch that switches between supplying voltage and stopping the supply of voltage.

16. A holding apparatus comprising:
a holding member that has a holding surface that holds a substrate;
a plurality of first electrode members that are provided on the holding member, and that generate electrostatic force in accordance with supply of a voltage in order to attract the substrate to the holding surface; and
a power supply device that supplies a first voltage to a portion of the plurality of the first electrode members and a second voltage to another portion of the plurality of the first electrode members different from the portion of the first electrode members, wherein the power supply device makes the value of the first voltage that is supplied to the portion of the first electrode members which correspond to an area on the substrate where an operation to form a pattern on the substrate is currently underway higher than the value of the second voltage that is supplied to another portion of the first electrode members different from the portion of the first electrode members.

17. An exposure method for exposing a substrate with exposure light from a pattern, the method comprising:
mounting the substrate on a holding surface of a holding member on which a plurality of first electrode members are provided;
supplying voltage to the first electrode members in order to attract the substrate to the holding surface by electrostatic force; and
irradiating the substrate with the exposure light from the pattern, wherein
the value of a first voltage that is supplied to the first electrode members, which correspond to an area on the substrate where the irradiation of the exposure light is currently underway, is higher than the value of a second non-zero voltage that is supplied to at least a part of remaining portion of the first electrode members.

18. The exposure method according to claim 17, wherein an area where the second non-zero voltage is supplied to the first electrode members corresponds to an area where the irradiation of the exposure light has been terminated.

19. A device manufacturing method comprising exposing a substrate using the exposure method according to claim 17, and
developing the exposed substrate.

20. An exposure method for exposing a substrate with exposure light from a pattern, the method comprising:
mounting the substrate on a holding surface of a holding member on which a plurality of first electrode members are provided;
supplying voltage to the first electrode members in order to attract the substrate to the holding surface by electrostatic force; and
sequentially irradiating shot areas on the substrate with exposure light from the pattern, wherein
the value of a first voltage that is supplied to the first electrode members, which correspond to shot areas where the irradiation of the exposure light has not yet been formed and where the irradiation of the exposure light is currently underway, is higher than the value of a second non-zero voltage that is supplied to the first electrode members, which are different from the first electrode members to which the first voltage is supplied.

21. A holding apparatus comprising:
a holding member that has a holding surface, the holding surface holding a substrate on which a pattern is to be formed;
a plurality of first electrode members that are provided on the holding member, and that generate electrostatic field in accordance with supply of a voltage in order to attract the substrate to the holding surface; and
a power supply device that is capable of regulating the voltage in accordance with pattern information relating to the pattern, wherein the power supply device supplies non-zero voltages to a portion of the plurality of the first electrode members and another portion of the plurality of the first electrode members different from the portion of the first electrode members, the power supply device supplies a predetermined voltage to at least one first electrode member selected from the plurality of the first electrode members, and the power supply device supplies a first voltage to the first electrode members which correspond to an area on the substrate where the pattern has not yet been formed and where an operation to form the pattern is currently underway, and supplies a second voltage, which is lower than the first voltage, to the first electrode members, which are different from the first electrode members to which the first voltage is supplied.

22. The holding apparatus according to claim 21, wherein the pattern information comprises a formation sequence of the pattern onto the substrate.

23. The holding apparatus according to claim 21, wherein the pattern information comprises sizes of chips, which are to be formed on the substrate, and layout information for the chips.

24. The holding apparatus according to claim 21, wherein the pattern information comprises information relating to a width of light, which is projected on the substrate.

25. The holding apparatus according to claim 21, wherein the pattern information comprises information relating to shot areas on the substrate on which the pattern is formed.

26. The holding apparatus according to claim 21, wherein the power supply device comprises a switch that switches between supplying voltage and stopping the supply of voltage.

27. A holding apparatus comprising:
a holding member that has a holding surface, the holding surface holding a substrate on which a pattern is to be formed;
a plurality of first electrode members that are provided on the holding member, and that generate electrostatic field in accordance with supply of a voltage in order to attract the substrate to the holding surface; and
a power supply device that is capable of regulating the voltage in accordance with pattern information relating to the pattern, wherein the power supply device supplies non-zero voltages to a portion of the plurality of the first electrode members and another portion of the plurality of the first electrode members different from the portion of the first electrode members, the power supply device supplies a predetermined voltage to at least one first electrode member selected from the plurality of the first electrode members, and the power supply device makes the value of a first voltage that is supplied to the first electrode members which correspond to an area on the substrate where the pattern formation operation is currently underway higher than the value of the voltage that is supplied to the first electrode members, which are different from the first electrode members to which the first voltage is supplied.

28. The holding apparatus according to claim 27, wherein the pattern information comprises a formation sequence of the pattern onto the substrate.

29. The holding apparatus according to claim 27, wherein the pattern information comprises sizes of chips, which are to be formed on the substrate, and layout information for the chips.

30. The holding apparatus according to claim 27, wherein the pattern information comprises information relating to a width of light, which is projected on the substrate.

31. The holding apparatus according to claim 27, wherein the pattern information comprises information relating to shot areas on the substrate on which the pattern is formed.

32. The holding apparatus according to claim 27, wherein the power supply device comprises a switch that switches between supplying voltage and stopping the supply of voltage.

33. A holding apparatus comprising:
a holding member that has a holding surface, the holding surface holding a substrate on which a pattern is to be formed;
a plurality of first electrode members that are provided on the holding member, and that generate electrostatic field in accordance with supply of a voltage in order to attract the substrate to the holding surface; and
a power supply device that is capable of regulating the voltage in accordance with pattern information relating to the pattern, wherein the power supply device supplies non-zero voltages to a portion of the plurality of the first electrode members and another portion of the plurality of the first electrode members different from the portion of the first electrode members, the power supply device supplies a predetermined voltage to at least one first electrode member selected from the plurality of the first electrode members, and the power supply device makes the value of a first voltage that is supplied to the first electrode members which correspond to an area on the substrate where the pattern has not yet been formed and where an operation to form the pattern is currently underway higher than the value of a second voltage that is supplied to the first electrode members, which are different from the first electrode members to which the first voltage is supplied.

34. The holding apparatus according to claim 33, wherein the pattern information comprises a formation sequence of the pattern onto the substrate.

35. The holding apparatus according to claim 33, wherein the pattern information comprises sizes of chips, which are to be formed on the substrate, and layout information for the chips.

36. The holding apparatus according to claim 33, wherein the pattern information comprises information relating to a width of light, which is projected on the substrate.

37. The holding apparatus according to claim 33, wherein the pattern information comprises information relating to shot areas on the substrate on which the pattern is formed.

38. The holding apparatus according to claim 33, wherein the power supply device comprises a switch that switches between supplying voltage and stopping the supply of voltage.

* * * * *